US010411195B2

(12) United States Patent
Kim et al.

(10) Patent No.: US 10,411,195 B2
(45) Date of Patent: Sep. 10, 2019

(54) ORGANIC LIGHT-EMITTING DIODE INCLUDING CONDENSED CYCLIC COMPOUND

(71) Applicant: SAMSUNG DISPLAY CO., LTD., Yongin, Gyeonggi-Do (KR)

(72) Inventors: Soung-Wook Kim, Yongin (KR); Jae-Hong Kim, Yongin (KR); Myeong-Suk Kim, Yongin (KR); Se-Hun Kim, Yongin (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 875 days.

(21) Appl. No.: 14/253,830

(22) Filed: Apr. 15, 2014

(65) Prior Publication Data
US 2015/0060785 A1   Mar. 5, 2015

(30) Foreign Application Priority Data

Aug. 28, 2013 (KR) ........................ 10-2013-0102657

(51) Int. Cl.
*H01L 51/00* (2006.01)
*H01L 51/50* (2006.01)

(52) U.S. Cl.
CPC ...... *H01L 51/0073* (2013.01); *H01L 51/0052* (2013.01); *H01L 51/0074* (2013.01); *H01L 51/5012* (2013.01)

(58) Field of Classification Search
CPC ............. H01L 51/0052; H01L 51/0073; H01L 51/0074; H01L 51/5012; C09K 11/06
See application file for complete search history.

(56) References Cited

U.S. PATENT DOCUMENTS

| | | | |
|---|---|---|---|
| 2004/0137270 A1* | 7/2004 | Seo .................. | C09K 11/06 428/690 |
| 2007/0009758 A1* | 1/2007 | Funahashi ............ | C07C 211/61 428/690 |
| 2012/0091885 A1* | 4/2012 | Kim .................. | C09K 11/06 313/504 |
| 2012/0097899 A1* | 4/2012 | Parham ............... | C07D 401/04 252/500 |
| 2012/0104379 A1 | 5/2012 | Kawakami et al. | |
| 2012/0112174 A1* | 5/2012 | Lee .................... | C07D 307/93 257/40 |
| 2012/0138914 A1 | 6/2012 | Kawamura et al. | |
| 2012/0181922 A1 | 7/2012 | Kawamura et al. | |
| 2013/0105769 A1 | 5/2013 | Lim et al. | |
| 2014/0306197 A1* | 10/2014 | Kim ................... | H01L 51/006 257/40 |
| 2015/0021563 A1* | 1/2015 | Kim ................... | H01L 51/0052 257/40 |
| 2018/0208836 A1* | 7/2018 | Kuma ................. | C09K 11/06 |

FOREIGN PATENT DOCUMENTS

| | | |
|---|---|---|
| CN | 100481574 C | 4/2009 |
| CN | 103087068 A | 5/2013 |
| KR | 10-2012-0034140 | 4/2012 |
| KR | 10-2012-0038402 | 4/2012 |
| KR | 10-2012-0078301 | 7/2012 |
| KR | 10-2012-0089223 | 8/2012 |
| KR | 10-2012-0117622 | 10/2012 |

OTHER PUBLICATIONS

Machine translation for KR 10-2012-0078301 A (publication date Jul. 2012).*
Machine translation for "KR 10-2012-0078301 A" translated by Google Patents (publication date Jul. 2012). (Year: 2012).*

* cited by examiner

*Primary Examiner* — Dawn L Garrett
(74) *Attorney, Agent, or Firm* — Lewis Roca Rothgerber Christie LLP

(57) ABSTRACT

An organic light-emitting diode including a condensed cyclic compound represented by Formula 1 and a condensed cyclic compound represented by Formula 2:

Formula 1

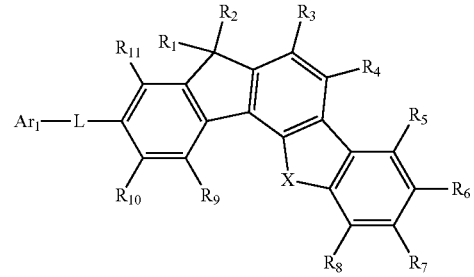

Formula 2

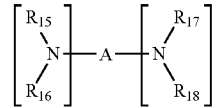

wherein $Ar_1$, L, X, $R_1$ to $R_{18}$, and A are defined as in the specification. An organic layer including the condensed cyclic compounds may emit blue light of high color purity, high efficiency, and long lifetime.

18 Claims, 1 Drawing Sheet

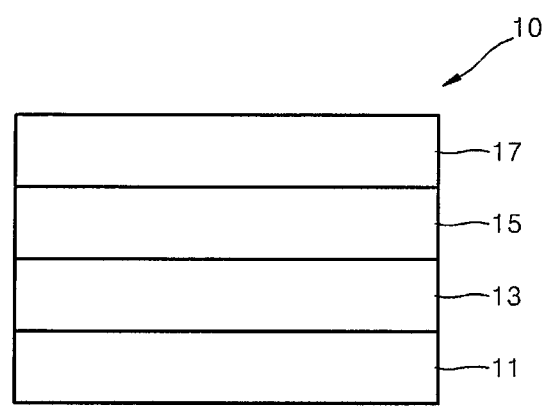

ORGANIC LIGHT-EMITTING DIODE INCLUDING CONDENSED CYCLIC COMPOUND

CROSS-REFERENCE TO RELATED APPLICATION

This application claims priority to and the benefit of Korean Patent Application No. 10-2013-0102657, filed on Aug. 28, 2013, in the Korean Intellectual Property Office, the disclosure of which is incorporated herein in its entirety by reference.

BACKGROUND

1. Field

One or more embodiments of the present invention relate to an organic light-emitting diode including a condensed cyclic compound.

2. Description of the Related Art

Organic light-emitting diodes (OLEDs), which are self-emitting devices, have advantages such as wide viewing angles, excellent contrast, quick response, high luminance, low driving voltage characteristics, and can provide multi-colored images.

A typical OLED has a structure including a substrate, and an anode, a hole transport layer (HTL), an emission layer (EML), an electron transport layer (ETL), and a cathode, which are sequentially stacked on the substrate. In this regard, the HTL, the EML, and the ETL are organic thin films formed of organic compounds.

The OLED may form a full-color display by emitting blue, green, and red light according to compounds included in the EML. Particularly, an OLED having high color purity, high efficiency, and long lifetime is needed at blue light emission.

SUMMARY

One or more aspects of embodiments of the present invention include an organic light diode including an organic layer including a condensed cyclic compound having high color purity, high efficiency, and long lifetime at blue light emission.

Additional aspects will be set forth in part in the description which follows and, in part, will be apparent from the description, or may be learned by practice of the presented embodiments.

According to one or more embodiments of the present invention, an organic light-emitting diode includes a first electrode; a second electrode disposed opposite to the first electrode; and an organic layer disposed between the first electrode and the second electrode, wherein the organic layer includes a compound represented by Formula 1 and a compound represented by Formula 2:

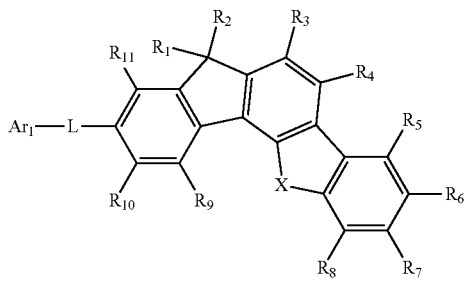

Formula 1

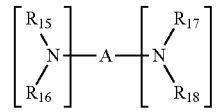

Formula 2

In Formulae 1 and 2, $Ar_1$ is selected from a $C_6$-$C_{60}$ aryl group or a $C_1$-$C_{60}$ heteroaryl group; or a $C_6$-$C_{60}$ aryl group or a $C_1$-$C_{60}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;

L is selected from a $C_6$-$C_{60}$ arylene group or a $C_2$-$C_{60}$ heteroarylene group; or a $C_6$-$C_{60}$ arylene group or a $C_2$-$C_{60}$ heteroarylene group, each substituted with at least one selected from a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;

X is —$C(R_{12})(R_{13})$, —$N(R_{14})$, —S—, or —O—;

$R_1$ to $R_{13}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{40}$ alkyl group, a $C_2$-$C_{40}$ alkenyl group, a $C_2$-$C_{40}$ alkynyl group, a $C_1$-$C_{40}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_1$-$C_{40}$ heteroaryl group, a $C_6$-$C_{40}$ aryloxy group, or a $C_6$-$C_{40}$ arylthio group;

a $C_1$-$C_{40}$ alkyl group, a $C_2$-$C_{40}$ alkenyl group, a $C_2$-$C_{40}$ alkynyl group, or a $C_1$-$C_{40}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group; or a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_1$-$C_{40}$ heteroaryl group, a $C_6$-$C_{40}$ aryloxy group, or a $C_6$-$C_{40}$ arylthio group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;

$R_{14}$ is selected from a hydrogen atom, a deuterium atom, a halogen atom, a $C_1$-$C_{40}$ alkyl group, a $C_3$-$C_{10}$ cycloalkyl group, a $C_3$-$C_{10}$ heterocycloalkyl group, a $C_6$-$C_{40}$ aryl group, or a $C_2$-$C_{40}$ heteroaryl group; or a $C_1$-$C_{40}$ alkyl group, a $C_3$-$C_{10}$ cycloalkyl group, a $C_3$-$C_{10}$ heterocycloalkyl group, a $C_6$-$C_{40}$ aryl group, or a $C_2$-$C_{40}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;

$R_{15}$ to $R_{18}$ are each independently selected from a $C_6$-$C_{20}$ aryl group; or a $C_6$-$C_{20}$ aryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{20}$ aryl group, a $C_2$-$C_{20}$ heteroaryl group, a $C_6$-$C_{20}$ aryloxy group, or a $C_6$-$C_{20}$ arylthio group; and A is selected from phenalene, anthracene, pyrene, benzopyrene, chrysene, or phenanthroline; or phenalene, anthracene, pyrene, benzopyrene, chrysene, or phenanthroline, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

BRIEF DESCRIPTION OF THE DRAWINGS

These and/or other aspects will become apparent and more readily appreciated from the following description of the embodiments, taken in conjunction with the accompanying drawings in which:

The drawing schematically illustrates the structure of an organic light-emitting diode according to an embodiment of the present invention.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

An organic light-emitting diode (OLED) according to an embodiment of the present invention includes a first electrode; a second electrode disposed opposite to the first electrode; and an organic layer disposed between the first electrode and the second electrode, wherein the organic layer includes a compound represented by Formula 1 and a compound represented by Formula 2:

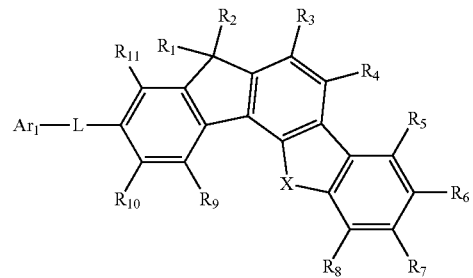

Formula 1

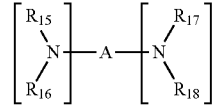

Formula 2

In Formulae 1 and 2, $Ar_1$ is selected from a $C_6$-$C_{40}$ aryl group or a $C_1$-$C_{40}$ heteroaryl group; or a $C_6$-$C_{40}$ aryl group or a $C_1$-$C_{40}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

L is selected from a $C_6$-$C_{40}$ arylene group or a $C_2$-$C_{40}$ heteroarylene group; or a $C_6$-$C_{40}$ arylene group or a $C_2$-$C_{40}$ heteroarylene group, each substituted with at least one selected from a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

X is —C($R_{12}$)($R_{13}$), —N($R_{14}$), —S—, or —O—.

$R_1$ to $R_{13}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_1$-$C_{40}$ heteroaryl group, a $C_6$-$C_{40}$ aryloxy group, or a $C_6$-$C_{40}$ arylthio group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group; or a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_1$-$C_{40}$ heteroaryl group, a $C_6$-$C_{40}$ aryloxy group, or a $C_6$-$C_{40}$ arylthio group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

$R_{14}$ is selected from a hydrogen atom, a deuterium atom, a halogen atom, a $C_1$-$C_{20}$ alkyl group, a $C_3$-$C_{10}$ cycloalkyl group, a $C_3$-$C_{10}$ heterocycloalkyl group, a $C_6$-$C_{40}$ aryl group, or a $C_2$-$C_{40}$ heteroaryl group; or a $C_1$-$C_{20}$ alkyl group, a $C_3$-$C_{10}$ cycloalkyl group, a $C_3$-$C_{10}$ heterocycloalkyl group, a $C_6$-$C_{40}$ aryl group, or a $C_2$-$C_{40}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

$R_{15}$ to $R_{18}$ are each independently selected from a $C_6$-$C_{40}$ aryl group; or a $C_6$-$C_{40}$ aryl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

A is selected from phenalene, anthracene, pyrene, benzopyrene, a chrysene, or phenanthroline; or phenalene, anthracene, pyrene, benzopyrene, a chrysene, or phenanthroline, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

In some embodiments, $Ar_1$ is selected from a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyran group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a benzocarbazolyl group, a pyridoindolyl group, a dibenzofuryl group, a phenanthridinyl group, a benzoquinolyl group, a phenazinyl group, a dibenzosilolyl group, a dibenzothiophenyl group, or a benzocarbazolyl group; or a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyran group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a benzocarbazolyl group, a pyridoindolyl group, a dibenzofuryl group, a phenanthridinyl group, a benzoquinolyl group, a phenazinyl group, a dibenzosilolyl group, a dibenzothiophenyl group, and a benzocarbazolyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

In particular, $Ar_1$ may be represented by one of Formulae 3A and 3B:

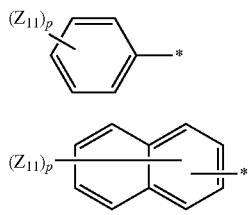

Formula 3A

Formula 3B

In Formulae 3A and 3B,
each $Z_{11}$ is independently selected from
a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{40}$ aryl group, a $C_2$-$C_{40}$ heteroaryl group; or
a $C_6$-$C_{40}$ aryl group and a $C_2$-$C_{40}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{40}$ aryl group, or a $C_2$-$C_{40}$ heteroaryl group.

p is an integer from 0 to 7, and * is a binding site.

In some embodiments, $Ar_1$ may be represented by one of Formulae 4A to 4F:

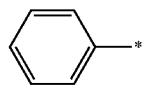

Formula 4A

Formula 4B

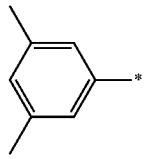

Formula 4C

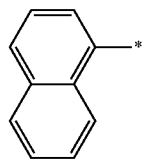

Formula 4D

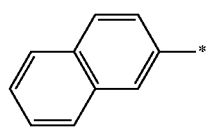

Formula 4E

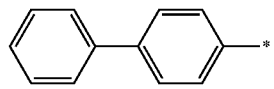

Formula 4F

In Formulae 4A to 4F,
* is a binding site to L of Formula 1.
L is selected from
a phenylene group, a phenalenylene group, a pentalenylene group, an indenylene group, a naphthylene group, an azulenylene group, an indacenylene group, an acenaphthylene group, a biphenylene group, a heptalenylene group, a phenalenylene group, a fluorenylene group, a phenanthrenylene group, an anthrylene group, a fluoranthenylene group, a pyrenylene group, a benzofluorenylene group, a naphthacenylene group, a chrysenylene group, or a triphenylenyl group; or
a phenylene group, a phenalenylene group, a pentalenylene group, an indenylene group, a naphthylene group, an azulenylene group, an indacenylene group, an acenaphthylene group, a biphenylene group, a heptalenylene group, a phenalenylene group, a fluorenylene group, a phenanthrenylene group, an anthrylene group, a fluoranthenylene group, a pyrenylene group, a benzofluorenylene group, a naphthacenylene group, a chrysenylene group, or a triphenylenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

In some embodiments, L may be represented by one of Formulae 5A to 5C:

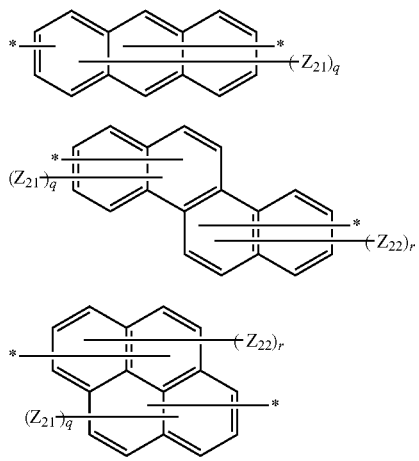

Formula 5A

Formula 5B

Formula 5C

In Formulae 5A to 5C, each $Z_{21}$ and each $Z_{22}$ is independently one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{40}$ aryl group, a $C_2$-$C_{40}$ heteroaryl group; or a $C_6$-$C_{40}$ aryl group or a $C_2$-$C_{40}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{40}$ aryl group, or a $C_2$-$C_{40}$ heteroaryl group.

q is an integer from 0 to 8, r is an integer from 0 to 5, and * is a binding site.

In some embodiments, L may be represented by one of Formulae 6A to 6C:

Formula 6A

Formula 6B

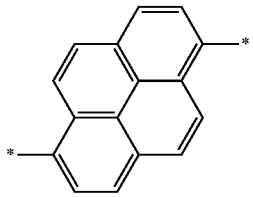

Formula 6C

In Formulae 6A to 6C, * is a binding site.

In certain embodiments, for Formula 1, $R_1$ to $R_{13}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a methyl group, an ethyl group, a propyl group, a butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spirofluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyran group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a benzocarbazolyl group, a pyridoindolyl group, a dibenzofuryl group, a phenanthridinyl group, a benzoquinolyl group, a phenazinyl group, a dibenzosilolyl group, a dibenzothiophenyl group, or a benzocarbazolyl group;

a methyl group, an ethyl group, a propyl group, a butyl group, a pentyl group, a hexyl group, a heptyl group, an octyl group, a nonyl group, a decyl group, a methoxy group, an ethoxy group, a propoxy group, a butoxy group, or a pentoxy group, each substituted with at least one of a deuterium atom, a halogen atom, a hydroxyl group, a cyano group, a nitro group, or an amino group; or a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyran group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a benzocarbazolyl group, a pyridoindolyl group, a dibenzofuryl group, a phenanthridinyl group, a benzoquinolyl group, a phenazinyl group, a dibenzosilolyl group, a dibenzothiophenyl group, or a benzocarbazolyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

In some embodiments, $R_1$ to $R_{13}$ are each independently represented by one of Formulae 7A to 7C:

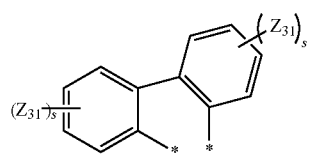

Formula 7A

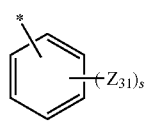

Formula 7B

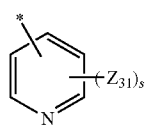

Formula 7C each $Z_{31}$ and each $Z_{32}$ is independently one selected from
a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{40}$ aryl group, a $C_2$-$C_{40}$ heteroaryl group;

a $C_1$-$C_{20}$ alkyl group or a $C_1$-$C_{20}$ alkoxy group, each substituted with at least one of a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof; or a $C_6$-$C_{40}$ aryl group or a $C_2$-$C_{40}$ heteroaryl group, each substituted with at least one of a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{40}$ aryl group, or a $C_2$-$C_{40}$ heteroaryl group.

s is 4 or 5, and * is a binding site.

In some embodiments, $R_1$ to $R_{13}$ may be each independently represented by one of Formulae 8A to 8E:

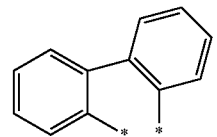

Formula 8A

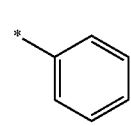

Formula 8B

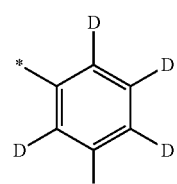

Formula 8C

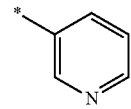

Formula 8D

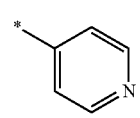

Formula 8E

In Formulae 8A to 8E, * is a binding site.

In Formula 2, A may be represented by one of Formulae 9A to 9C:

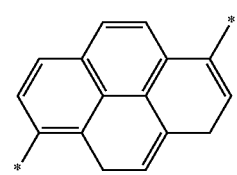

Formula 9A

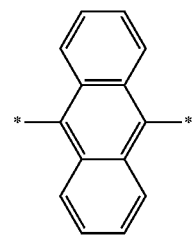

Formula 9B

-continued

Formula 9C

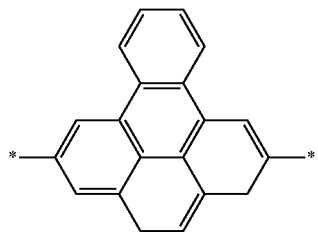

In Formulae 9A to 9C, * is a binding site.

In Formula 2, $R_{15}$ to $R_{18}$ may be each independently selected from
a phenyl group; or
a phenyl group substituted with at least one of a deuterium atom, a halogen atom, a $C_1$-$C_{20}$ alkyl group, or a $C_6$-$C_{40}$ aryl group.

In some embodiments, $R_{15}$ to $R_{18}$ may be each independently represented by one of Formula 10A to 10E:

Formula 10A

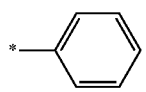

Formula 10B

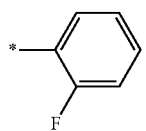

Formula 10C

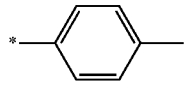

Formula 10D

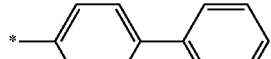

Formula 10E

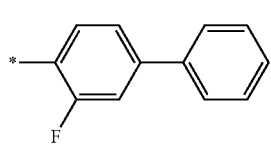

In Formulae 10A to 10E, * is a binding site.

A condensed cyclic compound represented by Formula 1 may be one of compounds represented by Compounds 1 to 51, but is not limited thereto:

1

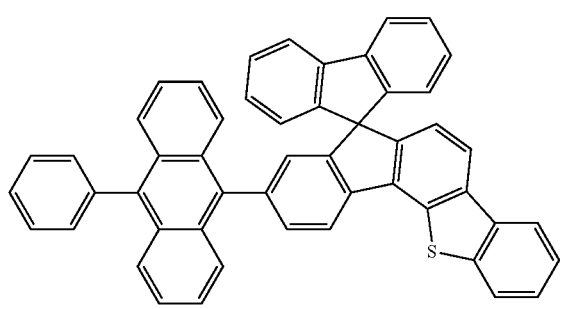

2

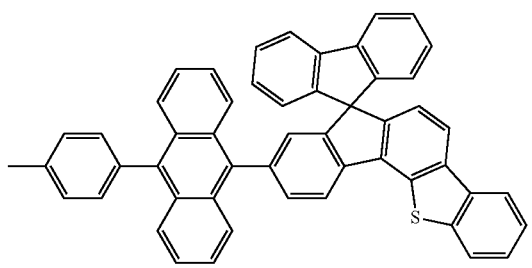

3

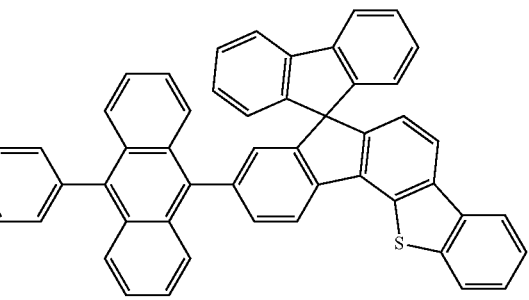

4

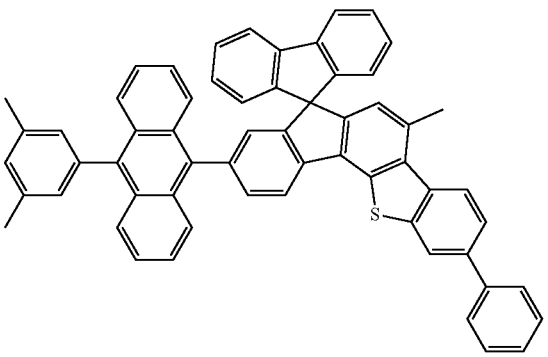

5

6
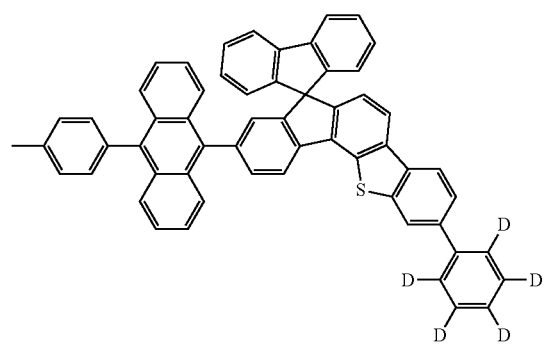
7
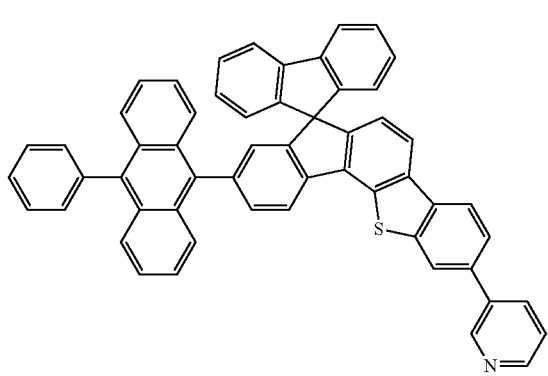
8
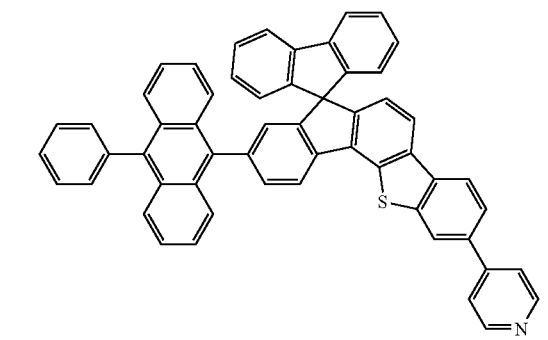
9
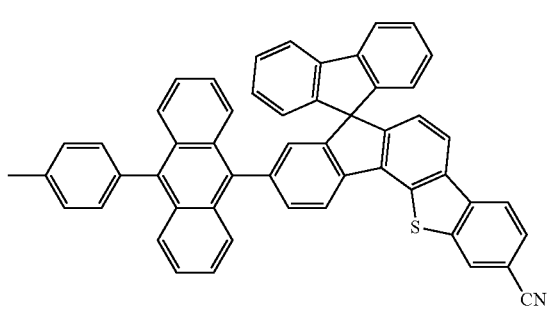
10
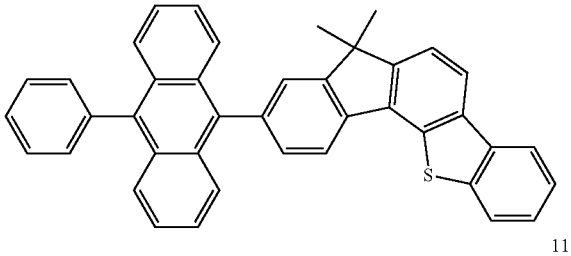
11
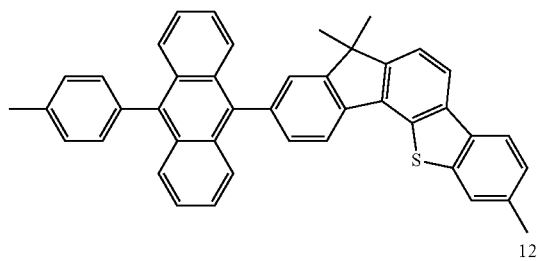
12
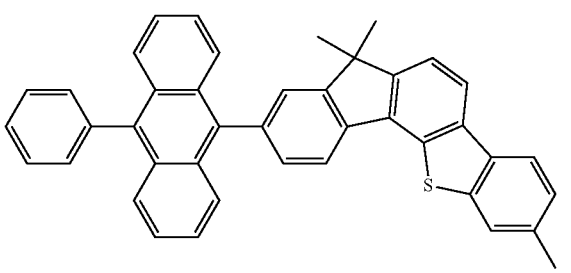
13
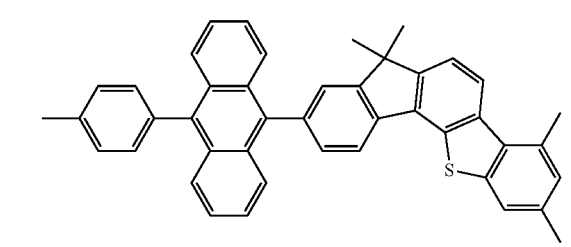
14
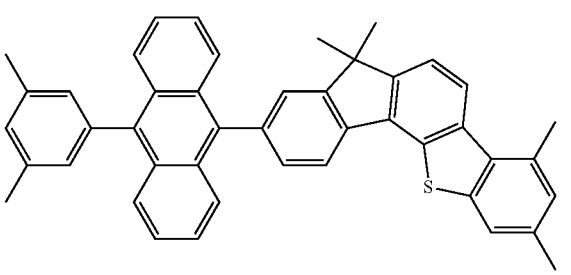
15

16
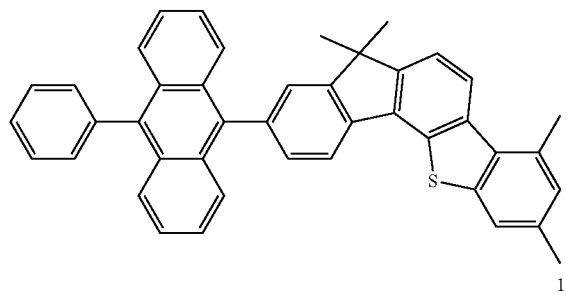
17
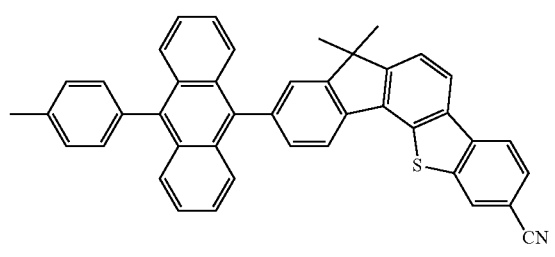
18
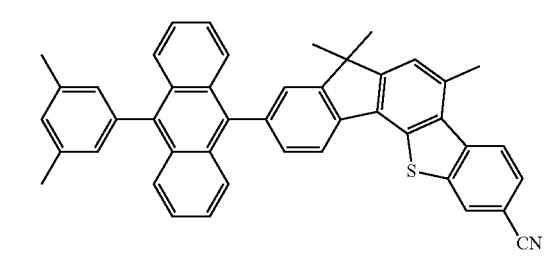
19
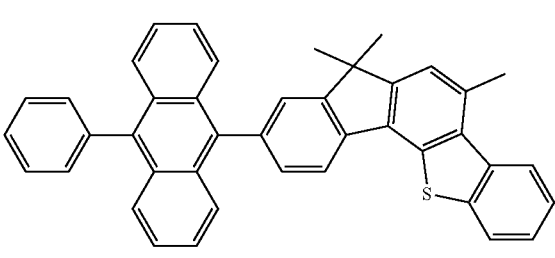
20
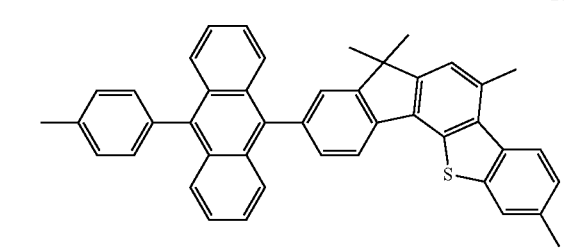
21
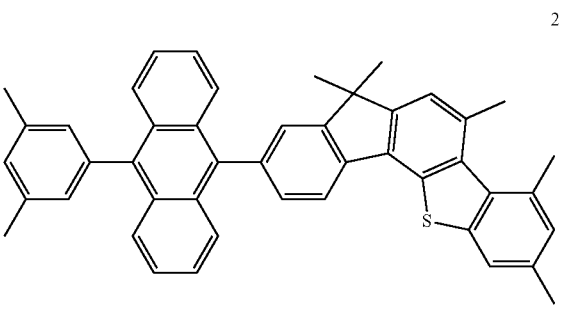
22
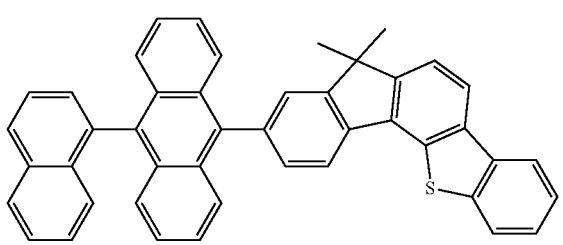
23
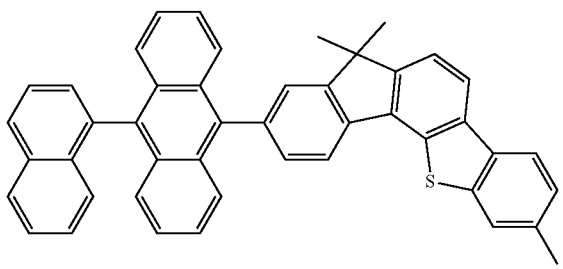
24
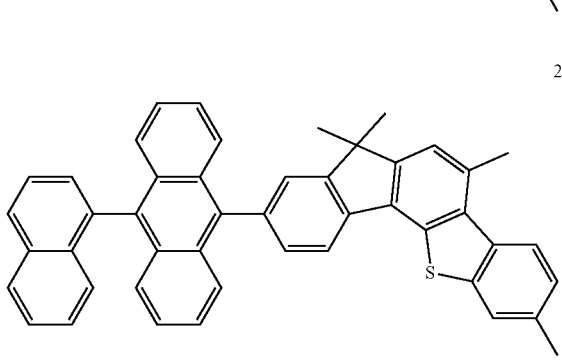
25
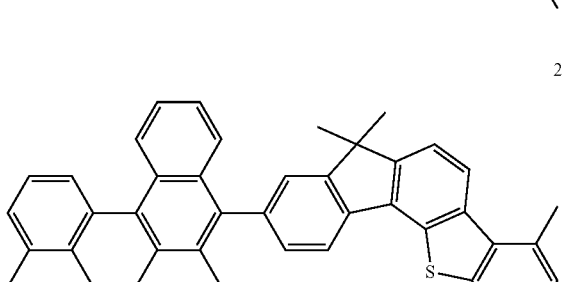
26
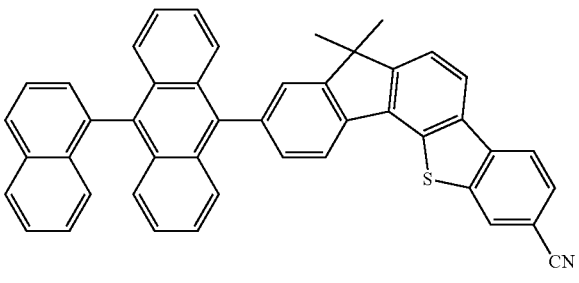

27
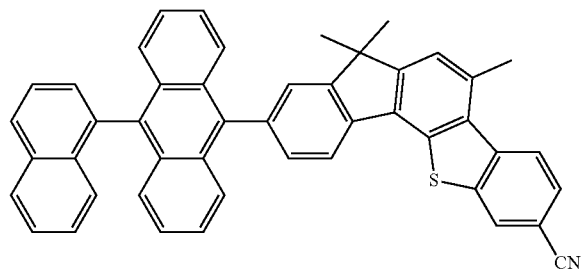
28
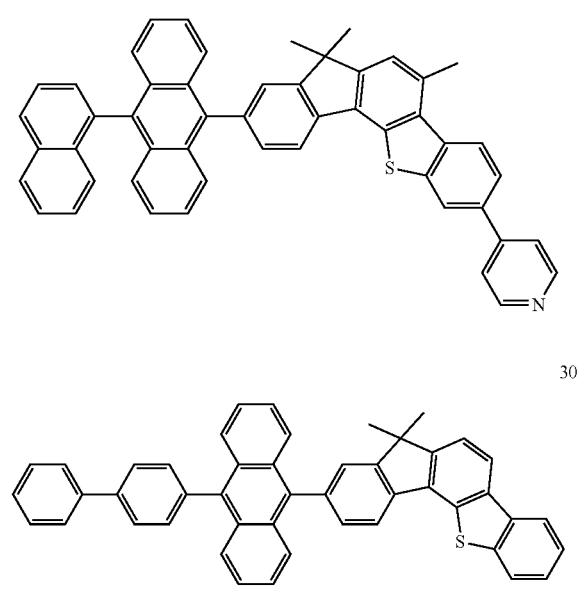
29
30
31
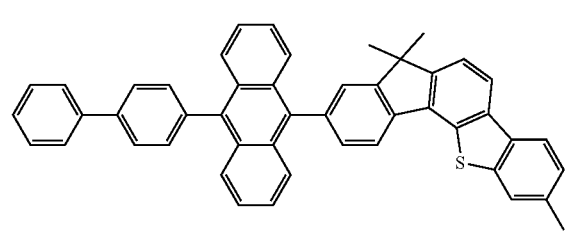
32
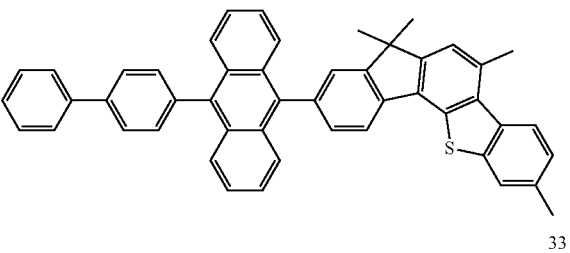
33
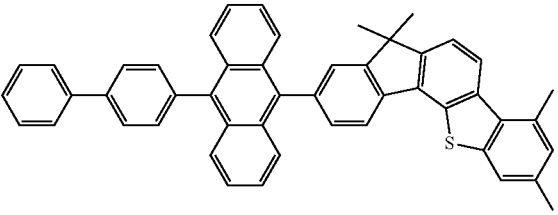
34
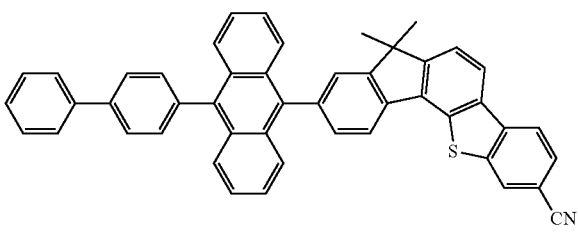
35
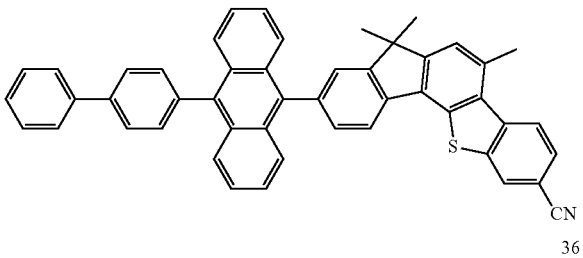
36
37
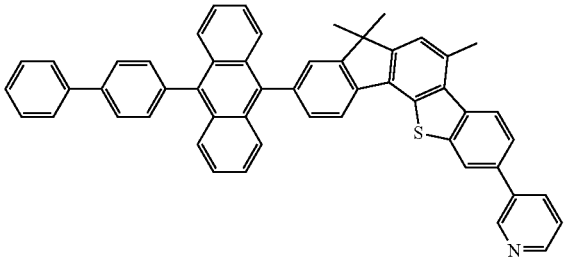

38
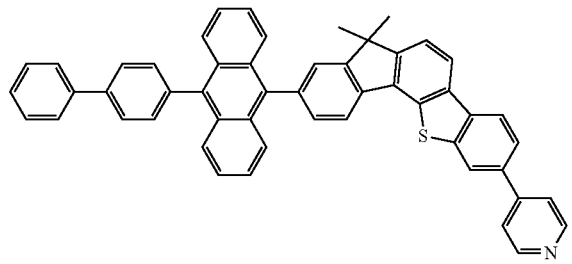
39
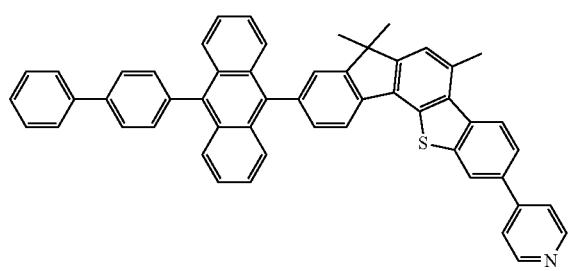
40
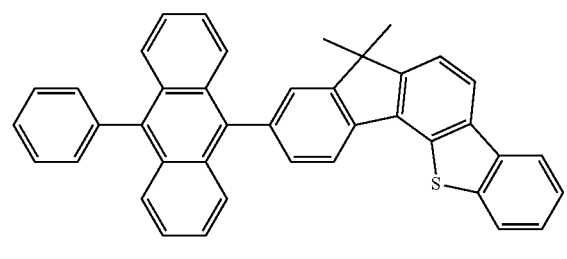
41
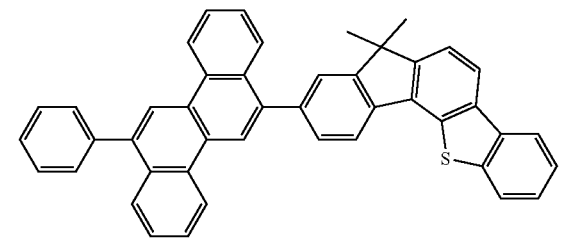
42
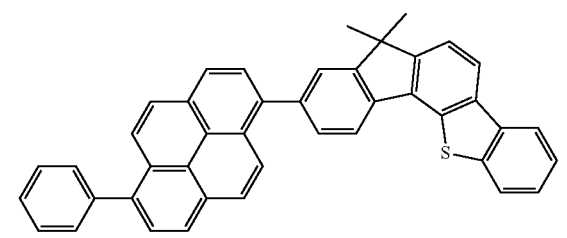
43
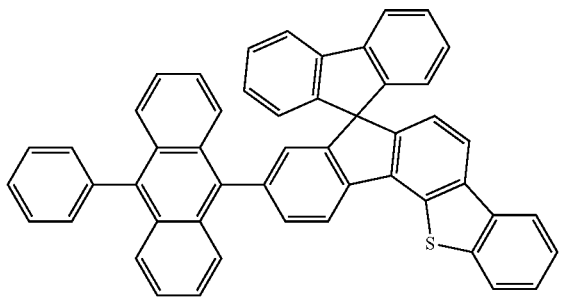
44
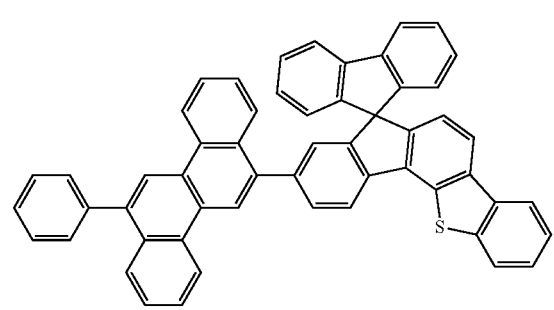
45
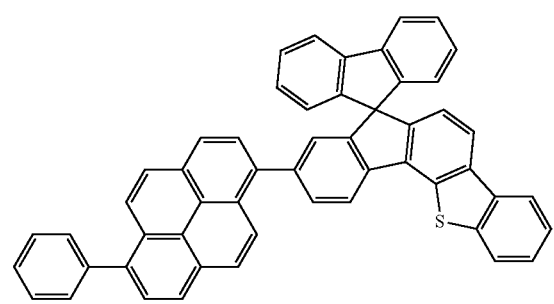
46
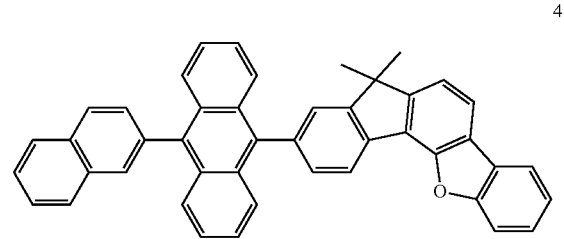
47
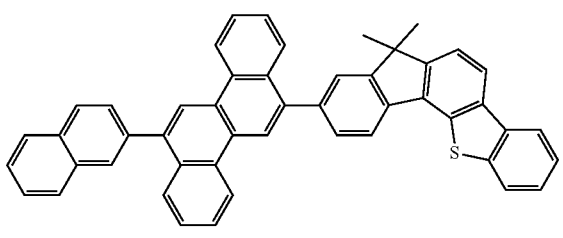

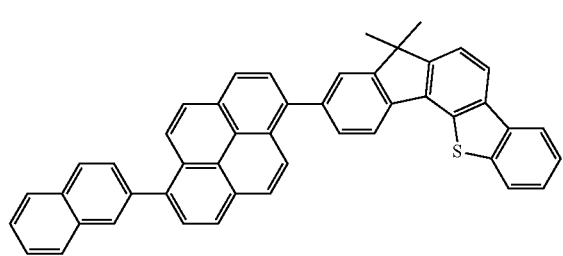
48
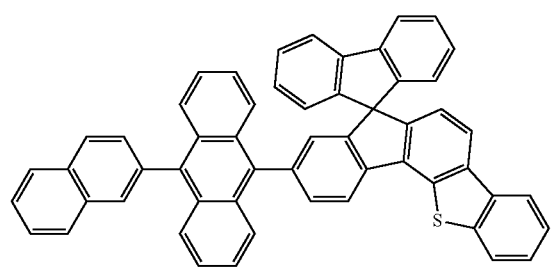
49
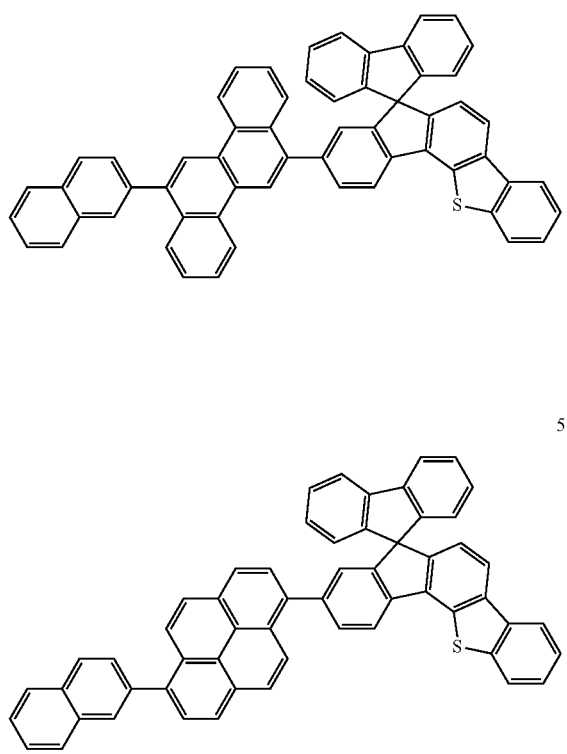
50
51
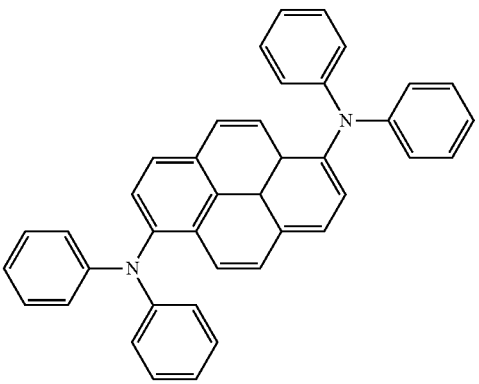
61
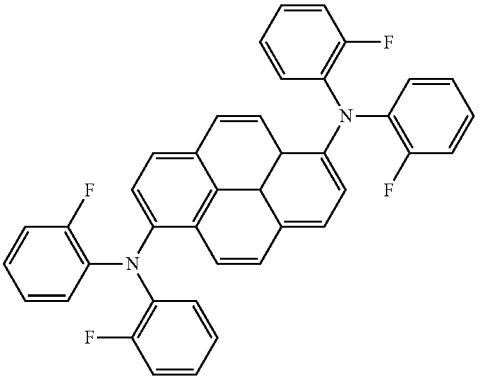
62
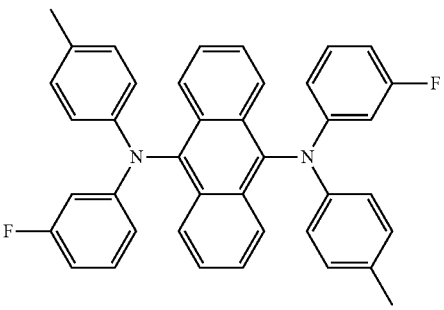
63
64
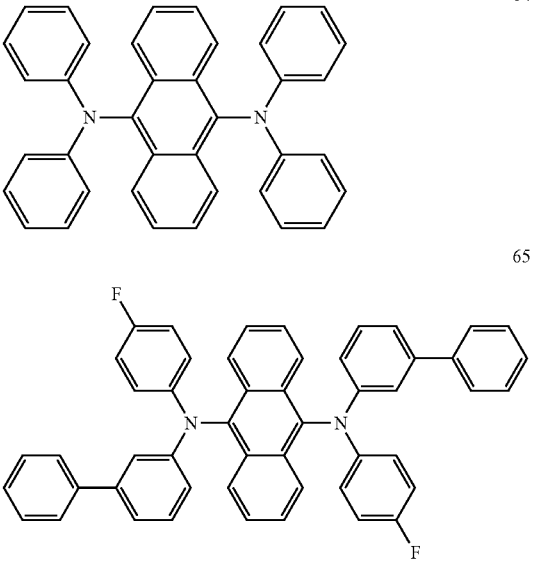
65
A condensed cyclic compound represented by Formula 2 may be one of compounds represented by Compounds 61 to 69, but is not limited thereto:

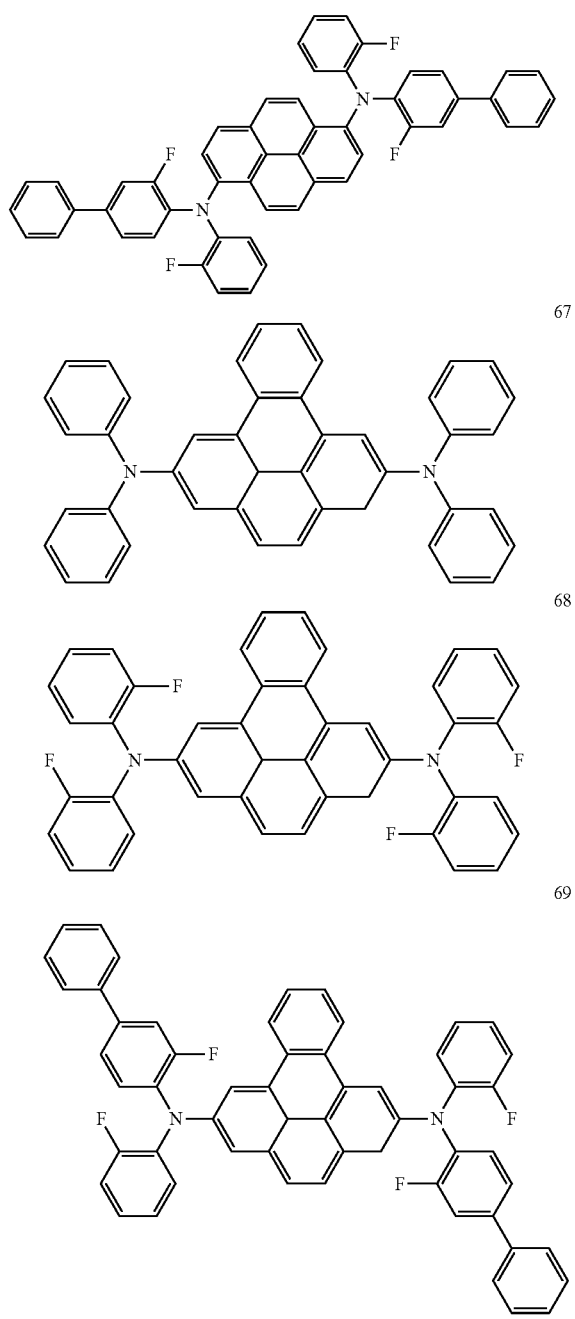

A condensed cyclic compound represented by Formula 1 and a condensed cyclic compound represented by Formula 2 may be used as a material for an emission layer for an OLED.

A condensed cyclic compound represented by Formula 1 and a condensed cyclic compound represented by Formula 2 may provide blue light emission of high color purity, high efficiency, and long lifetime.

As used herein, a $C_1$-$C_{20}$ alkyl group may be a linear or branched $C_1$-$C_{20}$ alkyl group, including, for example, a methyl group, an ethyl group, a propyl group, an isobutyl group, a sec-butyl group, a pentyl group, an iso-amyl group, or a hexyl group, but is not limited thereto.

As used herein, a $C_1$-$C_{20}$ alkoxy group is represented by —OA (where A is an unsubstituted $C_1$-$C_{20}$ alkyl group as described above), and non-limiting examples of the $C_1$-$C_{20}$ alkoxy group include a methoxy group, an ethoxy group, and an isopropyloxy group.

As used herein, a $C_2$-$C_{20}$ alkenyl group refers to a $C_2$-$C_{20}$ alkyl group having at least one carbon-carbon double bond at one or more positions along a carbon chain of the $C_2$-$C_{20}$ alkyl group. For example, the $C_2$-$C_{20}$ alkenyl group may include a terminal alkene and/or an internal alkene, and non-limiting examples of the $C_2$-$C_{20}$ alkenyl group include an ethenyl group, a propenyl group, and a butenyl group.

As used herein, a $C_2$-$C_{20}$ alkynyl group refers to a $C_2$-$C_{20}$ alkyl group having at least one carbon-carbon triple bond at one or more positions along a carbon chain of the $C_2$-$C_{20}$ alkyl group. For example, the $C_2$-$C_{20}$ alkynyl group may include a terminal alkyne and/or an internal alkyne, and non-limiting examples of the $C_2$-$C_{20}$ alkynyl group include an ethynyl group and a propynyl group.

As used herein, a $C_6$-$C_{60}$ aryl group indicates a monovalent $C_6$-$C_{60}$ carbocyclic aromatic system containing at least one aromatic ring, and a $C_6$-$C_{60}$ arylene group indicates a divalent $C_6$-$C_{60}$ carbocyclic aromatic system containing at least one aromatic ring. When the aryl group or the arylene group includes at least two rings, the at least two rings may be fused to each other or connected to each other via a single bond.

Non-limiting examples of the $C_6$-$C_{60}$ aryl group include a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., o-, m- or p-fluorophenyl group, a dichlorophenyl group), a dicyanophenyl group, a trifluoromethoxyphenyl group, an o-, m-, or p-tolyl group, an o-, m- or p-cumenyl group, a mesityl group, a phenoxyphenyl group, a (α,α-dimethylbenzene) phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronelyl group, a trinaphthylenyl group, a heptaphenyl group, a heptacenyl group, a pyranthrenyl group, and an ovalenyl group.

As used herein, a $C_1$-$C_{60}$ heteroaryl group denotes a monovalent carbocyclic aromatic system having at least one aromatic ring and at least one of the heteroatoms selected from the group consisting of N, O, P, and S, and a $C_1$-$C_{60}$ heteroarylene group denotes a divalent carbocyclic aromatic system having at least one aromatic ring and at least one of the heteroatoms selected from the group consisting of N, O, P, and S. In this regard, when the heteroaryl group or the heteroarylene group includes at least two rings, they may be fused to each other or connected to each other via a single bond.

Non-limiting examples of the $C_1$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group.

The $C_6$-$C_{40}$ aryloxy group indicates —$OA_2$ (where $A_2$ is a substituted or unsubstituted $C_6$-$C_{40}$ aryl group described above), and the $C_6$-$C_{40}$ arylthio group indicates —$SA_3$ (where $A_3$ is a substituted or unsubstituted $C_6$-$C_{40}$ aryl group described above).

The condensed cyclic compound represented by Formula 1 and the condensed cyclic compound represented by Formula 2 may be synthesized by using an organic synthesis method. The synthesis method of the condensed cyclic compounds may be understood by those of ordinary skill in the art from the examples that will be described below.

The condensed cyclic compound represented by Formula 1 and the condensed cyclic compound represented by Formula 2 may be included in an organic layer between a pair of electrodes of an OLED. For example, the condensed cyclic compound represented by Formula 1 may serve as a host of an emission layer, and the condensed cyclic compound represented by Formula 2 may serve as a dopant of the emission layer.

Therefore, according to an embodiment of the present invention, an OLED includes a first electrode, a second electrode disposed opposite to the first electrode, and an organic layer disposed between the first electrode and the second electrode, wherein the organic layer includes each of the condensed cyclic compound represented by Formula 1 and the condensed cyclic compound represented by Formula 2.

As used here, the term "organic layer" refers to a layer containing an organic compound and consisting of at least one layer. For example, the organic layer may include an emission layer (EML), a hole transporting region, and an electron transporting region.

The hole transporting region may include at least one of a hole injection layer (HIL), a hole transport layer (HTL), and an electron blocking layer (EBL).

The electron transporting region may include at least one of an electron injection layer (EIL), an electron transport layer (ETL), and a hole blocking layer (HBL).

The organic layer does not have to include solely an organic compound. The organic layer may include an inorganic compound or an inorganic material. In one embodiment, the organic layer may include both an organic compound and an inorganic compound or an inorganic material, e.g., an organometallic complex, in one layer. In another embodiment, the organic layer may include a layer containing an organic compound and a layer solely containing an inorganic compound or an inorganic material.

The electron transporting region may include an electron transporting organic compound and a metal-containing material. The metal-containing material may include a lithium (Li) complex.

The hole transporting region may further include a charge-generating material. The charge-generating material may be, for example, a p-dopant.

The drawing is a schematic sectional view of an OLED 10 according to an embodiment of the present invention. Hereinafter, a structure of an OLED according to an embodiment of the present invention and a method of manufacturing the same will now be described by referring to the drawing.

The OLED 10 sequentially includes a substrate 11, a first electrode 13, an organic layer 15, and a second electrode 17.

The substrate 11 may be any substrate that is used in existing OLEDs. In some embodiments, the substrate 11 may be a glass substrate or a transparent plastic substrate with strong mechanical strength, thermal stability, transparency, surface smoothness, ease of handling, and water resistance.

The first electrode 13 may be formed by depositing or sputtering a first electrode-forming material on the substrate 11. When the first electrode 13 is an anode, a material having a high work function may be used as the first electrode-forming material to facilitate hole injection. The first electrode 13 may be a reflective electrode or a transmission electrode. Transparent and conductive materials such as ITO, IZO, $SnO_2$, and ZnO may be used as materials for the first electrode 13. In some embodiments, the first electrode 13 may be formed as a reflective electrode using magnesium (Mg), silver (Ag), aluminum (Al), aluminum-lithium (Al—Li), calcium (Ca), silver-indium tin oxide (Ag-ITO), magnesium-indium (Mg—In), magnesium-silver (Mg—Ag), or the like. The first electrode 13 may be a reflective electrode. The first electrode 13 may have a single-layer structure or a multi-layered structure including at least two layers. For example, the first electrode 13 may have a three-layered structure of ITO/Ag/ITO, but is not limited thereto.

The organic layer 15 may be disposed on the first electrode 13.

The organic layer 15 may include a hole transporting region, an EML, or an electron transporting region.

The hole transporting region may include at least one of a HIL, a HTL, or an EBL.

The electron transporting region may include at least one of an EIL, an ETL, or a HBL.

The HIL may be formed on the first electrode 13 by vacuum deposition, spin coating, casting, or Langmuir-Blodgett (LB) deposition.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in the range of about 2,000 rpm to about 5,000 rpm, and a temperature at which heat treatment is performed to remove a solvent after coating may be in the range of about 80° C. to about 200° C. However, the coating conditions are not limited thereto.

For example, any suitable hole injection material may be used as a HIL material. Non-limiting examples of the hole injection materials include N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino) triphenylamine (m-MTDATA), 4,4',4"-tris(N,N-diphenylamino)triphenylamine (TDATA), 4,4',4"-tris{N,-(2-naphthyl)-N-phenylamino}-triphenylamine (2T-NATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANT/CSA), and polyaniline)/poly(4-styrenesulfonate (PANI/PSS), but are not limited thereto.

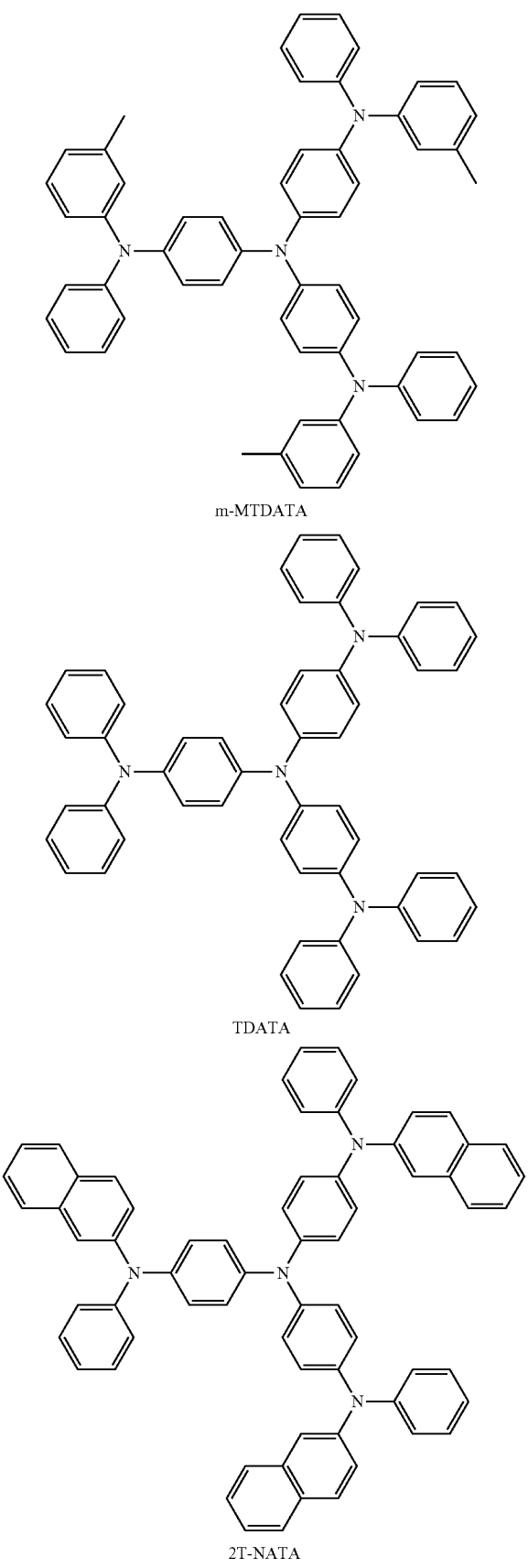

m-MTDATA

TDATA

2T-NATA

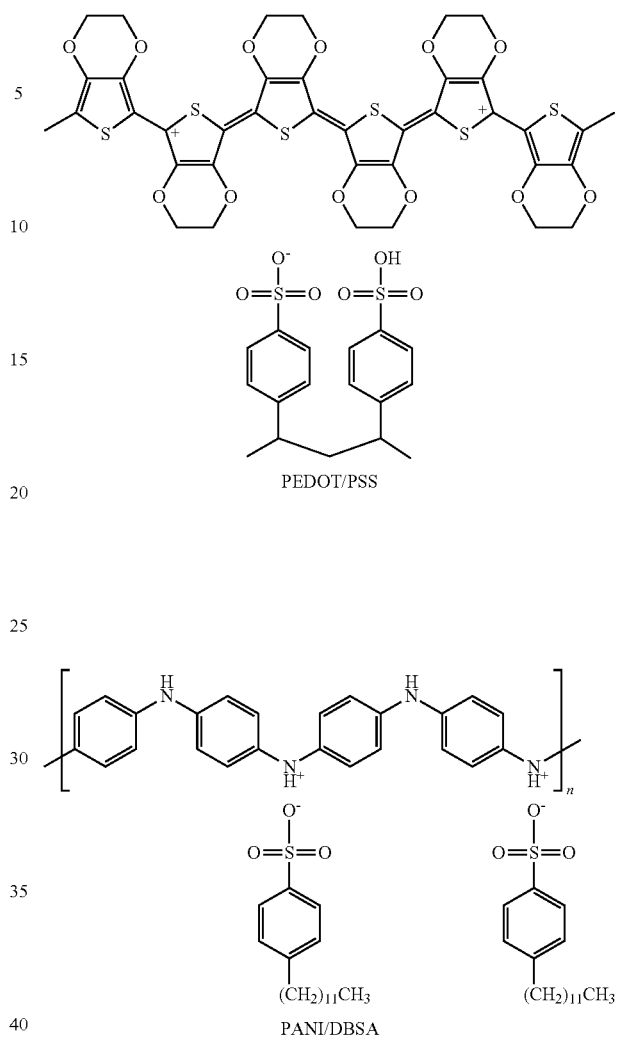

PEDOT/PSS

PANI/DBSA

A thickness of the HIL may be in a range of about 100 Å to about 10,000 Å, and in some embodiments, may be in a range of about 100 Å to about 1,000 Å. When the thickness of the HIL is within this range, satisfactory hole injection properties may be obtained without a substantial increase in driving voltage.

Next, the HTL may be formed on the HIL by vacuum deposition, spin coating, casting, or LB deposition. When the HTL is formed by vacuum deposition or spin coating, the deposition and coating conditions vary depending on a used compound. However, in general, the conditions may be almost the same as the conditions for forming the HIL.

Any suitable hole transporting material may be used as a HTL material. Non-limiting examples of the known hole transporting material include carbazole derivatives, such as N-phenylcarbazole, polyvinylcarbazole, or the like; triphenylamine materials, such as N,N'-bis(3-methylphenyl)-N,N'-diphenyl-[1,1-biphenyl]-4,4'-diamine (TPD); N,N'-di(1-naphthyl)-N,N-diphenylbenzidine (NPB), N,N'-bis(naphthalen-1-yl)-N,N'-bis(phenyl)-2,2'-dimethylbenzidine (α-NPD), and 4,4',4''-tris(N-carbazolyl)triphenylamine (TCTA), but are not limited thereto.

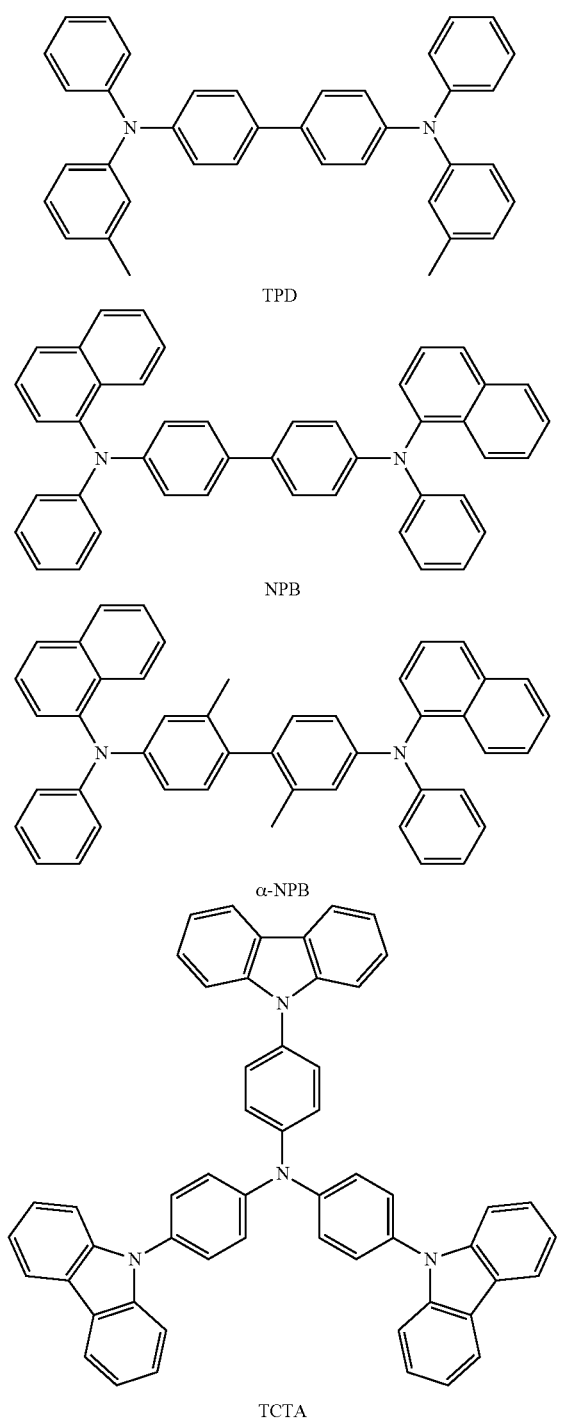

TPD

NPB

α-NPB

TCTA

In some embodiments, a thickness of the HTL is in a range of about 50 Å to about 1,000 Å, and in some embodiments, in a range of about 100 Å to about 800 Å. When the thickness of the HTL is within this range, satisfactory hole transporting properties may be obtained without a substantial increase in driving voltage.

In some embodiments, instead of the HIL and the HTL, a hole injection and transport layer may be formed. The hole injection and transport layer may include at least one of the HIL materials and HTL materials described above. A thickness of the hole injection and transport layer may be in a range of about 500 Å to about 10,000 Å, and in some embodiments, may be in a range of about 100 Å to about 1,000 Å. When the thickness of the hole injection and transport layer is within this range, satisfactory hole injecting and transporting properties may be obtained without a substantial increase in driving voltage.

In some embodiments, at least one of the HIL, the HTL, and the hole injection and transport layer may include at least one of a compound represented by Formula 100 or a compound represented by Formula 101:

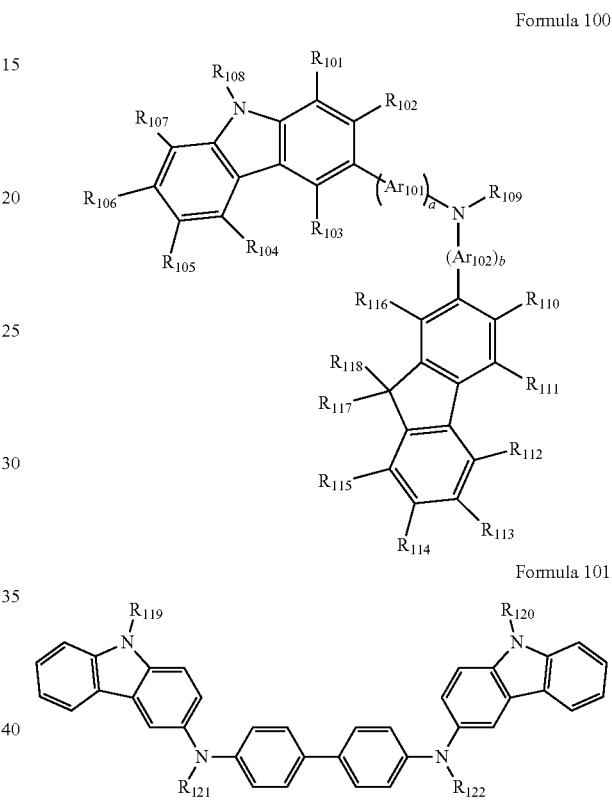

Formula 100

Formula 101

In Formula 100, $Ar_{101}$ and $Ar_{102}$ may be each independently a substituted or unsubstituted $C_6$-$C_{40}$ arylene group. In some embodiments, $Ar_{101}$ and $Ar_{102}$ may be each independently one of a phenylene group, a pentalenylene group, an indenylene group, a naphthylene group, an azulenylene group, a heptalenylene group, a substituted or unsubstituted acenaphthylene group, a fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, or a pentacenylene group; or a phenylene group, a pentalenylene group, an indenylene group, a naphthylene group, an azulenylene group, a heptalenylene group, a substituted or unsubstituted acenaphthylene group, a fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, or a pentacenylene group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{40}$ alkyl group, a $C_2$-$C_{40}$ alkenyl group, a $C_2$-$C_{40}$ alkynyl group, a $C_1$-$C_{40}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{40}$ aryl group, a $C_6$-$C_{40}$ aryloxy group, a $C_6$-$C_{40}$ arylthio group, or a $C_2$-$C_{40}$ heteroaryl group.

In Formula 100, a and b are each independently an integer of 0 to 5, for example, 0, 1, or 2. For example, a may be 1, and b may be 0, but a and b are not limited thereto.

In Formulae 100 and 101, $R_{101}$ to $R_{122}$ may be each independently a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{40}$ alkyl group, a substituted or unsubstituted $C_2$-$C_{40}$ alkenyl group, a substituted or unsubstituted $C_2$-$C_{40}$ alkynyl group, a substituted or unsubstituted $C_1$-$C_{40}$ alkoxy group, a substituted or unsubstituted $C_3$-$C_{40}$ cycloalkyl group, a substituted or unsubstituted $C_6$-$C_{40}$ aryl group, a substituted or unsubstituted $C_6$-$C_{40}$ aryloxy group, or a substituted or unsubstituted $C_6$-$C_{40}$ arylthio group.

In some embodiments, $R_{101}$ to $R_{108}$ and $R_{110}$ to $R_{122}$ may be each independently one of, but are not limited to, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, a pentyl group, a hexyl group), a $C_1$-$C_{10}$ alkoxy group (e.g., a methoxy group, an ethoxy group, a propoxy group, a butoxy group, a pentoxy group), a phenyl group, a naphthyl group, an anthryl group, a fluorenyl group, or a pyrenyl group; or a $C_1$-$C_{10}$ alkyl group, a $C_1$-$C_{10}$ alkoxy group, a phenyl group, a naphthyl group, an anthryl group, a fluorenyl group, or a pyrenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, or a phosphoric acid group or a salt thereof.

In Formula 100, $R_{109}$ may be one of a phenyl group, a naphthyl group, an anthryl group, a biphenyl group, a pyridyl group; or a phenyl group, a naphthyl group, an anthryl group, a biphenyl group, or a pyridyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{20}$ alkyl group, or a substituted or unsubstituted $C_1$-$C_{20}$ alkoxy group.

In some embodiments, the compound represented by Formula 100 may be represented by Formula 100A, but is not limited thereto:

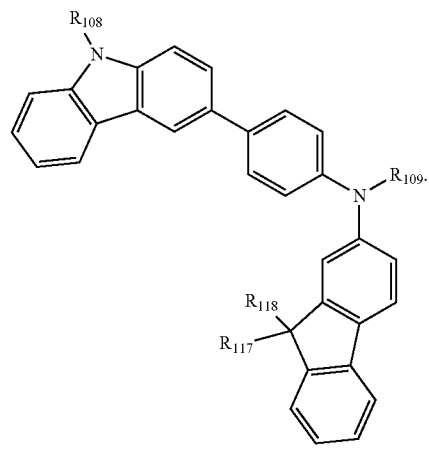

Formula 100A

In Formula 100A, descriptions of $R_{108}$, $R_{109}$, $R_{117}$, and $R_{118}$ are as defined above in connection with Formula 100.

In some embodiments, at least one of the HIL, the HTL, and the hole injection and transport layer may include at least one of compounds represented by Formulae 102 to 121 below, but is not limited thereto:

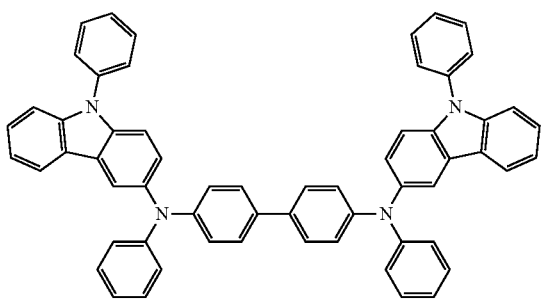

102

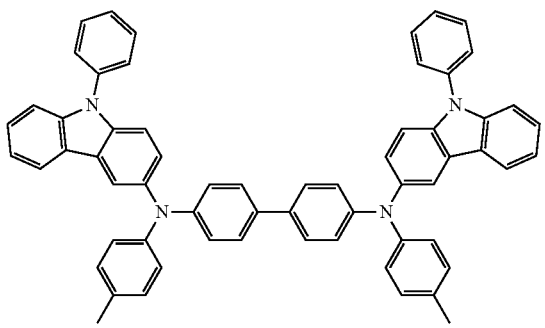

103

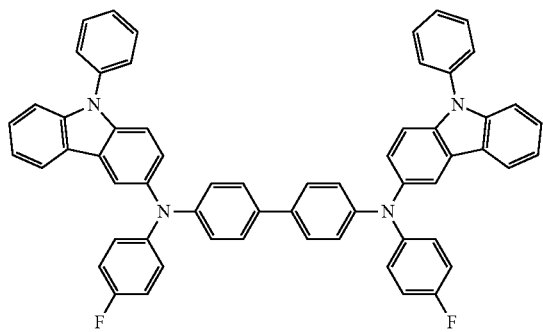
104
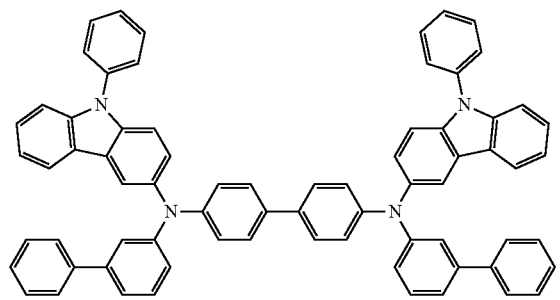
108
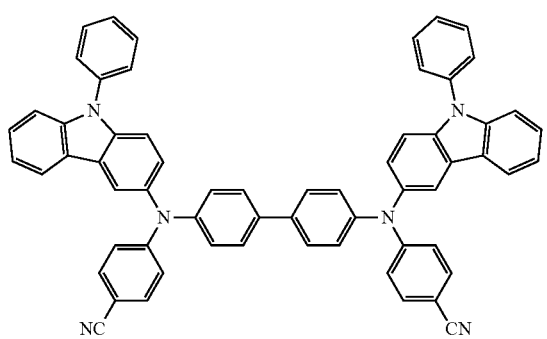
105
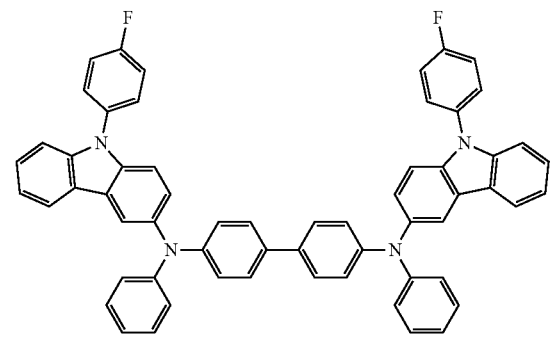
109
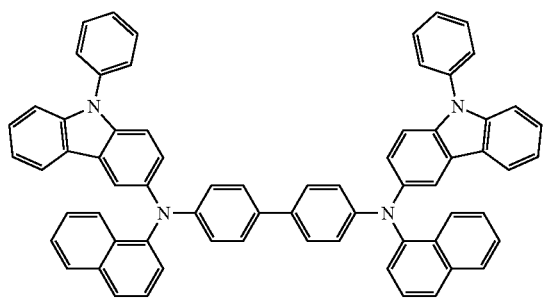
106
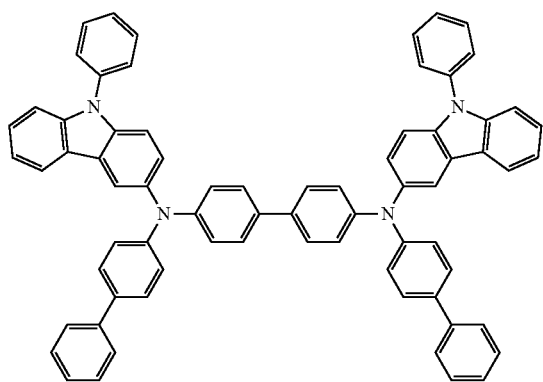
107
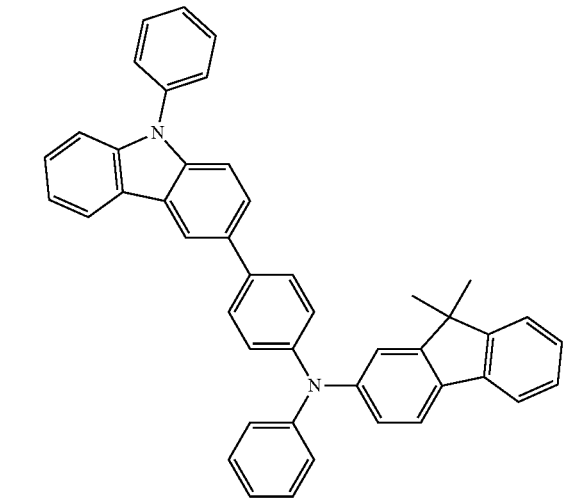
110

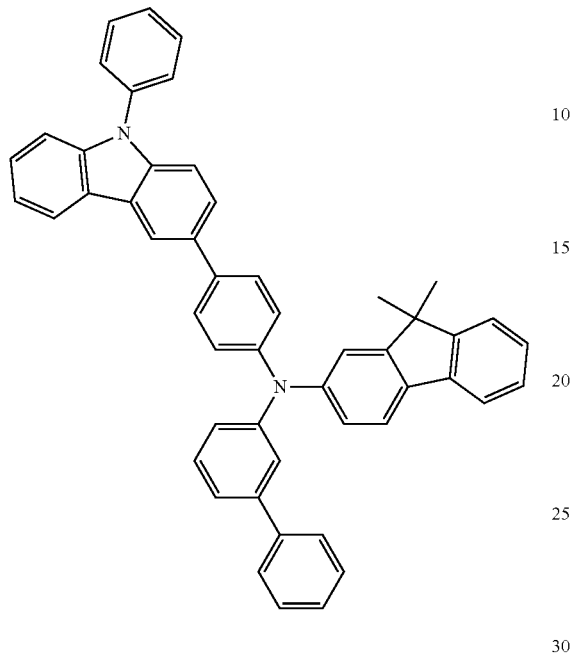
111
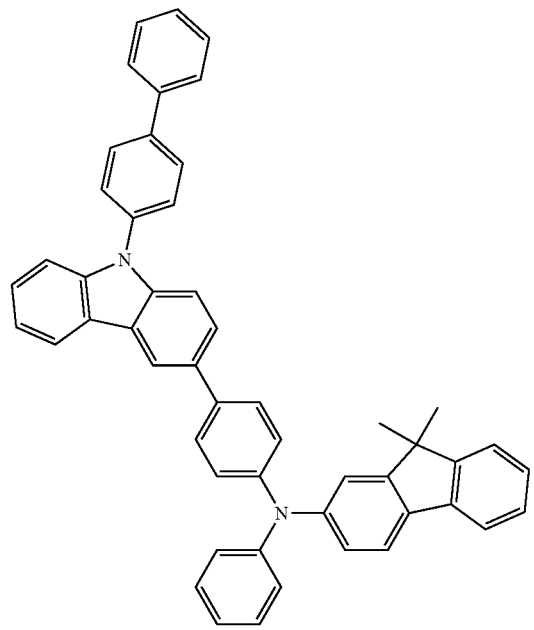
113
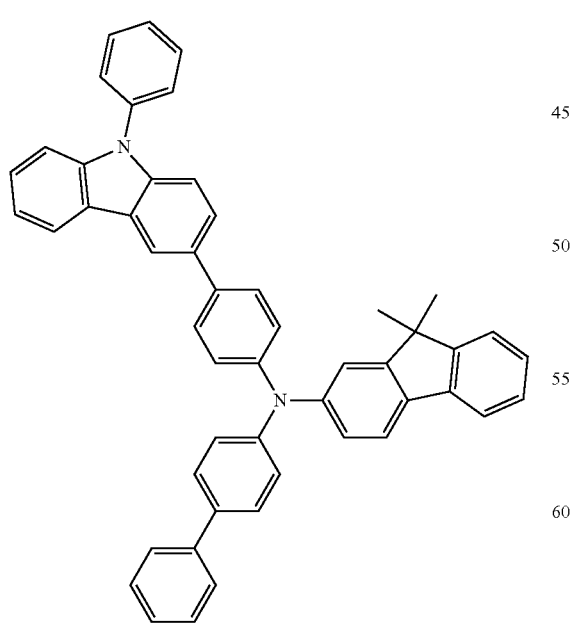
112
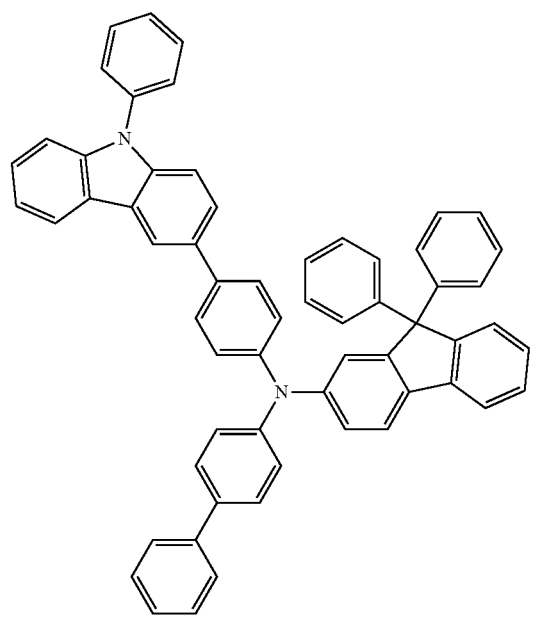
114

115
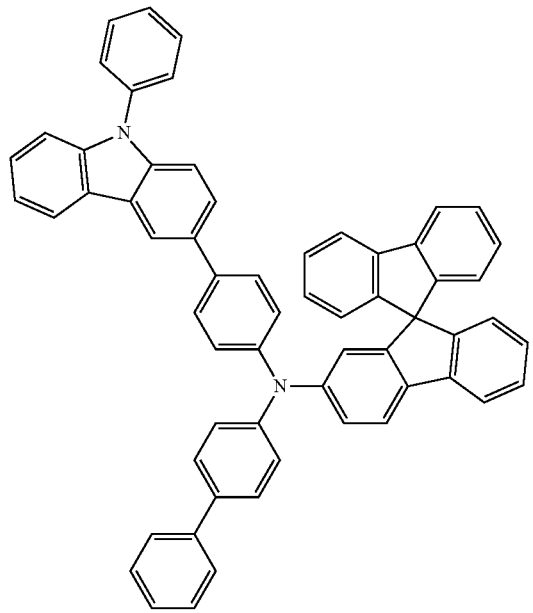
116
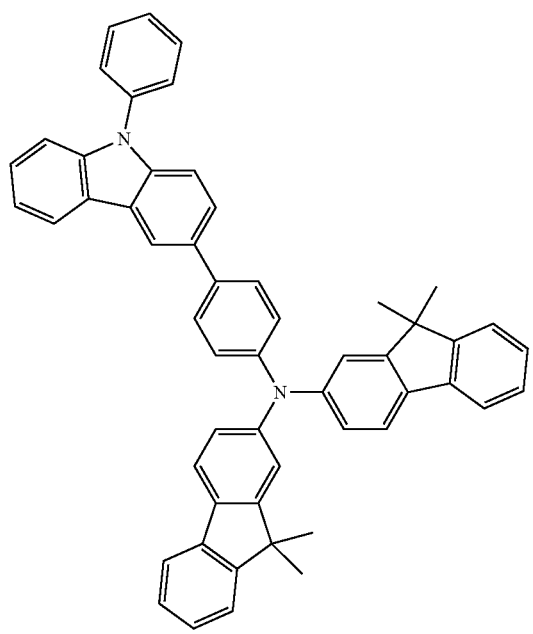
117
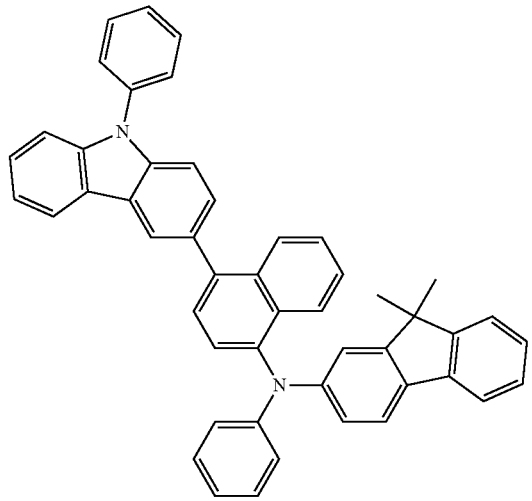
118
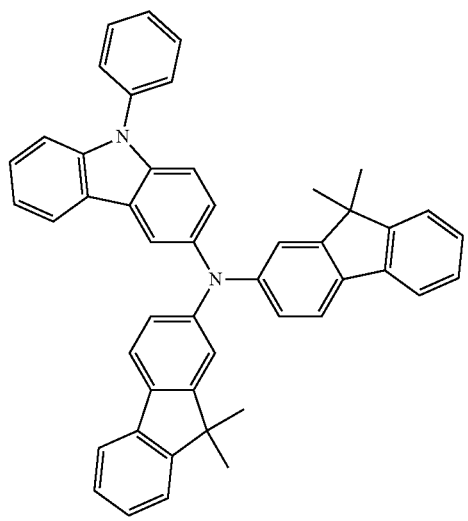
119
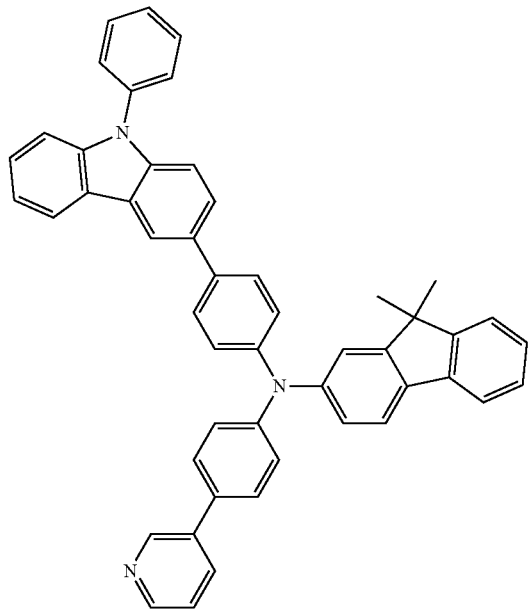

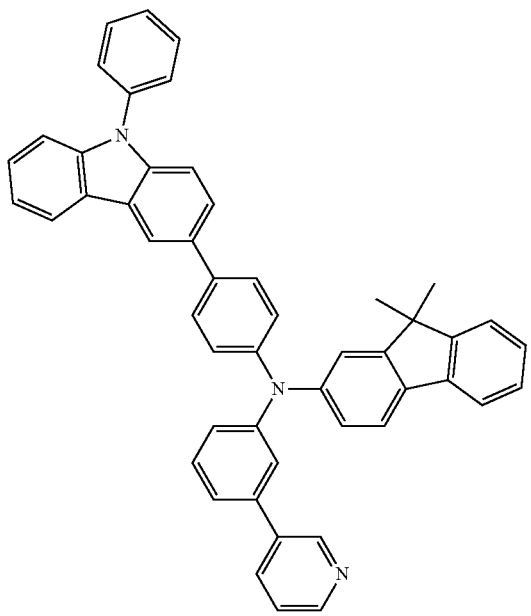

120

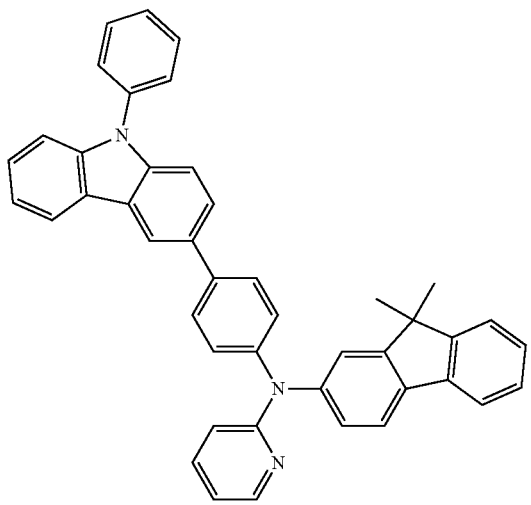

121

At least one of the HIL, the HTL, and the hole injection and transport layer may further include a charge-generating material for improved layer conductivity, in addition to the hole injecting material, the hole transport material, and/or the material having both hole injection and hole transport capabilities as described above.

The charge-generating material may be, for example, a p-dopant. Non-limiting examples of the p-dopant include quinone derivatives such as tetracyanoquinonedimethane (TCNQ), 2,3,5,6-tetrafluoro-tetracyano-1,4-benzoquinonedimethane (F4TCNQ), or the like; metal oxides such as tungsten oxide, molybdenum oxide, or the like; and cyano-containing compounds such as Compound 200 below:

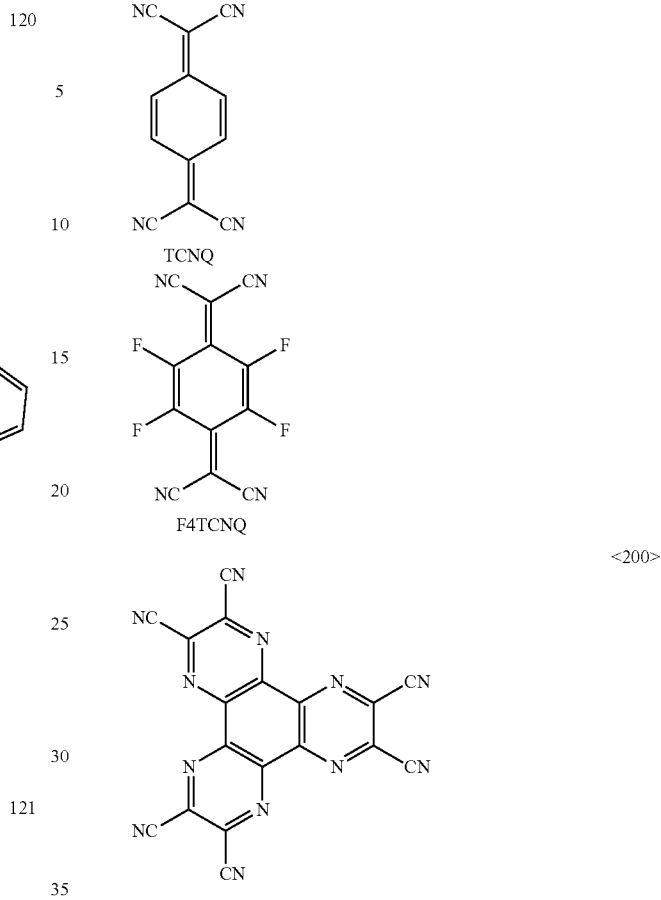

When the hole injection layer, the hole transport layer, or the hole injection and transport layer further includes a charge generating material, the charge generating material may be, but not limited to, homogeneously dispersed or inhomogeneously distributed in the layer.

Then, an EML may be formed on the HTL or the hole injection and transport layer by vacuum deposition, spin coating, casting, or Langmuir-Blodget (LB) deposition. When the EML is formed using vacuum deposition or spin coating, the conditions for deposition and coating may vary according to the material that is used to form the EML, but the deposition and coating conditions may be similar to those for the formation of the HIL.

The compound represented by Formula 1 and the compound represented by Formula 2 may be an EML material for emitting blue light.

In order to emit blue light, the compound represented by Formula 1 may be a host of the EML, and the compound represented by Formula 2 may be a dopant of the EML.

Any suitable host may be used for emitting red light and green light in the EML.

Non-limiting examples of the host include tris(8-quinolinorate)aluminum ($Alq_3$), 4,4'-N,N'-dicabazole-biphenyl (CBP), poly(n-vinylcabazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), distyrylarylene (DSA), E3, dmCBP, and Compounds 301 to 309 below:

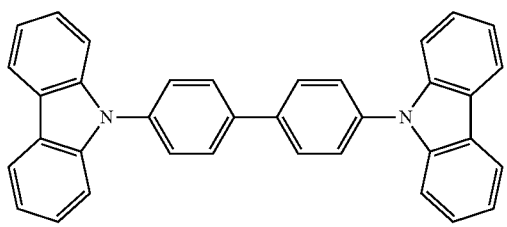
CBP
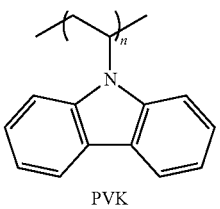
PVK
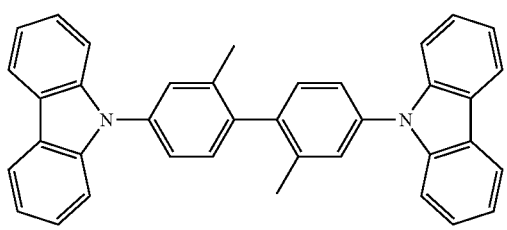
dmCBP
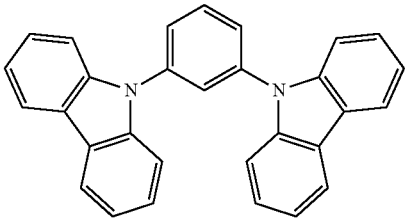
E3
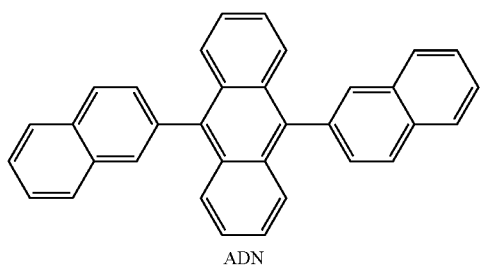
ADN
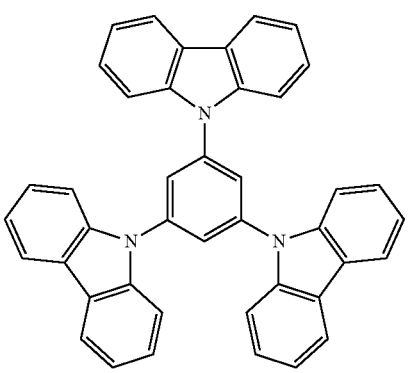
301
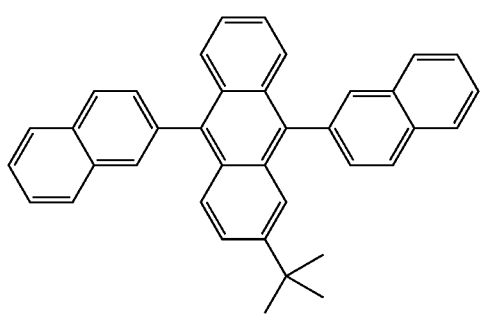
TBADN
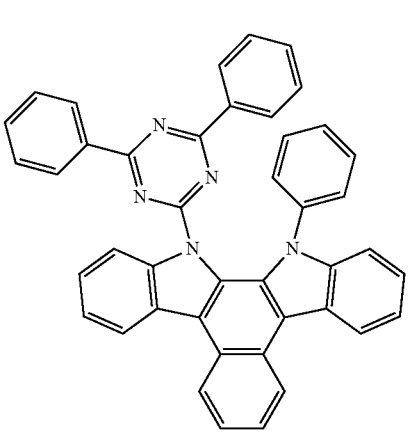
302
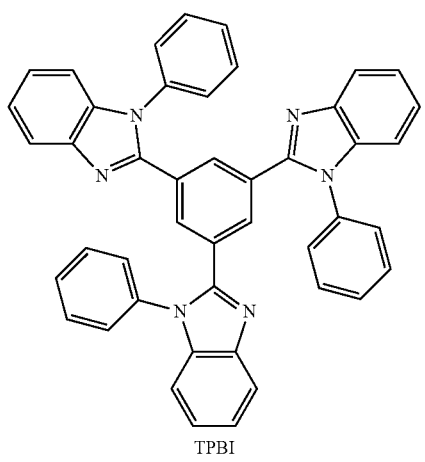
TPBI
303

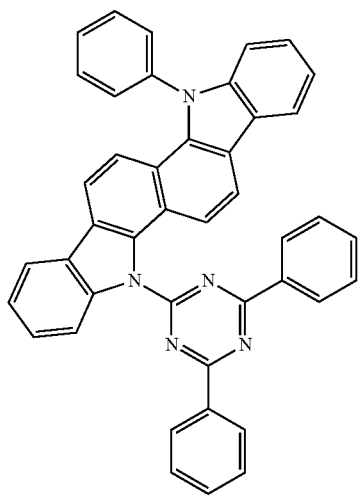
304
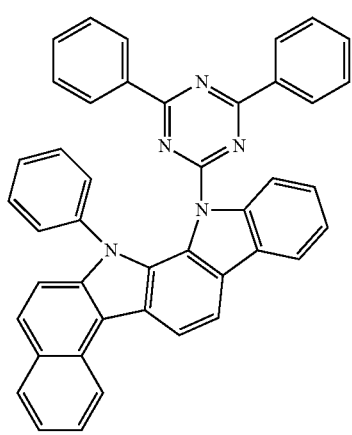
305
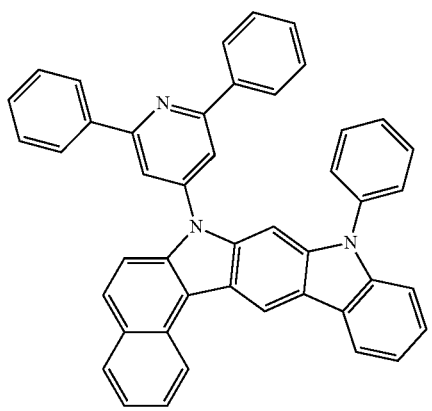
306
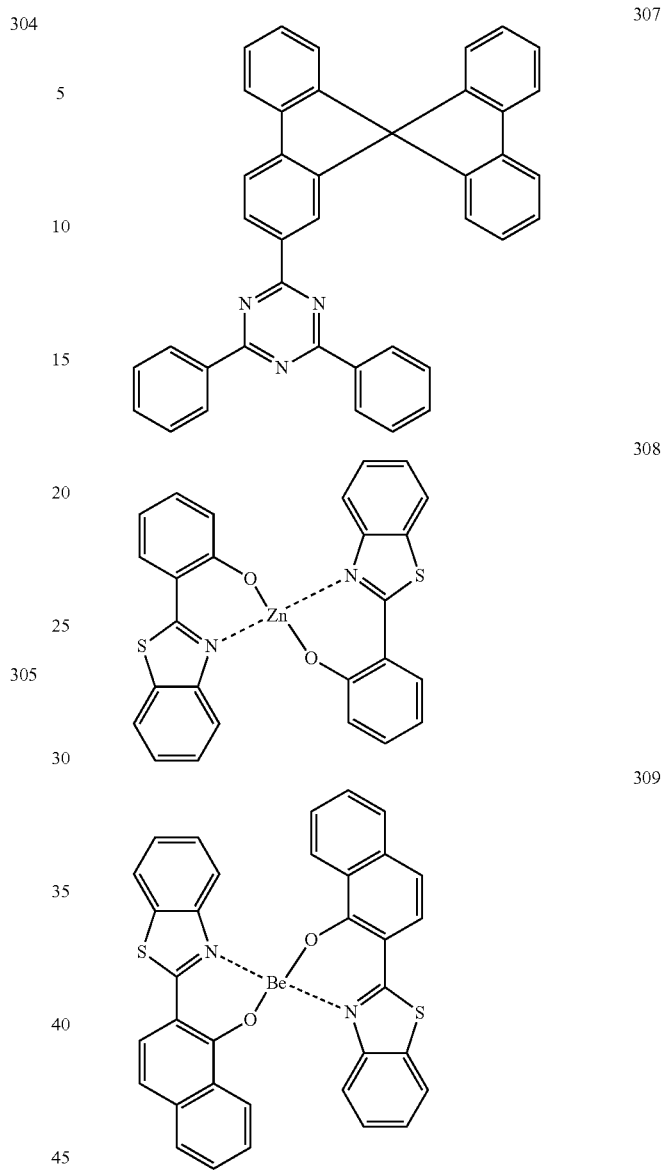
In some embodiments, an anthracene-based compound represented by Formula 400 below may be the host:
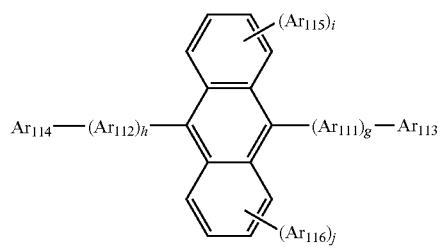
Formula 400
In Formula 400, $Ar_{111}$ and $Ar_{112}$ may be each independently a substituted or unsubstituted $C_6$-$C_{60}$ arylene group; $Ar_{113}$ to $Ar_{116}$ may be each independently a substituted or unsubstituted $C_1$-$C_{10}$ alkyl group or a substituted or unsubstituted $C_6$-$C_{60}$ aryl group; and g, h, i, and j may be each independently an integer from 0 to 4.

In some embodiments, $Ar_{111}$ and $Ar_{112}$ in Formula 400 may be each independently one of a phenylene group, a naphthylene group, a phenanthrenylene group, or a pyrenylene group; or a phenylene group, a naphthylene group, a phenanthrenylene group, a fluorenyl group, or a pyrenylene group, each substituted with at least one of a phenyl group, a naphthyl group, or an anthryl group.

In Formula 400, g, h, i, and j may be each independently an integer of 0, 1, or 2.

In Formula 400, $Ar_{113}$ to $Ar_{116}$ may be each independently one of a $C_1$-$C_{10}$ alkyl group substituted with at least one of a phenyl group, a naphthyl group, or an anthryl group;

a phenyl group, a naphthyl group, an anthryl group, a pyrenyl group, a phenanthrenyl group, or a fluorenyl group;

a phenyl group, a naphthyl group, an anthryl group, a pyrenyl group, a phenanthrenyl group, or a fluorenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, or a fluorenyl group; or

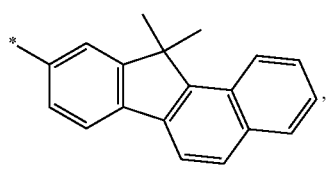 [SMILES: *c1ccc2c(c1)C(C)(C)c1c-2ccc2ccccc12]

but embodiments of the invention are not limited thereto.

In some embodiments, the anthracene-based compound of Formula 400 above may be one of the compounds represented by the following formulae, but is not limited thereto:

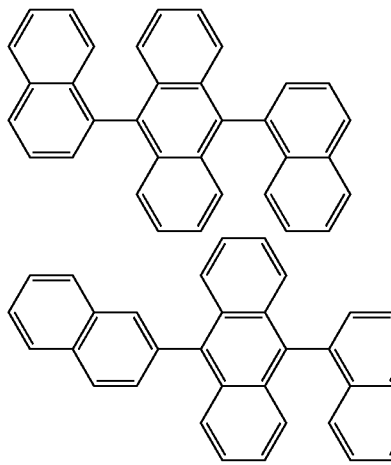

-continued

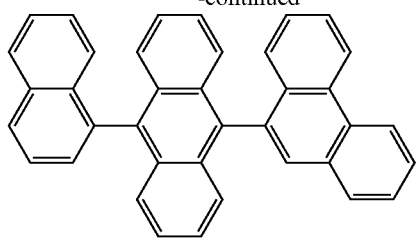

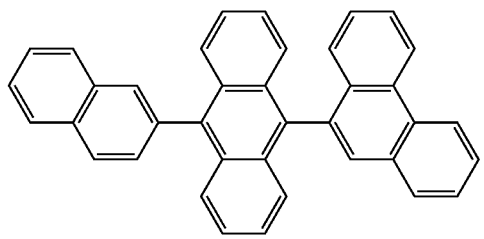

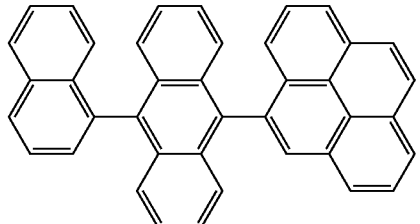

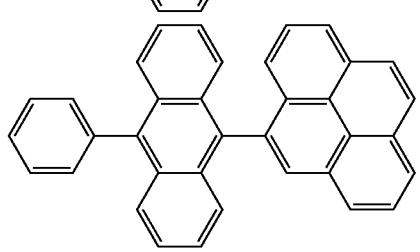

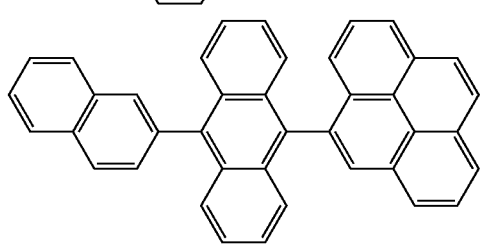

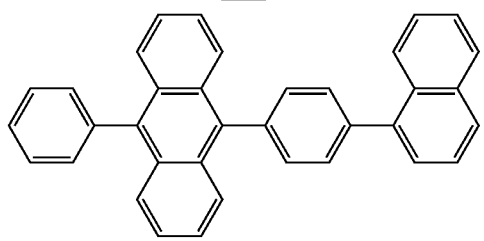

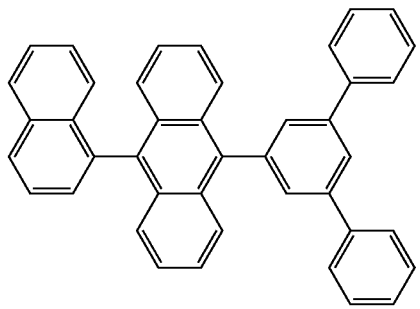

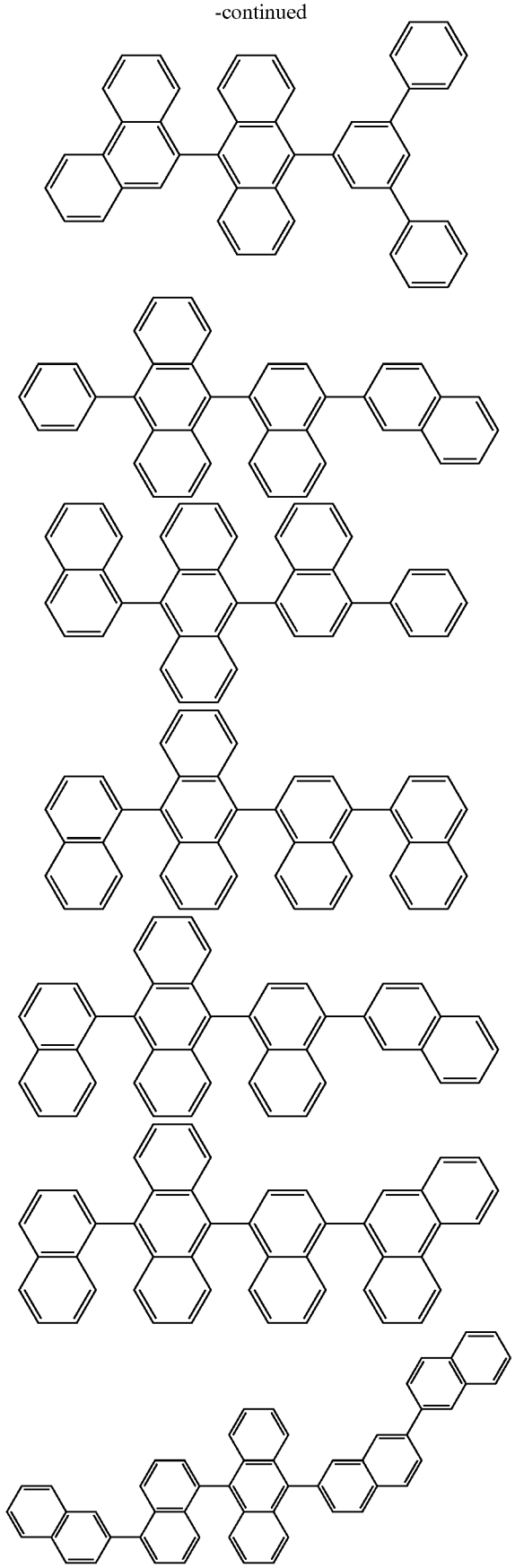
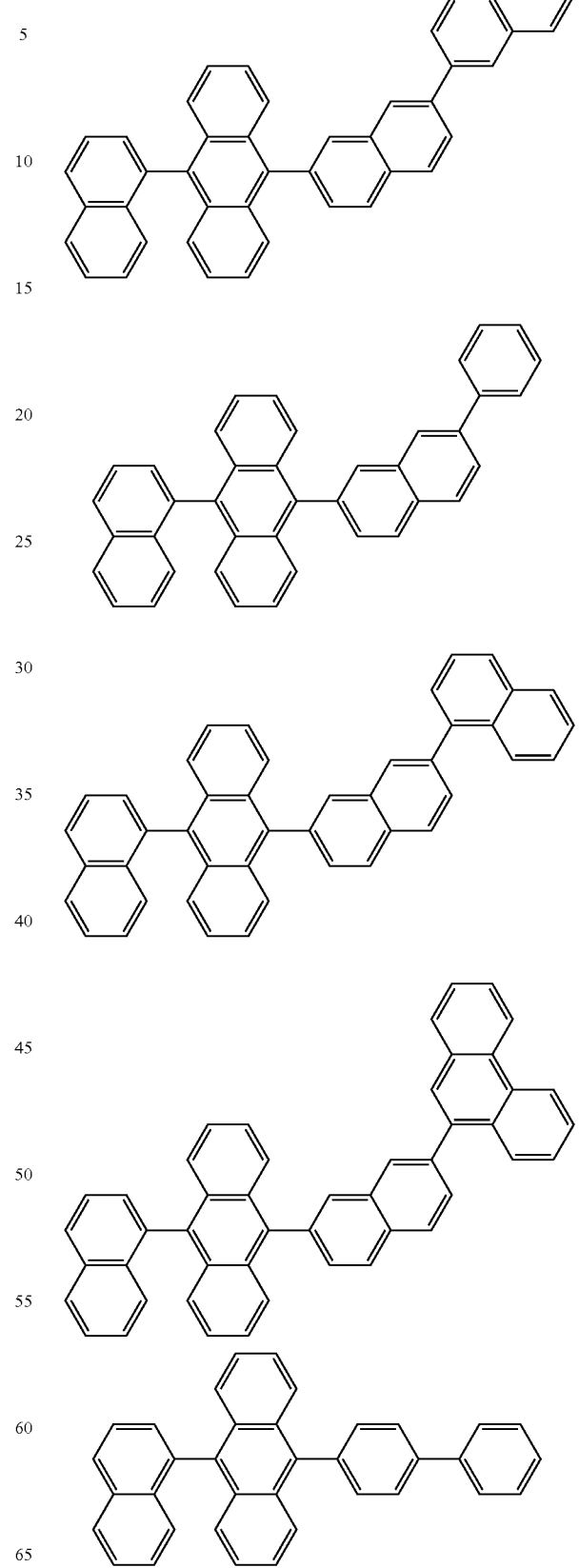

-continued
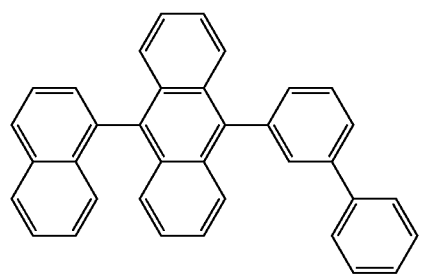
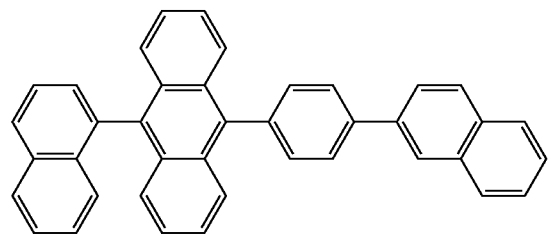
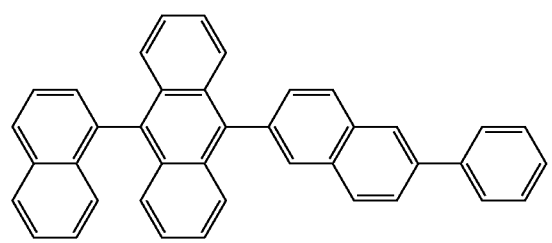
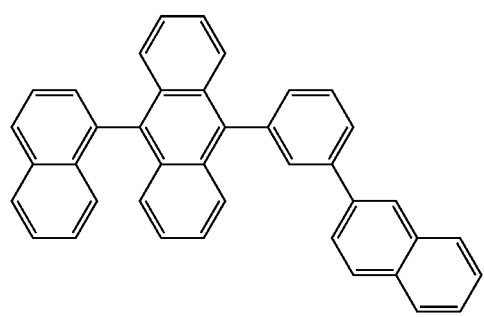
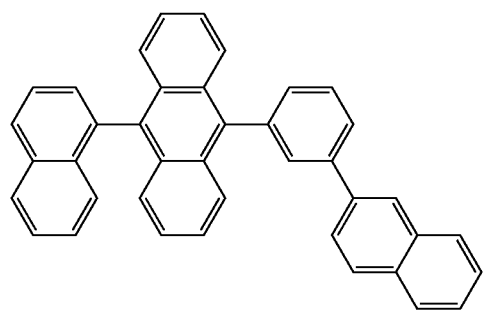
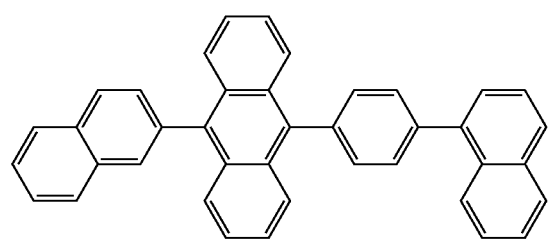
-continued
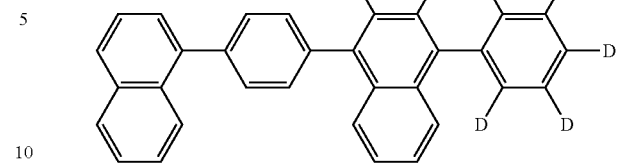
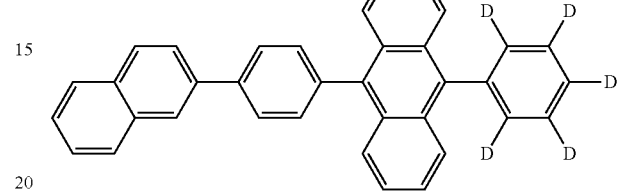
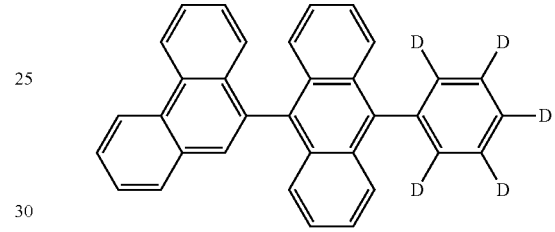
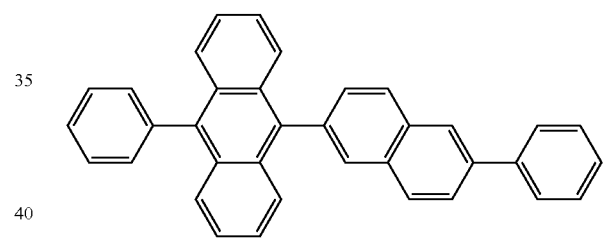
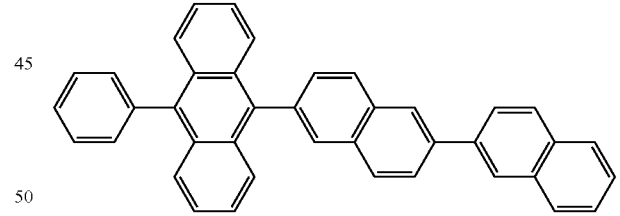
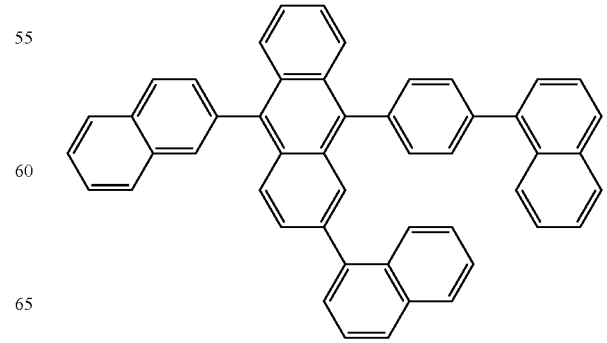

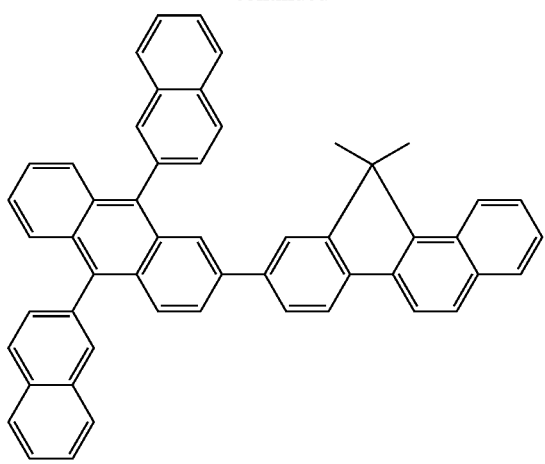

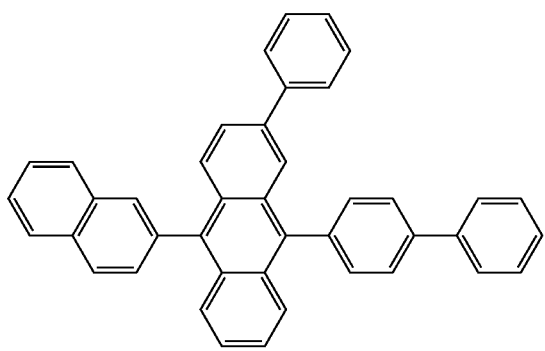

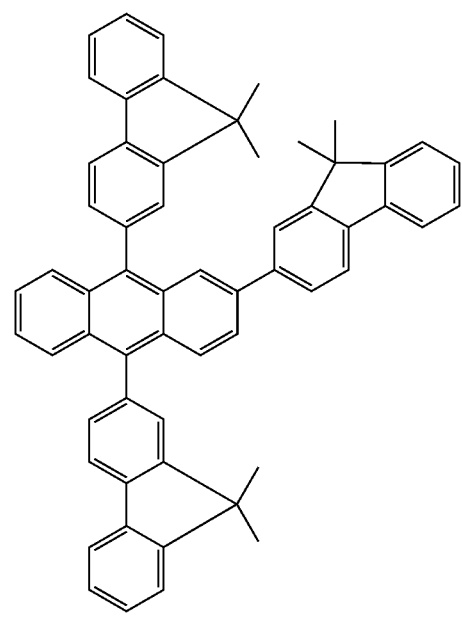

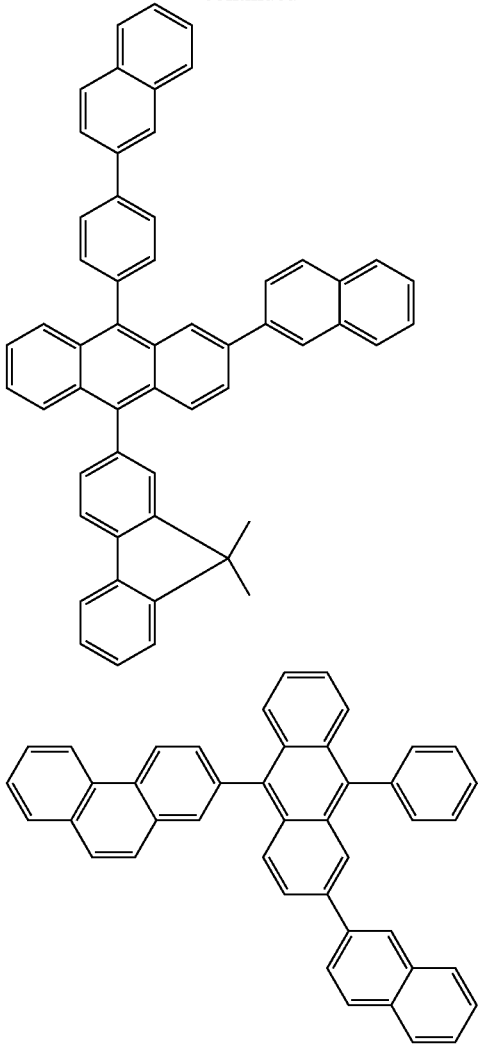

In some embodiments, an anthracene-based compound represented by Formula 401 below may be the host:

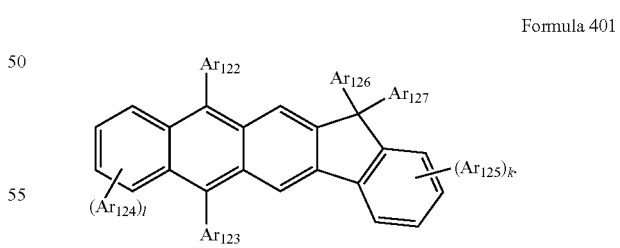

Formula 401

Detailed descriptions of $Ar_{122}$ to $Ar_{125}$ in Formula 401 may be as defined above in conjunction with $Ar_{113}$ of Formula 400.

$Ar_{126}$ and $Ar_{127}$ in Formula 401 may be each independently a $C_1$-$C_{10}$ alkyl group (e.g., a methyl group, an ethyl group, or a propyl group).

In Formula 401, k and l may be each independently an integer from 0 to 4, for example, 0, 1, or 2.

In some embodiments, the anthracene compound of Formula 401 above may be one of the compounds represented by the following formulae, but is not limited thereto:

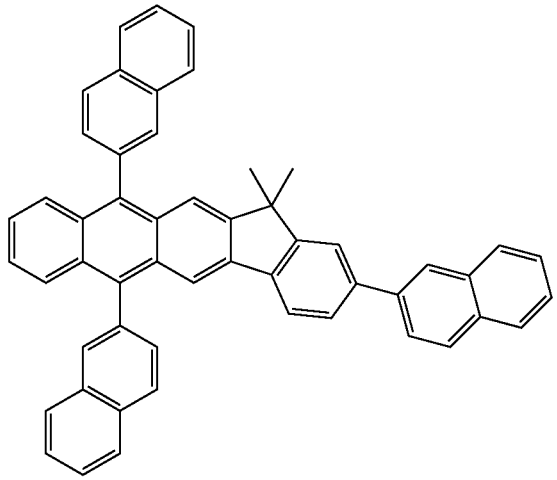

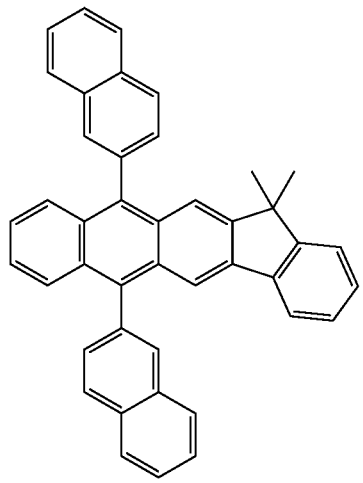

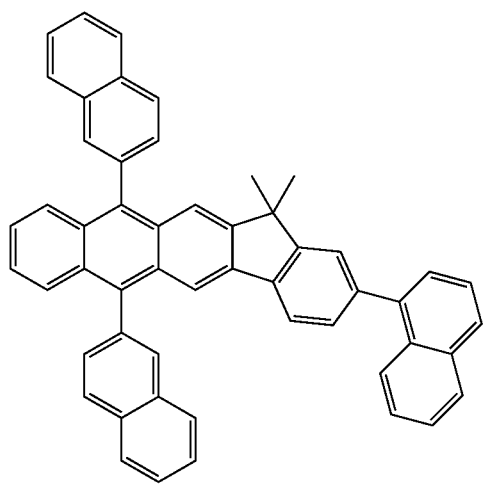

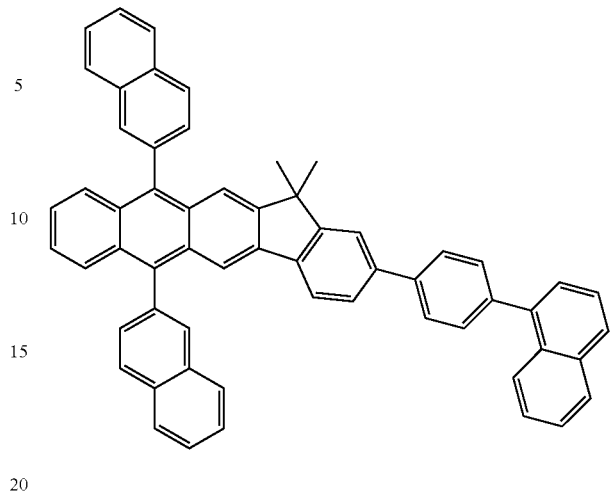

The dopant for emitting red light and green light may be any suitable dopant, for example, at least one of a fluorescent dopant and a phosphorescent dopant may be used. For example, the phosphorescent dopant may include, but is not limited to, an organometallic complex including at least one selected from the group consisting of iridium (Ir), platinum (Pt), osmium (Os), rhenium (Re), titanium (Ti), zirconium (Zr), hafnium (Hf), and a combination of at least two thereof.

Examples of the suitable red dopant include Pt(II) octaethylporphine (PtOEP), Pt(II) octaethylporphine, Ir(piq)$_3$ tris(2-phenylisoquinoline)iridium, bis(2-(2'-benzothienyl)-pyridinato-N,C3')iridium(acetylacetonate) (Btp$_2$Ir(acac)), 4-(dicyanomethylene)-2-methyl-6-[p-(dimethylamino)styryl]-4H-pyran (DCM), and 4-(dicyanomethylene)-2-tert-butyl-6-(1,1,7,7,-tetramethyljulolidyl-9-enyl)-4H-pyran (DCJTB), but are not limited thereto.

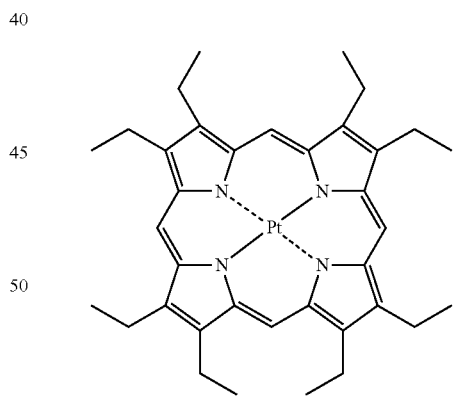
PtOEP

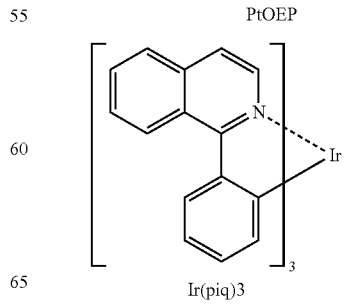
Ir(piq)3

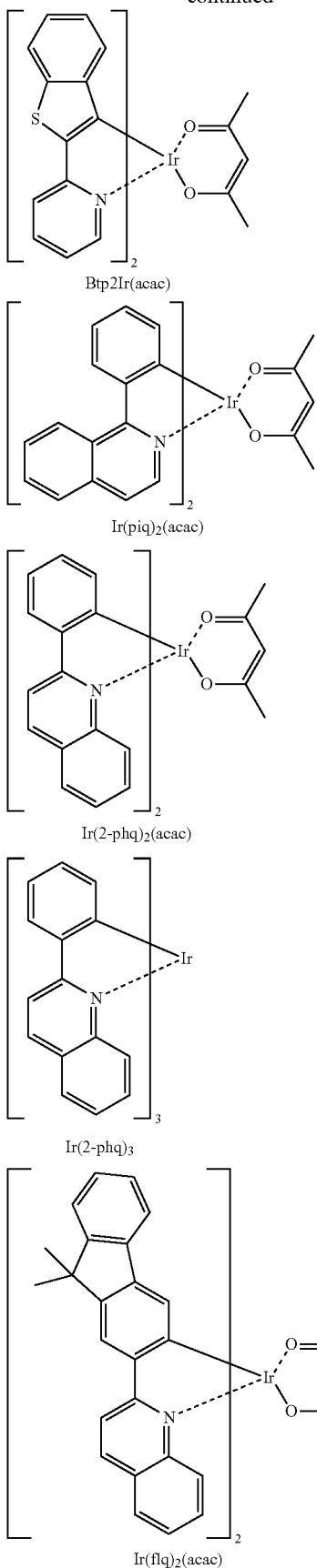
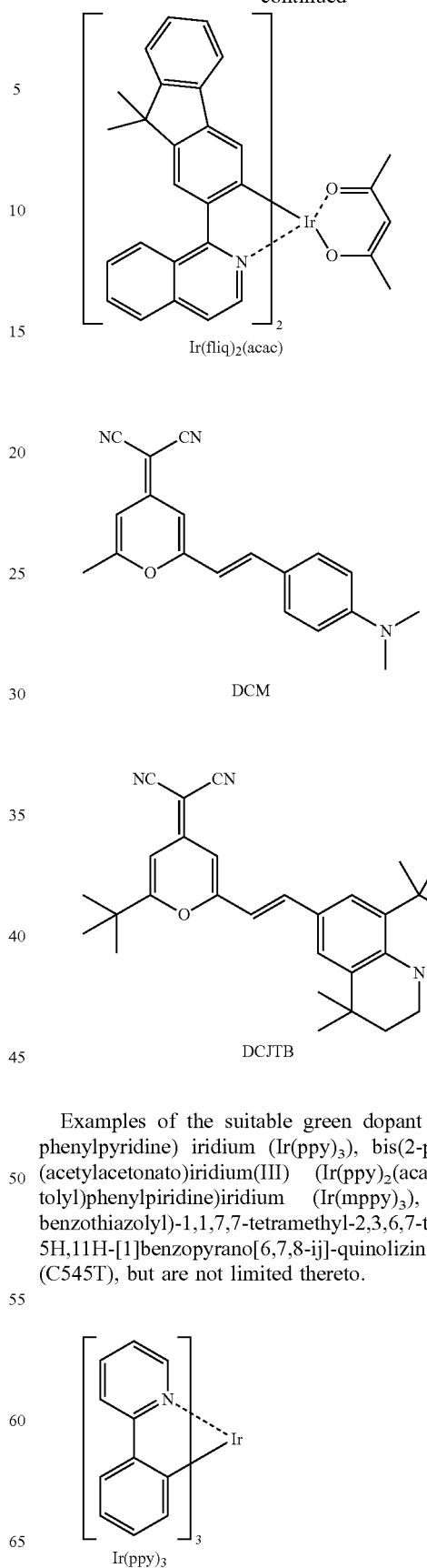
Examples of the suitable green dopant include tris(2-phenylpyridine) iridium (Ir(ppy)₃), bis(2-phenylpyridine) (acetylacetonato)iridium(III) (Ir(ppy)₂(acac)), tris(2-(4-tolyl)phenylpiridine)iridium (Ir(mppy)₃), and 10-(2-benzothiazolyl)-1,1,7,7-tetramethyl-2,3,6,7-tetrahydro-1H,5H,11H-[1]benzopyrano[6,7,8-ij]-quinolizin-11-one (C545T), but are not limited thereto.

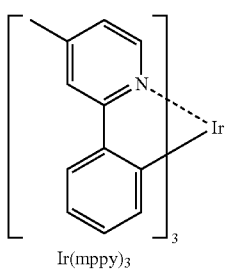
Ir(mppy)₃
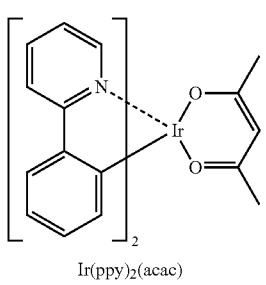
Ir(ppy)₂(acac)
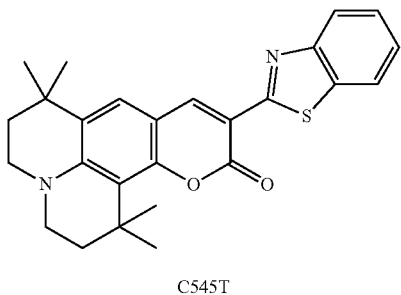
C545T
Non-limiting examples of the dopant in the EML may be Pt complexes represented by the following formulae:
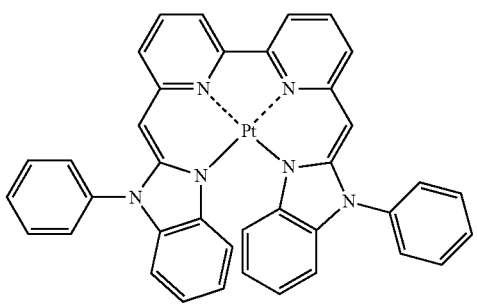
D3
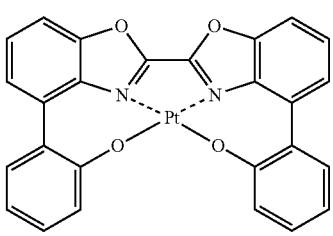
D4
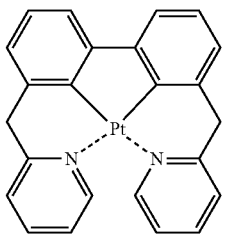
D5
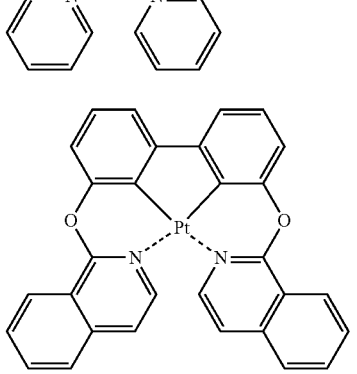
D6
D1
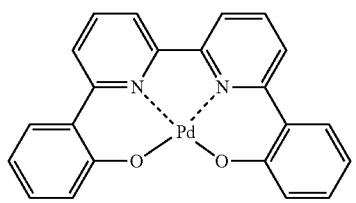
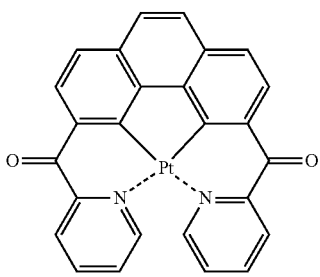
D7
D2
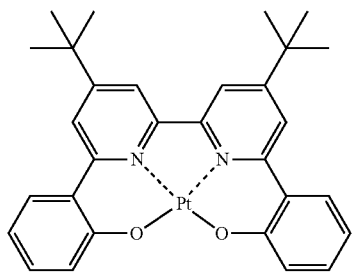
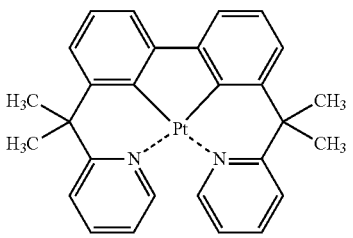
D8

D9 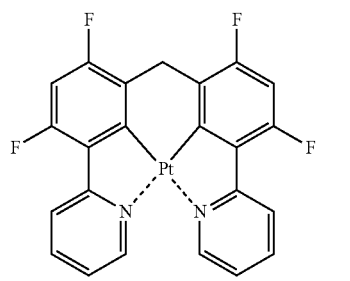
D10 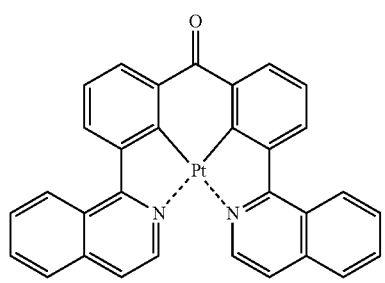
D11 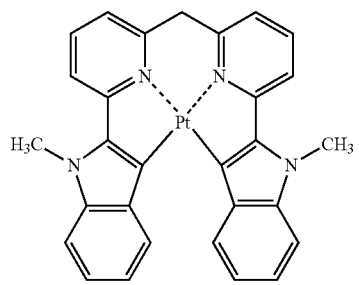
D12 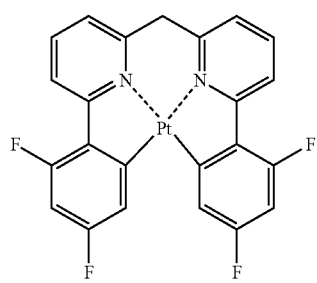
D13 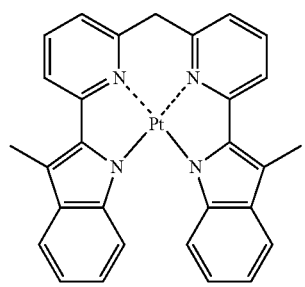
D14 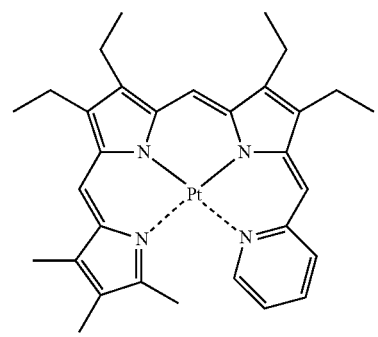
D15 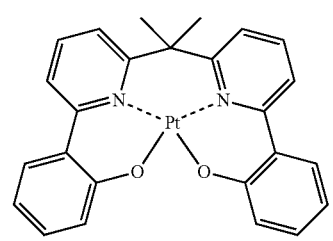
D16 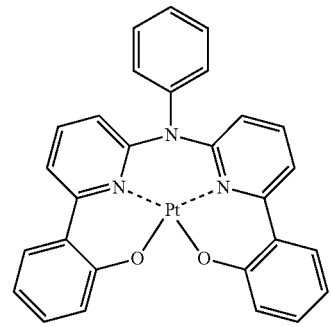
D17 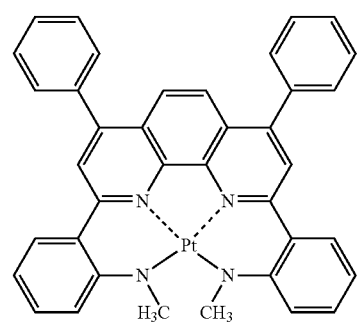
D18 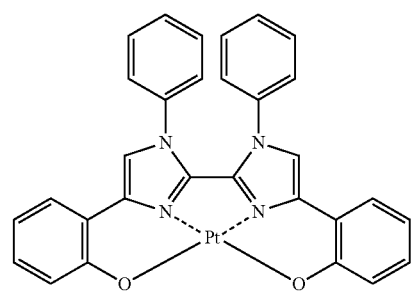

-continued
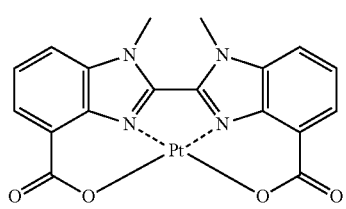
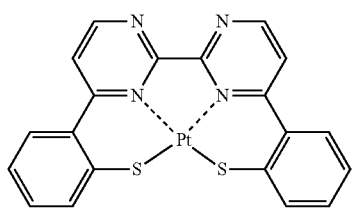
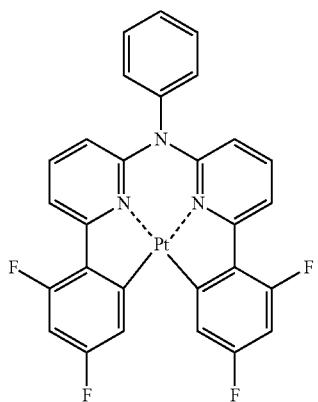
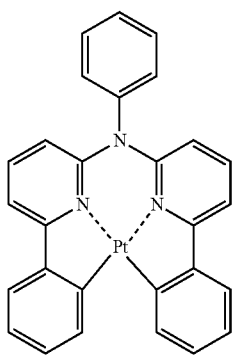
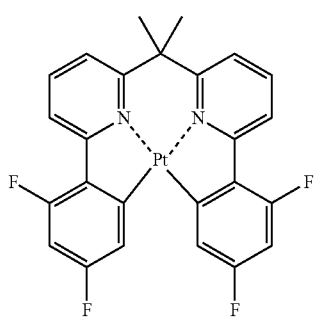
-continued
D19
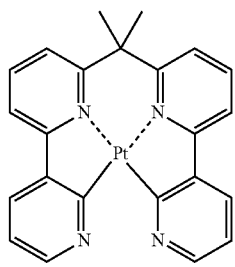
D20
D21
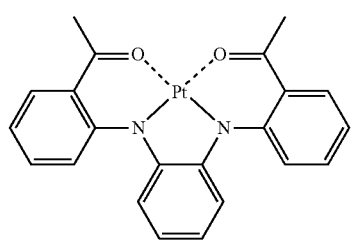
D22
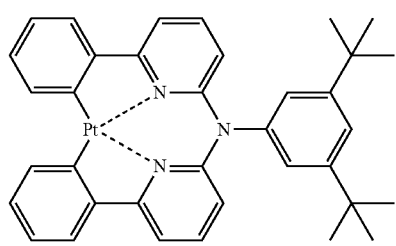
D23
D24
D25
D26
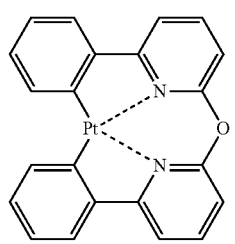
D27
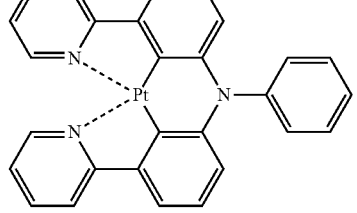
D28
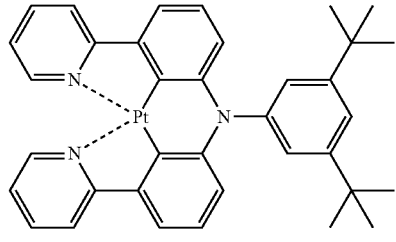
D29

-continued
D30
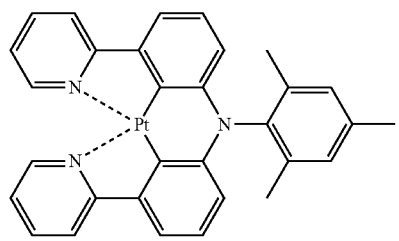
D31
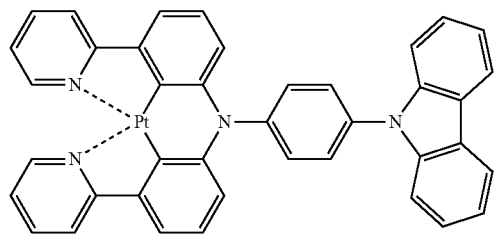
D32
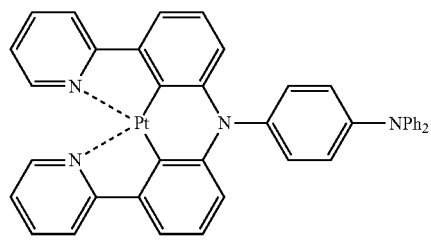
D33
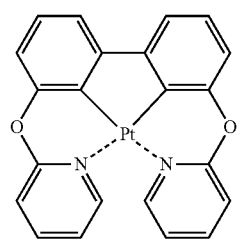
D34
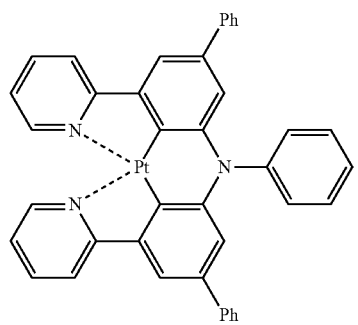
D35
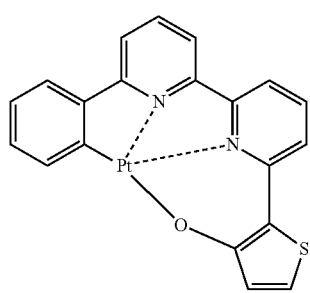
-continued
D36
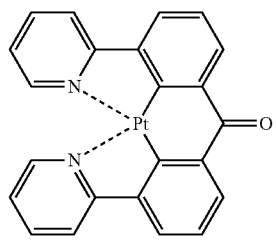
D37
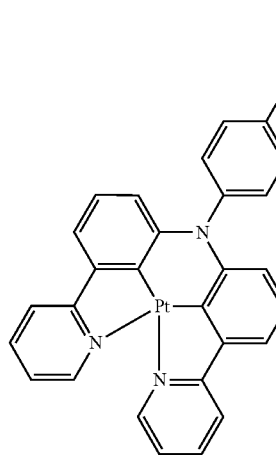
D38
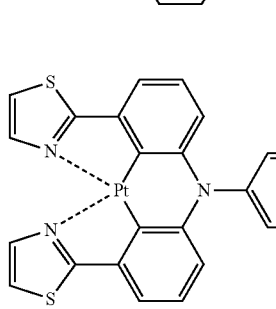
D39
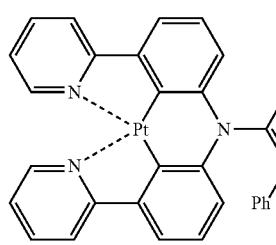
D40
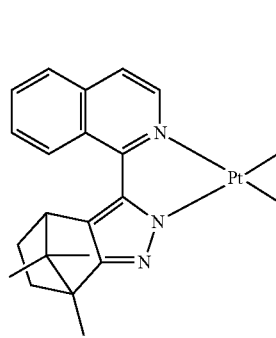

D41 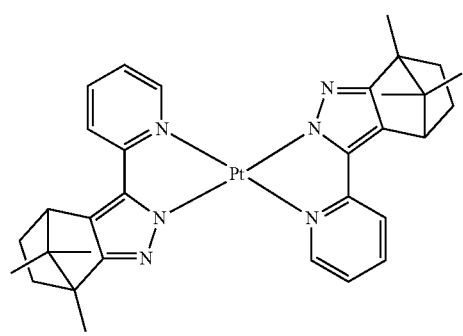
D42 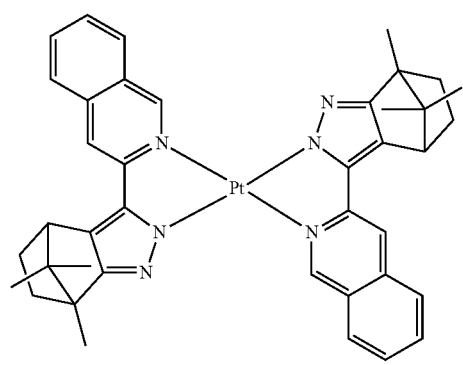
D43 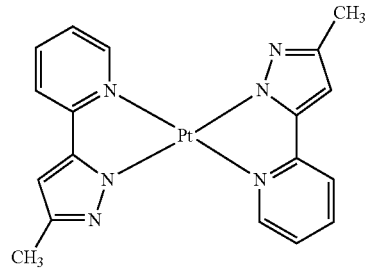
D44 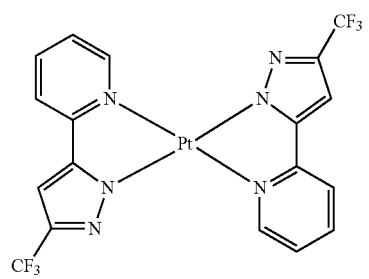
D45 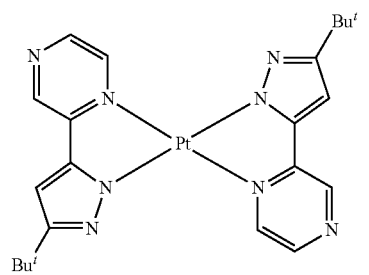
D46 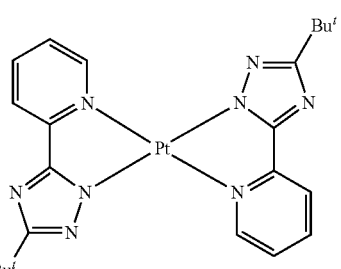
D47 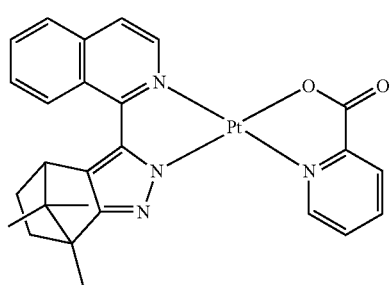
D48 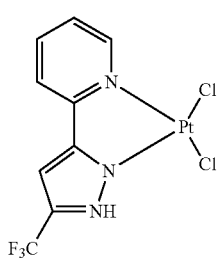
D49 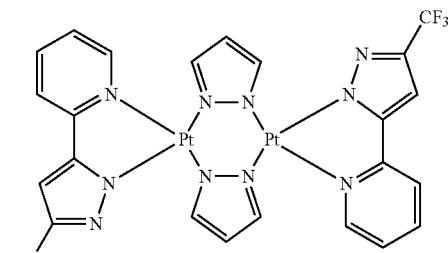
D50 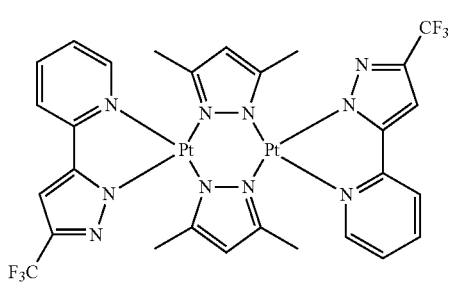

Non-limiting examples of the dopant in the EML may be Os complexes represented by the following formulae:

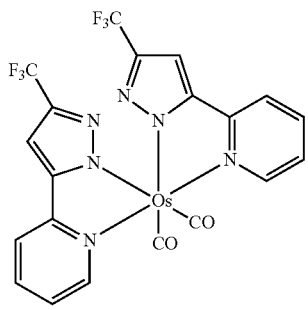

Os(fppz)₂(CO)₂

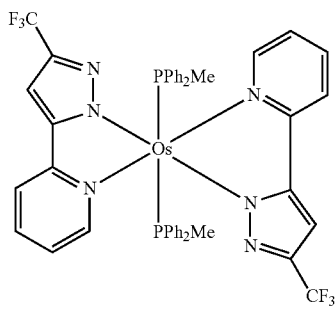

Os(fppz)₂(PPh₂Me)₂

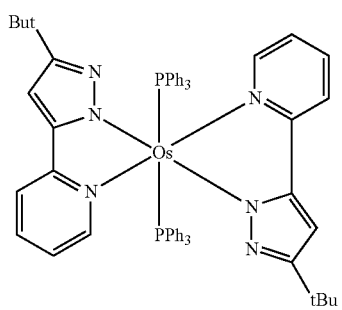

Os(bppz)₂(PPh₃)₂

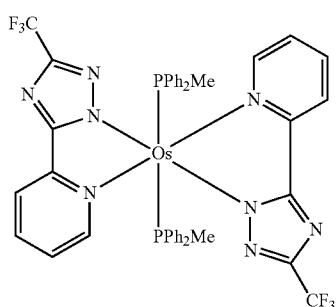

Os(fptz)₂(PPh₂Me)₂

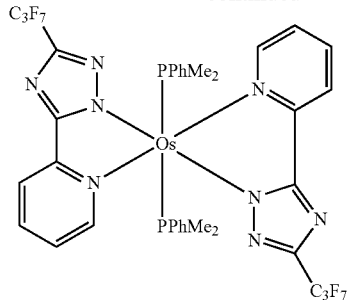

Os(hptz)₂(PPhMe₂)₂

When the EML includes both a host and a dopant, the amount of the dopant may be in a range of about 0.01 to about 15 parts by weight based on 100 parts by weight of the host. However, the amount of the dopant is not limited to this range.

A thickness of the EML may be in a range of about 100 Å to about 1,000 Å, and in some embodiments, may be in a range of about 200 Å to about 600 Å. When a thickness of the EML is within this range, satisfactory light-emitting properties may be obtained without a substantial increase in driving voltage.

To prevent diffusion of triplet excitons or holes into the ETL, a HBL may be formed between the HTL and the EML by using vacuum deposition, spin coating, casting, or Langmuir-Blodgett (LB) deposition. When the HBL is formed using vacuum deposition or spin coating, the conditions for deposition and coating may vary according to the material that is used to form the HBL, but the conditions for deposition and coating may be similar to those for the formation of the HIL. Any suitable hole-blocking material may be used. Non-limiting examples of the hole-blocking material are oxadiazole derivatives, triazole derivatives, and phenanthroline derivatives. For example, BCP may be used as a material for forming the HBL.

A thickness of the HBL may be in a range of about 50 Å to about 1,000 Å, and in some embodiments, in a range of about 100 Å to about 300 Å. When the thickness of the HBL is within this range, satisfactory hole blocking properties may be obtained without a substantial increase in driving voltage.

Then, an ETL may be formed on the HBL or EML by vacuum deposition, spin coating, casting, or the like. When the ETL is formed using vacuum deposition or spin coating, the deposition and coating conditions may vary according to the material that is used to form the ETL, but the deposition and coating conditions may be similar to those for the formation of the HIL. As a material for forming the ETL, the condensed cyclic compound of Formula 1 or any suitable material that may stably transport electrons injected from an electron injecting electrode (cathode) may be used.

Examples of the ETL materials are quinoline derivatives, such as tris(8-quinolinolate)aluminum (Alq₃), 2,9-dimethyl-4,7-diphenyl-1,10-phenanthroline (BCP), 4,7-diphenyl-1,10-phenanthroline, 4,7-diphenyl-1,10-phenanthroline) (Bphen) 3-(4-biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), BAlq (see the following formula), beryllium bis(benzoquinolin-10-olate) (Bebq₂), 9,10-di(naphthalene-2-yl)anthrascene (ADN), Compound 501, or Compound 502, but are not limited thereto.

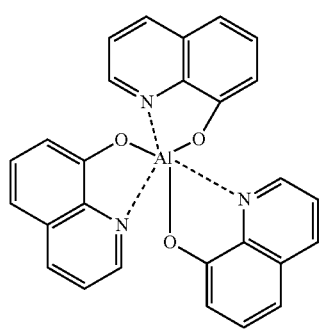
Alq3
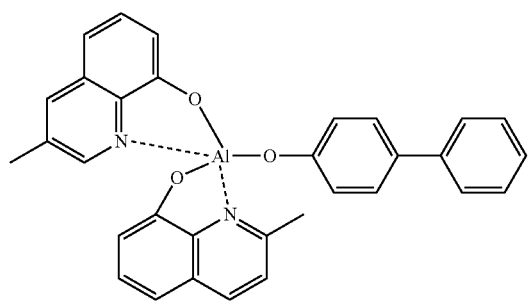
BAlq
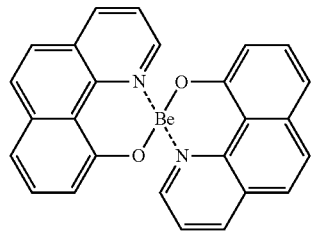
Bebq2
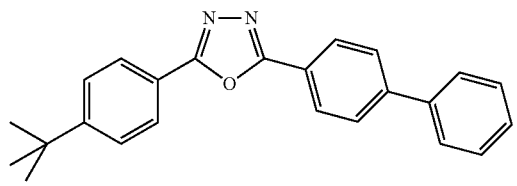
tBu-PBD
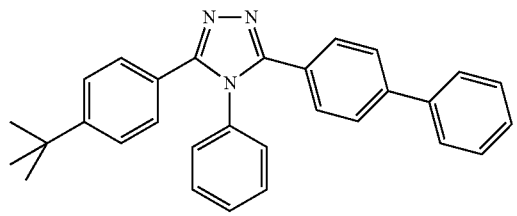
TAZ
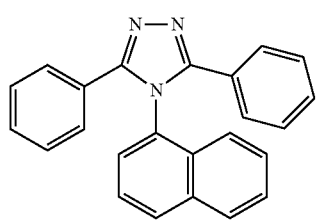
NTAZ
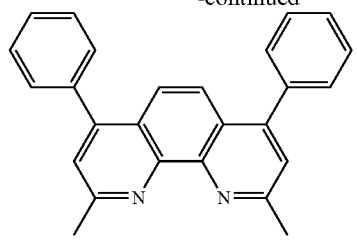
BCP
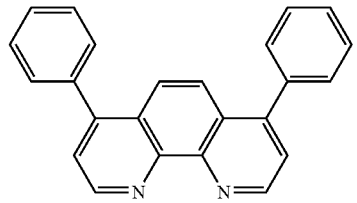
Bphen
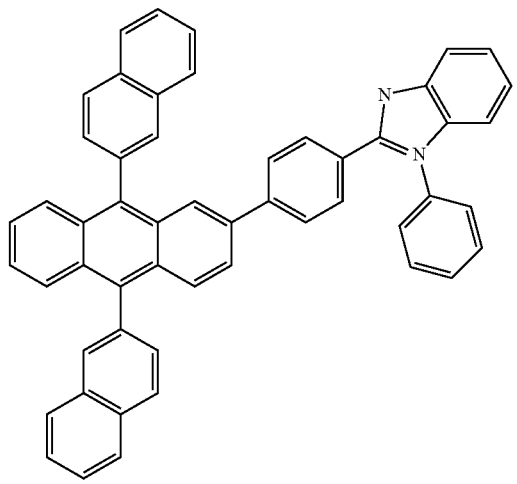
501
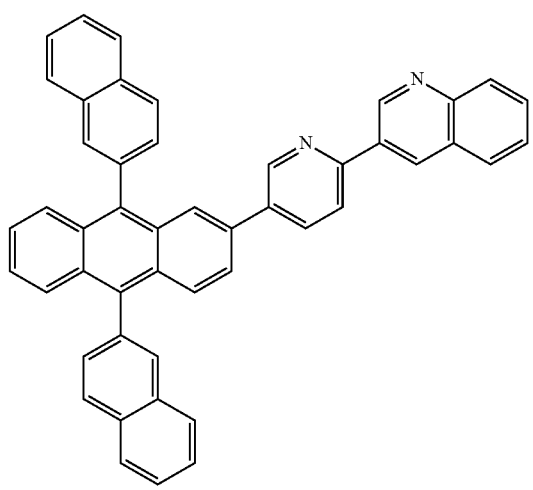
502
A thickness of the ETL may be in a range of about 100 Å to about 1,000 Å, and in some embodiments, may be in a range of about 150 Å to about 500 Å. When the thickness of the ETL is within this range, satisfactory electron transporting properties may be obtained without a substantial increase in driving voltage.

In some embodiments the ETL may include an electron-transporting organic compound and a metal-containing material. The metal-containing material may include a lithium (Li) complex. Non-limiting examples of the Li complex are lithium quinolate (LiQ) and Compound 503 below:

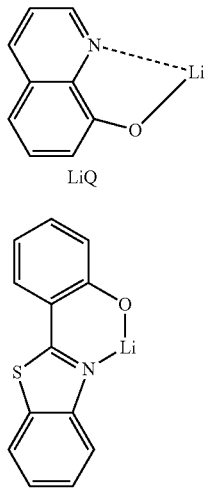

Compound 503

LiQ

503

Then, an EIL, which facilitates injection of electrons from the cathode, may be formed on the ETL. Any suitable electron-injecting material may be used to form the EIL.

Non-limiting examples of materials for forming the EIL are LiF, NaCl, CsF, $Li_2O$, and BaO, which are known in the art. The deposition and coating conditions for forming the EIL may be similar to those for the formation of the HIL, though the deposition and coating conditions may vary according to the material that is used to form the EIL.

A thickness of the EIL may be in a range of about 1 Å to about 100 Å, and in some embodiments, may be in a range of about 3 Å to about 90 Å. When the thickness of the EIL is within this range, satisfactory electron injection properties may be obtained without a substantial increase in driving voltage.

The second electrode 17 is disposed on the organic layer 15. The second electrode 17 may be a cathode that is an electron injection electrode. A material for forming the second electrode 17 may be a metal, an alloy, an electro-conductive compound, which all have a low work function, or a mixture thereof. In some embodiments, the second electrode 17 may be formed of lithium (Li), magnesium (Mg), aluminum (Al), aluminum-lithium (Al—Li), calcium (Ca), magnesium-indium (Mg—In), or magnesium-silver (Mg—Ag), and may be formed as a thin film type transmission electrode. In some embodiments, to manufacture a top-emission light-emitting diode, the transmission electrode may be formed of indium tin oxide (ITO) or indium zinc oxide (IZO).

Hereinafter, the present invention will be described in detail with reference to the following synthesis examples and other examples. However, these examples are for illustrative purposes only and are not intended to limit the scope of the present invention.

Synthesis Example 1

Synthesis of Compound 1

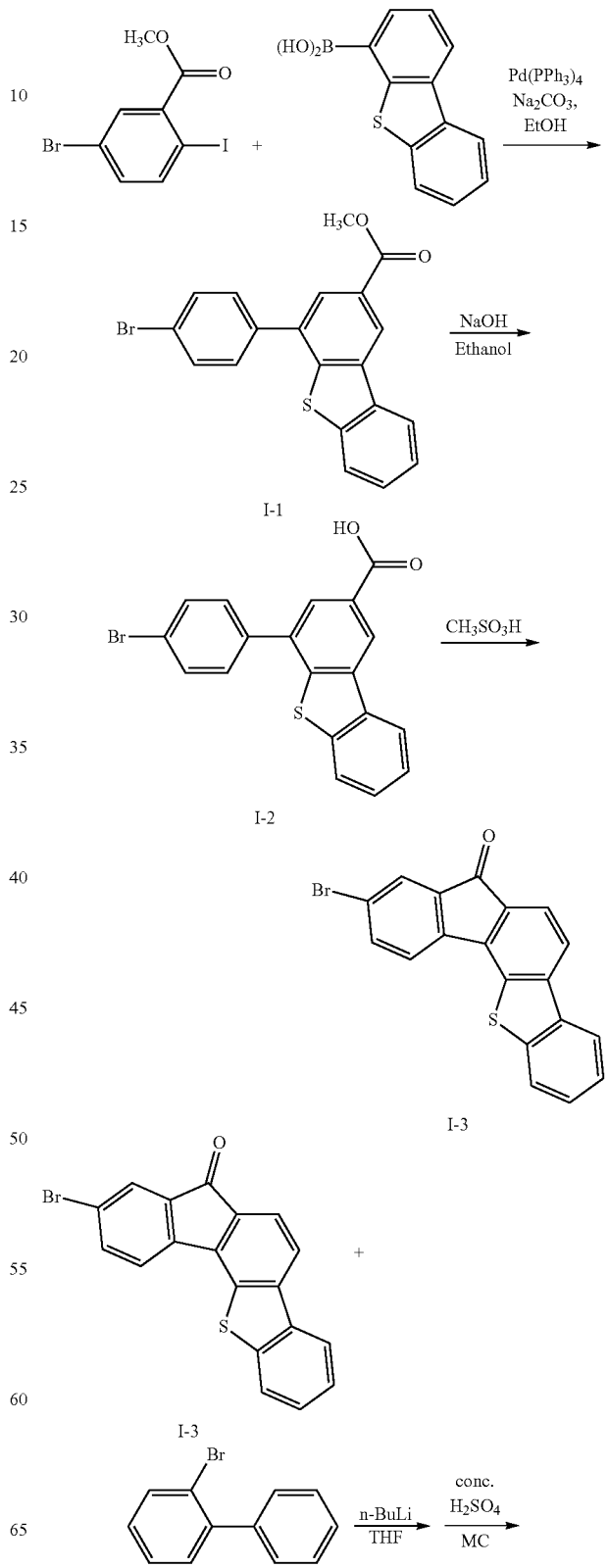

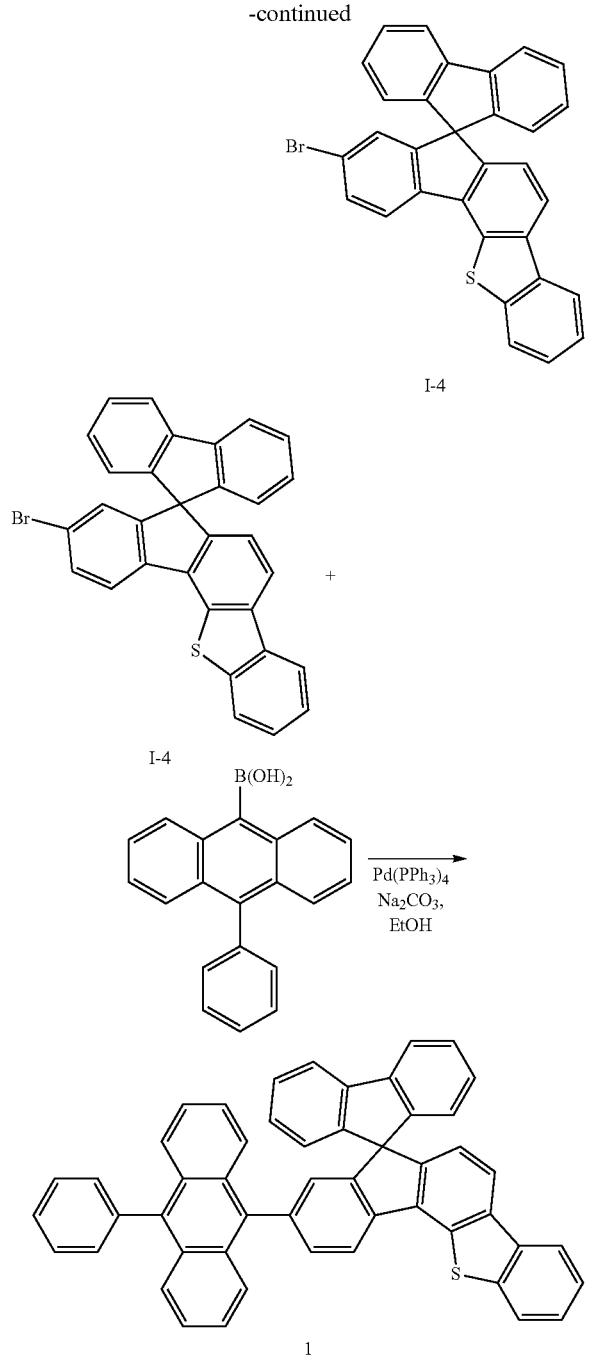

Synthesis of Intermediate I-1

3 g (1 eq, 8.80 mmol) of methyl 5-bromo-2-iodobenzoate, 2.21 g (1.1 eq, 9.68 mmol) of dibenzo[b,d]thiophen-4-yl boronic acid, and 410 mg (0.04 eq, 0.35 mmol) of tetrakis(triphenylphosphine)palladium(0) (Pd(PPh$_3$)$_4$) were put into a reaction chamber, vacuum-dried, and the chamber was filled with nitrogen gas. 70 ml of toluene was added into the reaction chamber to dissolve the compounds, and then 30 ml of ethanol and 13 ml (3 eq, 26.4 mmol) of 2.0M Na$_2$CO$_3$ aqueous solution were added thereto, and stirred while refluxing at a temperature of 120° C. for 3 hours. After the reaction was completed, the resultant was washed with distilled water, and an organic layer was extracted using ethyl acetate. The extracted organic layer was dried using magnesium sulfate and filtered, and then the solvent was evaporated. Then, the residue was separated and purified through column chromatography to obtain 3.5 g (yield: 75%) of Intermediate I-1, methyl 5-bromo-2-(dibenzo[b,d]thiophen-4-yl)benzoate.

$^1$H-NMR: 8.18 (m, 3H), 7.76 (t, 2H), 7.53 (t, 1H), 7.45 (m, 2H), 7.38 (d, 1H), 7.27 (d, 1H), 3.55 (s, 3H)

APCI-MS (m/z): 397[M$^+$]

Synthesis of Intermediate I-2

3.5 g (1 eq, 8.81 mmol) of Intermediate I-1 was put into a reaction chamber, and then 50 ml of ethylalcohol and 1.06 g (3 eq, 26.43 mmol) of NaOH were added thereto. The mixture was stirred while refluxing at a temperature of 90° C. for 3 hours. Then, concentrated HCl was slowly and dropwisely added to the mixture. After the reaction was completed, the resultant was extracted using ethylether and dried to obtain 3 g (yield: 89%) of Intermediate I-2, 5-bromo-2-(dibenzo[b,d]thiophen-4-yl)benzoic acid.

$^1$H-NMR: 8.17 (m, 3H), 7.76 (d, 2H), 7.47 (m, 3H), 7.36 (d, 1H), 7.22 (d, 1H)

APCI-MS (m/z): 383[M$^+$]

Synthesis of Intermediate I-3

3 g (1 eq, 7.82 mmol) of Intermediate I-2 was put into a reaction chamber, and 100 ml of methanesulfonic acid (CH$_3$SO$_3$H) was added thereto, and the mixture was stirred at a temperature of 30° C. for 6 hours. After the reaction was completed, the reaction solution was poured into a beaker having ice therein, and filtered the mixture to obtain a solid product. The solid product was washed with a sodium bicarbonate solution (NaHCO$_3$) and stirred, and then filtered to obtain 2.6 g (yield: 90%) of Intermediate I-3,9-bromo-7H-benzo[b]fluoreno[3,4-d]thiophen-7-one.

$^1$H-NMR: 8.20 (d, 1H), 8.16 (d, 1H), 7.94 (d, 1H), 7.80 (s, 1H), 7.79 (d, 1H), 7.70 (d, 1H), 7.58 (m, 3H)

APCI-MS (m/z): 365[M$^+$]

Synthesis of Intermediate I-4

1.74 g (1.05 eq, 7.47 mmol) of 2-bromophenyl was put into a reaction chamber, and 150 ml of THF was added thereto to dissolve 2-bromophenyl. 4.67 ml (1.05 eq, 7.47 mmol) of 1.6 M n-BuLi was slowly and dropwisely added to the mixture at a temperature of −78° C. After 30 minutes of stirring, 2.6 g (1 eq, 7.11 mmol) was added to Intermediate I-3. The mixture was stirred for 5 hours at room temperature. After the reaction was completed, the resultant was washed with distilled water, and an organic layer was extracted using ethyl acetate, dried, and dissolved by using methylmagnesium chloride (MC). Then, sulfuric acid (H$_2$SO$_4$) was slowly and dropwisely added thereto. The reaction solution was extracted with dichloromethane, and then the extract was separated and purified through column chromatography to obtain 2.1 g (yield: 60%) of Intermediate I-4, 9-bromospiro[benzo[b]fluoreno[3,4-d]thiophene-7,9'-fluorene.

$^1$H-NMR: 8.16 (d, 1H), 7.90 (m, 5H), 7.64 (d, 1H), 7.51 (m, 2H), 7.42 (t, 2H), 7.12 (t, 2H), 6.94 (s, 1H), 6.84 (d, 1H), 6.78 (d, 2H)

APCI-MS (m/z): 501[M$^+$]

Synthesis of Compound 1

2.1 g (1 eq, 4.19 mmol) of Intermediate I-4, 1.59 g (1.03 eq, 4.34 mmol) of 9-phenylanthracen-10-ylboronic acid, and 200 mg (0.04 eq, 0.17 mmol) Pd(PPh$_3$)$_4$ were put into a reaction chamber, vacuum-dried, and the chamber was filled with nitrogen gas. 60 ml of toluene was added into the reaction chamber to dissolve the compounds, and then 30 ml of ethanol and 6.4 ml (3 eq, 12.57 mmol) of 2.0M Na$_2$CO$_3$ aqueous solution were added thereto, and stirred while refluxing at a temperature of 120 t for 3 hours. After the reaction was completed, the resultant was washed with distilled water, and an organic layer was extracted using ethyl acetate. The extracted organic layer was dried using magnesium sulfate and filtered using celite, and then the resultant was separated and purified through column chromatography to obtain 1.72 g (yield: 61%) of Compound 1, 9-(10-phenylanthracen-9-yl)spiro[benzo[d]fluoreno[4,3-b]thiophene-7,9-fluorene].

$^1$H-NMR: 8.31 (d, 1H), 8.20 (d, 1H), 8.05 (m, 2H), 7.77 (d, 2H), 7.65 (t, 4H), 7.60 (m, 3H), 7.53 (m, 3H), 7.46 (t, 2H), 7.33 (t, 4H), 7.27 (d, 2H), 7.15 (t, 2H), 6.95 (m, 4H)

APCI-MS (m/z): 675[M$^+$]

Synthesis Example 2

Synthesis of Compound 10

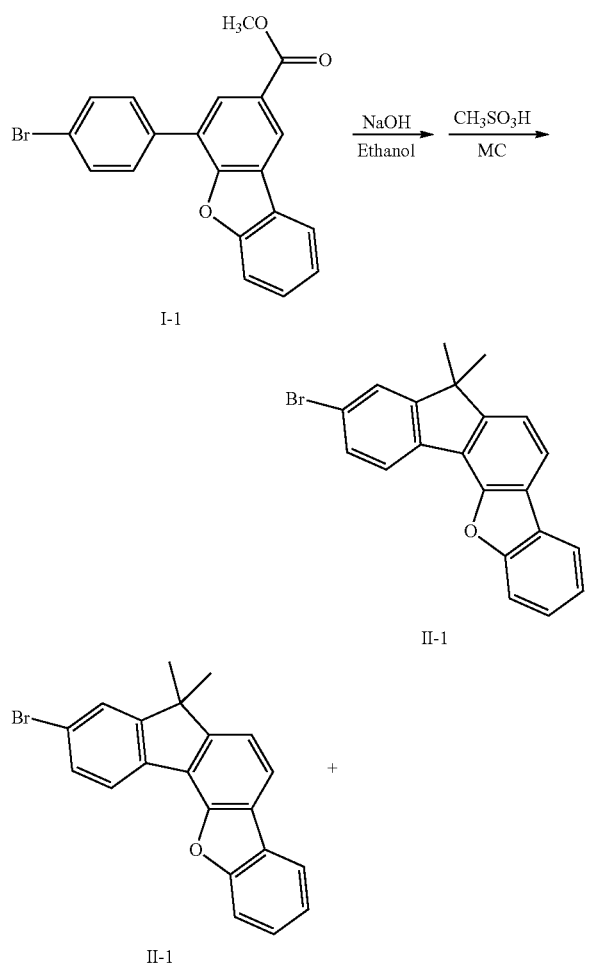

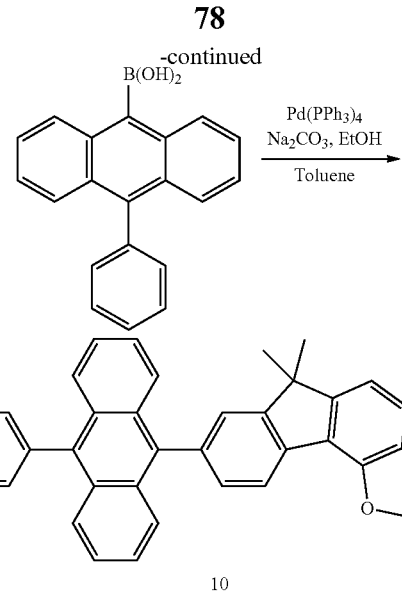

Synthesis of Intermediate II-1

6 g (1 eq, 15.1 mmol) of Intermediate I-1 was put into a reaction chamber, vacuum-dried, and the chamber was filled with nitrogen gas. 120 ml of THF was added to the reaction chamber, and 12.5 ml (2.5 eq, 37.7 mmol) of 3.0 M methylmagnesium chloride (MC) was slowly and dropwisely added thereto. The reaction solution was extracted with ethyl acetate, and then the resultant was added into the reaction chamber, dissolved with MC, and MeSO$_3$H was slowly and dropwisely added thereto. After the reaction was completed, the resultant was extracted with dichloromethane, and separated and purified through column chromatography to obtain 4 g (yield: 70%) of Intermediate II-1,9-bromo-7,7-dimethyl-7H-benzo[b]fluoreno[3,4-d]thiophene.

$^1$H-NMR: 8.22 (d, 1H), 8.19 (d, 1H), 7.96 (d, 1H), 7.82 (d, 1H), 7.64 (t, 2H), 7.56 (d, 1H), 7.51 (m, 2H), 1.57 (s, 6H)

APCI-MS (m/z): 379[M$^+$]

Synthesis of Compound 10

4 g (1 eq, 10.5 mmol) of Intermediate II-1, 3.23 g (1.03 eq, 10.86 mmol) of 9-phenylanthracen-10-yl boronic acid, and 485 mg (0.04 eq, 0.42 mmol) of Pd(PPh$_3$)$_4$ were put into a reaction chamber, vacuum-dried, and the chamber was filled with nitrogen gas. 80 ml of toluene was added to the reaction chamber to dissolve the compounds, and then 40 ml of ethanol and 16 ml (3 eq, 31.5 mmol) of 2.0M Na$_2$CO$_3$ aqueous solution were added thereto, and stirred while refluxing at a temperature of 120° C. for 3 hours. After the reaction was completed, the resultant was washed with distilled water, and an organic layer was extracted using ethyl acetate. The extracted organic layer was dried using magnesium sulfate and filtered using celite, and then separated and purified through column chromatography to obtain 4 g (yield: 70%) of Compound 10, 7,7-dimethyl-9-(10-phenylanthracen-9-yl)-7H-benzo[d]fluoreno[4,3-b]thiophene.

$^1$H-NMR: 8.28 (d, 1H), 8.22 (t, 2H), 8.01 (d, 1H), 7.82 (d, 2H), 7.74 (t, 2H), 7.60 (m, 10H), 7.36 (m, 4H), 1.64 (s, 6H)

APCI-MS (m/z): 553[M$^+$]

Synthesis Example 3

Synthesis of Compound 22

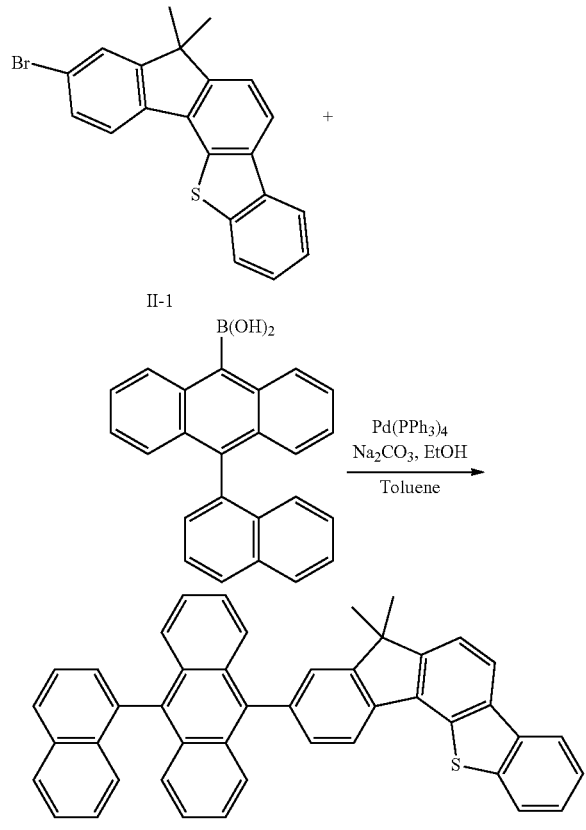

Synthesis of Compound 22

4 g (1 eq, 10.5 mmol) of Intermediate II-1, 3.85 g of 10-(naphthalen-1-yl)anthracen-9-ylboronic acid, and 485 mg (0.04 eq, 0.42 mmol) of Pd(PPh$_3$)$_4$ were put into a reaction chamber, vacuum-dried, and the chamber was filled with nitrogen gas. 80 ml of toluene was added to the reaction chamber to dissolve the compounds, and then 40 ml of ethanol and 16 ml (3 eq, 31.6 mmol) of 2.0M Na$_2$CO$_3$ aqueous solution were added thereto, and stirred while refluxing at a temperature of 120° C. for 3 hours. After the reaction was completed, the resultant was washed with distilled water, and an organic layer was extracted using ethyl acetate. The extracted organic layer was dried using magnesium sulfate and filtered using celite, and then separated and purified through column chromatography to obtain 4.4 g (yield: 70%) of Compound 22, 7,7-dimethyl-9-(10-(naphthalen-1-yl)anthracen-9-yl)-7H-benzo[d]fluoreno[4,3-b]thiophene.

$^1$H-NMR: 8.25 (m, 3H), 8.08 (m, 3H), 7.95 (d, 1H), 7.88 (d, 2H), 7.76 (t, 3H), 7.67 (t, 2H), 7.60 (t, 2H), 7.50 (m, 6H), 7.36 (m 2H), 1.70 (s, 6H)

APCI-MS (m/z): 603[M$^+$]

Synthesis Example 4

Synthesis of Compound 30

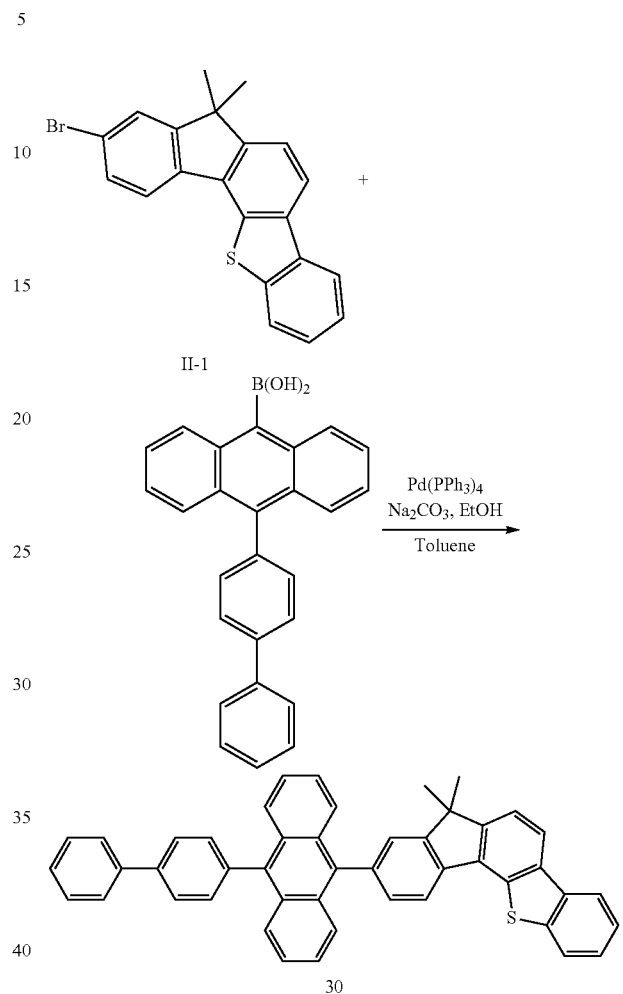

Synthesis of Compound 30

4 g (1 eq, 10.5 mmol) of Intermediate II-1, 4.12 g (1.05 eq, 11.07 mmol) of 10-(biphenyl-4-yl)anthracen-9-ylboronic acid, and 485 mg (0.04 eq, 0.42 mmol) of Pd(PPh$_3$)$_4$ were put into a reaction chamber, vacuum-dried, and the chamber was filled with nitrogen gas. 80 ml of toluene was added to the reaction chamber to dissolve the compounds, and then 40 ml of ethanol and 16 ml (3 eq, 31.6 mmol) of 2.0 M Na$_2$CO$_3$ aqueous solution were added thereto, and stirred while refluxing at a temperature of 120° C. for 3 hours. After the reaction was completed, the resultant was washed with distilled water, and an organic layer was extracted using ethyl acetate. The extracted organic layer was dried using magnesium sulfate and filtered using celite, and then separated and purified through column chromatography to obtain 4.32 g (yield: 65%) of Compound 30, 9-(10-(biphenyl-4-yl)anthracen-9-yl)-7,7-dimethyl-7H-benzo[d]fluoreno[4,3-b]thiophene.

$^1$H-NMR: 8.25 (m, 3H), 8.01 (d, 1H), 7.847 (m, 9H), 7.60 (m, 9H), 7.40 (m, 4H), 1.61 (s, 5H), 1.53 (s, 1H)

APCI-MS (m/z): 629[M$^+$]

Example 1

A 15 Ω/cm² (1200 Å) ITO glass substrate (available from Corning Co.) was cut into a size of 50 mm×50 mm×0.7 mm, ultrasonically washed with isopropyl alcohol for 5 minutes and then with pure water for 5 minutes, and washed again with UV ozone for 30 minutes. 2-TNATA was vacuum-deposited on the ITO glass substrate to form an HIL having a thickness of 600 Å, and then 4,4'-bis[N-(1-naphthyl)-N-phenylamino]biphenyl (NPB) was vacuum-deposited on the HIL to form a HTL having a thickness of 300 Å. Compound 1 was used as a blue fluorescent host, and Compound 62 was used as a blue fluorescent dopant to be co-deposited on the HTL at a weight ratio of 95:5. Compound 501 was vacuum-deposited on the EML to form an ETL having a thickness of 300 Å. LiF was vacuum-deposited on the ETL to form an EIL having a thickness of 10 Å. Then, Al was vacuum-deposited on the EIL to form a cathode having a thickness of 3,000 Å, thereby completing the manufacture of an organic light-emitting device.

Example 2

An OLED was manufactured in the same manner as in Example 1, except that Compound 10, instead of Compound 1, was used as a host of the EML.

Example 3

An OLED was manufactured in the same manner as in Example 1, except that Compound 22, instead of Compound 1, was used as a host of the EML.

Example 4

An OLED was manufactured in the same manner as in Example 1, except that Compound 30, instead of Compound 1, was used as a host of the EML.

Comparative Example 1

An OLED was manufactured in the same manner as in Example 1, except that Compound A-1, instead of Compound 1, was used as a host of the EML.

<A-1>

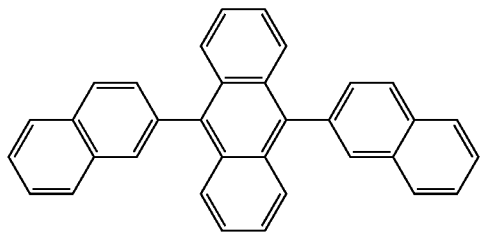

Comparative Example 2

An OLED was manufactured in the same manner as in Example 1, except that Compound A-2, instead of Compound 62, was used as a dopant of the EML.

<A-2>

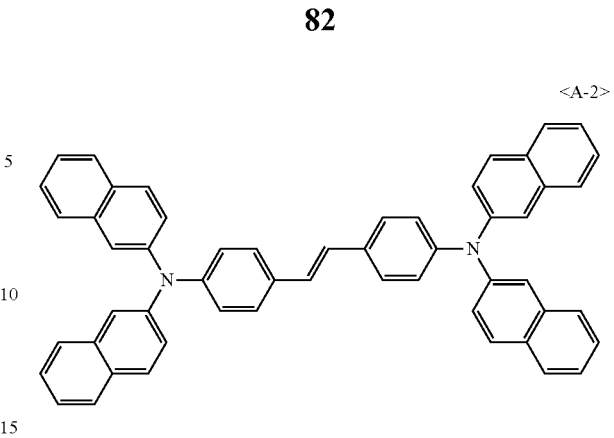

Evaluation Example

Driving voltages, luminancees, and efficiencies of the OLEDs of Examples 1 to 4 and Comparative Examples 1 and 2 were measured using a PR650 Spectroscan Source Measurement Unit (available from Photo Research, Inc.). The results are shown in Table 1 below.

TABLE 1

| OLED | Driving voltage [V] | Luminance [cd/m²] | Efficiency [cd/A] |
| --- | --- | --- | --- |
| Example 1 | 3.8 | 413 | 4.13 |
| Example 2 | 3.6 | 394 | 3.94 |
| Example 3 | 3.5 | 423 | 4.23 |
| Example 4 | 3.7 | 381 | 3.81 |
| Comparative Example 1 | 4.4 | 328 | 3.28 |
| Comparative Example 2 | 4.3 | 346 | 3.46 |

Referring to Table 1, the OLEDs of Examples 1 to 4 all of which included compounds having a structure of Formula 1 and compounds having a structure of Formula 2 as a blue light-emitting matierial of the OLED were found to have better performance in terms of lower driving voltage, and higher luminance and efficiency, as compared with the OLEDs of Comparative Examples 1 and 2 including a conventional host and/or a conventional blue dopant.

As described above, according to one or more of the above embodiments of the present invention, an OLED including the condensed cyclic compound may provide excellent performance of emitting blue light with high color purity and high efficiency, and long lifetime.

It should be understood that the exemplary embodiments described therein should be considered in a descriptive sense only and not for purposes of limitation. Descriptions of features or aspects within each embodiment should typically be considered as available for other similar features or aspects in other embodiments. While one or more embodiments of the present invention have been described with reference to the figures, it will be understood by those of ordinary skill in the art that various changes in form and details may be made therein without departing from the spirit and scope of the present invention as defined by the following claims and equivalents thereof.

What is claimed is:

1. An organic light-emitting diode comprising:
   a first electrode;
   a second electrode; and
   an organic layer between the first electrode and the second electrode,
   wherein the organic layer comprises a compound represented by Formula 1 and a compound represented by Formula 2:

Formula 1

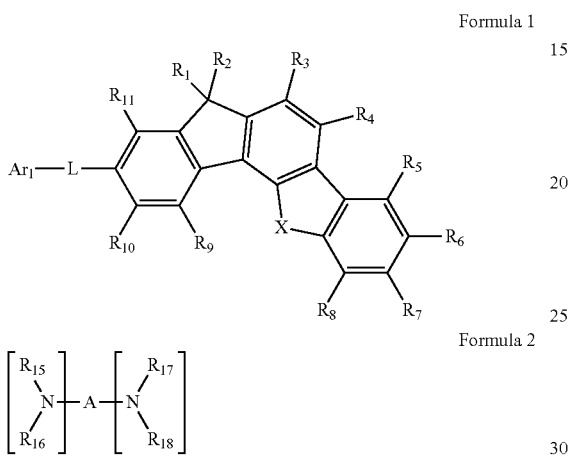

Formula 2

$$\left[\begin{array}{c}R_{15}\\N\\R_{16}\end{array}\right]\!\!-\!A\!-\!\!\left[\begin{array}{c}R_{17}\\N\\R_{18}\end{array}\right]$$

wherein Ar$_1$ is selected from a phenyl group, a pentalenyl group, an indenyl group, a naphthyl group, an azulenyl group, an indacenyl group, an acenaphthyl group, a biphenyl group, a heptalenyl group, a phenalenyl group, an anthryl group, a fluoranthenyl group, a naphthacenyl group, a chrysenyl group, a picenyl group, or a hexacenyl group; or a phenyl group, a pentalenyl group, an indenyl group, a naphthyl group, an azulenyl group, an indacenyl group, an acenaphthyl group, a biphenyl group, a heptalenyl group, a phenalenyl group, an anthryl group, a fluoranthenyl group, a naphthacenyl group, a chrysenyl group, a picenyl group, or a hexacenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;

L is represented by one of Formulae 5A and 5B:

Formula 5A

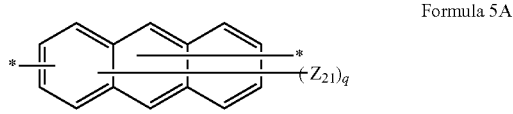

Formula 5B

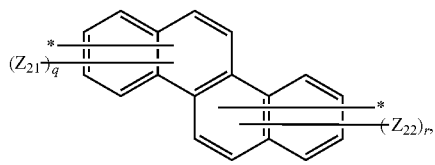

wherein each $Z_{21}$ and each $Z_{22}$ is independently one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{40}$ aryl group, or a $C_2$-$C_{40}$ heteroaryl group; or a $C_6$-$C_{20}$ aryl group or a $C_2$-$C_{20}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, or a $C_2$-$C_{20}$ heteroaryl group;

q is an integer from 0 to 8;
r is an integer from 0 to 5; and
* is a binding site;
X is —C($R_{12}$)($R_{13}$), —N($R_{14}$), —S—, or —O—;
$R_1$ to $R_{13}$ are each independently selected from
a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{40}$ alkyl group, a $C_2$-$C_{40}$ alkenyl group, a $C_2$-$C_{40}$ alkynyl group, a $C_1$-$C_{40}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_1$-$C_{40}$ heteroaryl group, a $C_6$-$C_{40}$ aryloxy group, or a $C_6$-$C_{40}$ arylthio group;

a $C_1$-$C_{40}$ alkyl group, a $C_2$-$C_{40}$ alkenyl group, a $C_2$-$C_{40}$ alkynyl group, or a $C_1$-$C_{40}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group; or a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_1$-$C_{40}$ heteroaryl group, a $C_6$-$C_{40}$ aryloxy group, or a $C_6$-$C_{40}$ arylthio group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group, and further, $R_1$ and $R_2$ are optionally linked to each other to comprise Formula 7A:

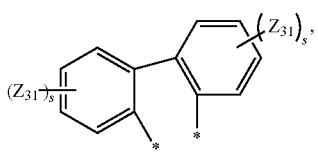

Formula 7A wherein each $Z_{31}$ and each $Z_{32}$ is independently one of
a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_2$-$C_{20}$ heteroaryl group;

a $C_1$-$C_{20}$ alkyl group or a $C_1$-$C_{20}$ alkoxy group, each substituted with at least one of a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, or a phosphoric acid group or a salt thereof; or a $C_6$-$C_{20}$ aryl group or a $C_2$-$C_{20}$ heteroaryl group, each substituted with at least one of a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, or a $C_2$-$C_{20}$ heteroaryl group;

s is 4; and * is a binding site;

$R_{14}$ is selected from
a hydrogen atom, a deuterium atom, a halogen atom, a $C_1$-$C_{40}$ alkyl group, a $C_3$-$C_{10}$ cycloalkyl group, a $C_3$-$C_{10}$ heterocycloalkyl group, a $C_6$-$C_{40}$ aryl group, or a $C_2$-$C_{40}$ heteroaryl group; or a $C_1$-$C_{40}$ alkyl group, a $C_3$-$C_{10}$ cycloalkyl group, a $C_3$-$C_{10}$ heterocycloalkyl group, a $C_6$-$C_{40}$ aryl group, or a $C_2$-$C_{40}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;

$R_{15}$ to $R_{18}$ are each independently selected from
a $C_6$-$C_{20}$ aryl group; or
a $C_6$-$C_{20}$ aryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{20}$ aryl group, a $C_2$-$C_{20}$ heteroaryl group, a $C_6$-$C_{20}$ aryloxy group, or a $C_6$-$C_{20}$ arylthio group; and A is selected from
phenalene, anthracene, pyrene, benzopyrene, chrysene, or phenanthroline; or
phenalene, anthracene, pyrene, benzopyrene, chrysene, or phenanthroline, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

2. The OLED of claim 1, wherein $Ar_1$ is represented by one of Formulae 3A and 3B:

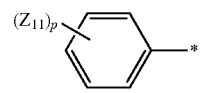

Formula 3A

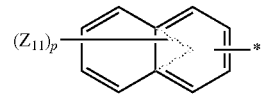

Formula 3B wherein each $Z_{11}$ is independently one of
a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_2$-$C_{20}$ heteroaryl group;

p is an integer from 0 to 7; and
* is a binding site.

3. The OLED of claim 1, wherein $Ar_1$ is represented one of Formulae 4A to 4F:

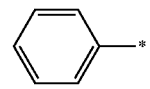

Formula 4A

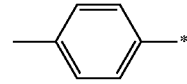

Formula 4B

-continued

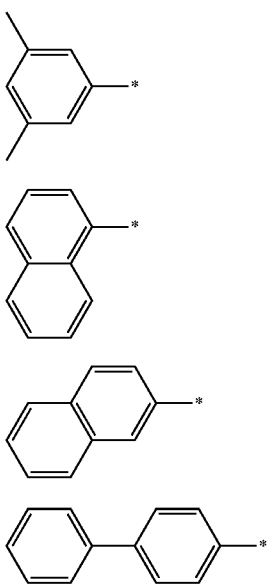

Formula 4C

Formula 4D

Formula 4E

Formula 4F wherein * is a binding site.

4. The OLED of claim 1, wherein L is represented by one of Formulae 6A and 6B:

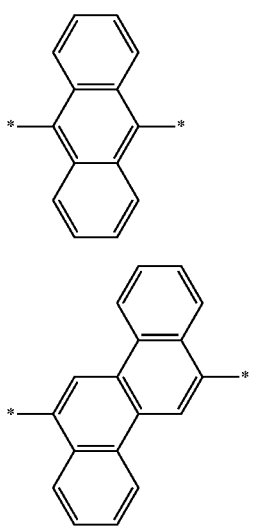

Formula 6A

Formula 6B wherein * is a binding site.

5. The OLED of claim 1, wherein $R_1$ to $R_{13}$ are each independently one of a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a methyl group, an ethyl group, a propyl group, a butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyran group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a benzocarbazolyl group, a pyridoindolyl group, a dibenzofuryl group, a phenanthridinyl group, a benzoquinolyl group, a phenazinyl group, a dibenzosilolyl group, a dibenzothiophenyl group, or a benzocarbazolyl group;

a methyl group, an ethyl group, a propyl group, a butyl group, a pentyl group, a hexyl group, a heptyl group, an octyl group, a nonyl group, a decyl group, a methoxy group, an ethoxy group, a propoxy group, a butoxy group, or a pentoxy group, each substituted with at least one of a deuterium atom, a halogen atom, a hydroxyl group, a cyano group, a nitro group, or an amino group; or a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyran group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a benzocarbazolyl group, a pyridoindolyl group, a dibenzofuryl group, a phenanthridinyl group, a benzoquinolyl group, a phenazinyl group, a dibenzosilolyl group, a dibenzothiophenyl group, or a benzocarbazolyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

6. The OLED of claim 1, wherein A is represented by one of Formulae 9A to 9C:

Formula 9A

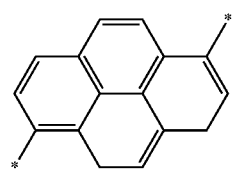

Formula 9B

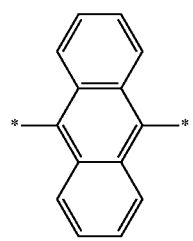

Formula 9C

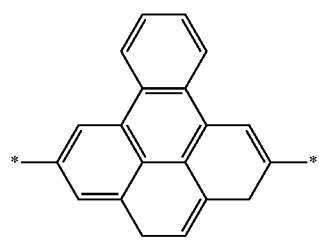

wherein * is a binding site.

7. The OLED of claim 1, wherein $R_{15}$ to $R_{18}$ are each independently selected from a phenyl group; or a phenyl group substituted with at least one of a deuterium atom, a halogen atom, a $C_1$-$C_{20}$ alkyl group, or a $C_6$-$C_{20}$ aryl group.

8. The OLED of claim 1, wherein $R_{15}$ to $R_{18}$ are each independently represented by one of Formulae 10A to 10E:

Formula 10A

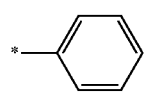

Formula 10B

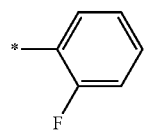

Formula 10C

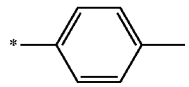

Formula 10D

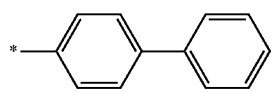

Formula 10E

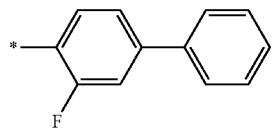

wherein * is a binding site.

9. The OLED of claim 1, wherein the compound represented by Formula 1 is one of Compounds 1 to 41, 43, 44, 46, 47, 49, and 50:

1

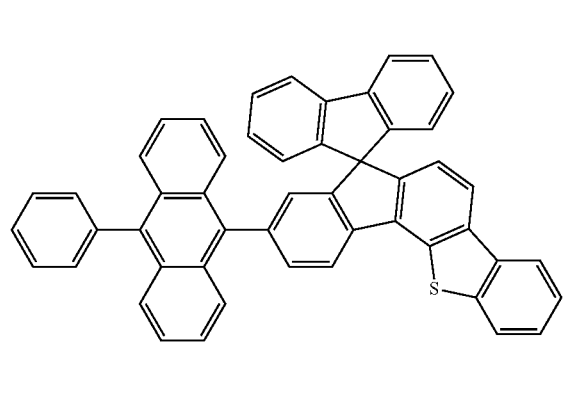

2

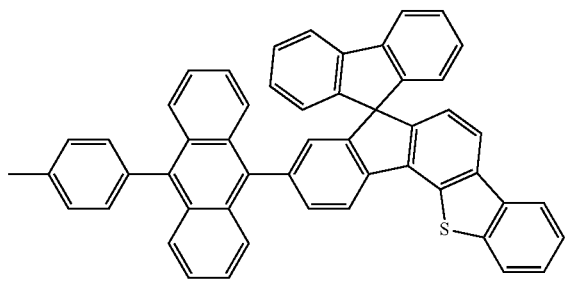

3

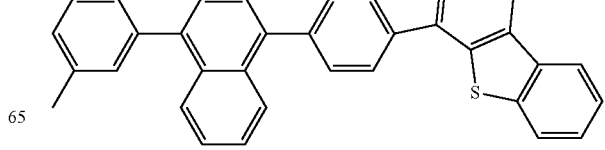

91 92
-continued -continued
4 8
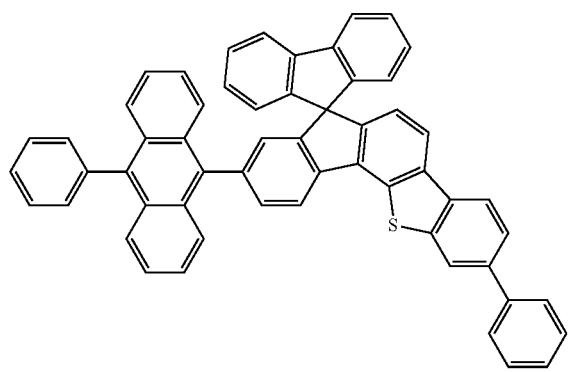 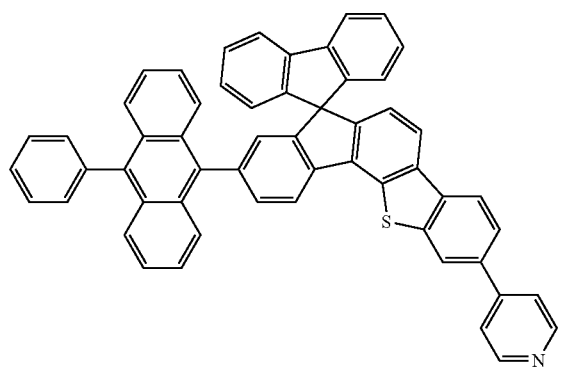
5 9
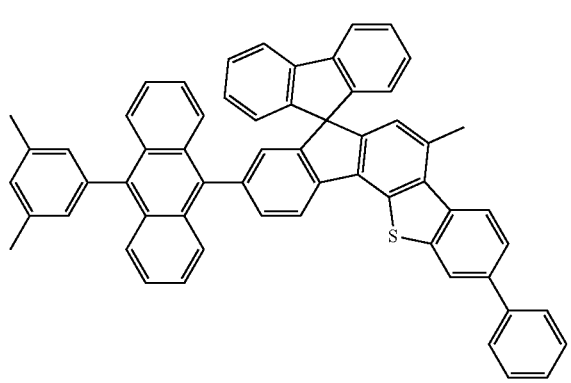
6
10
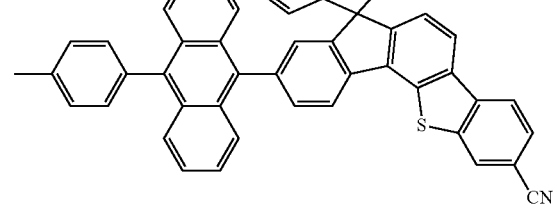
11
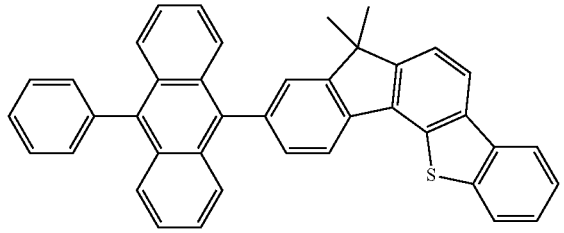
7
12
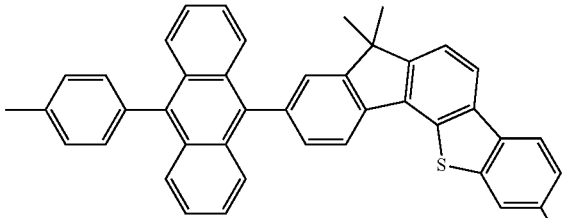
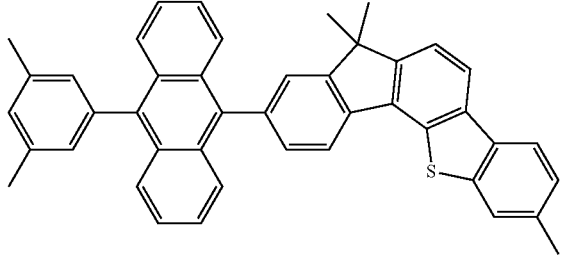

13
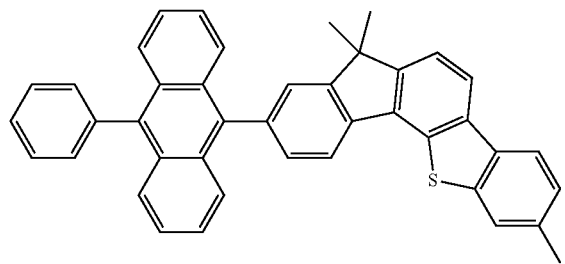
14
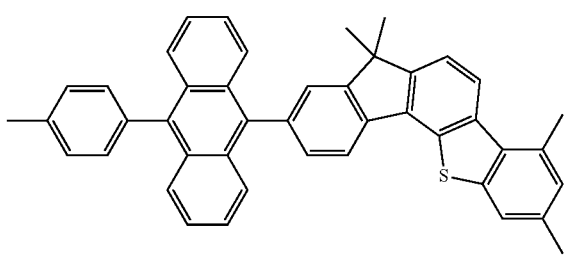
15
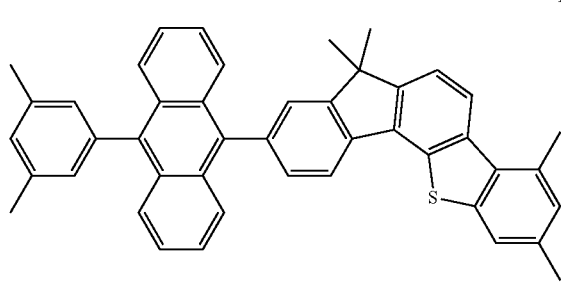
16
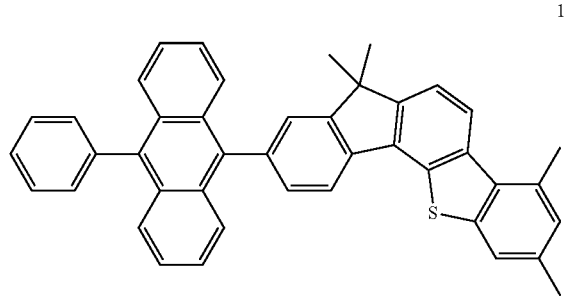
17
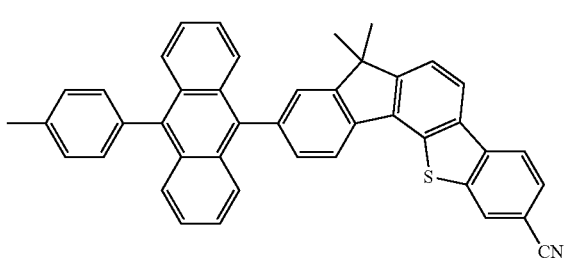
18
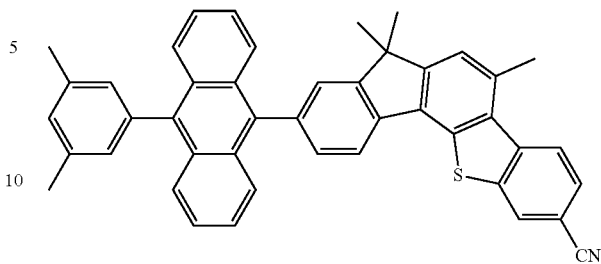
19
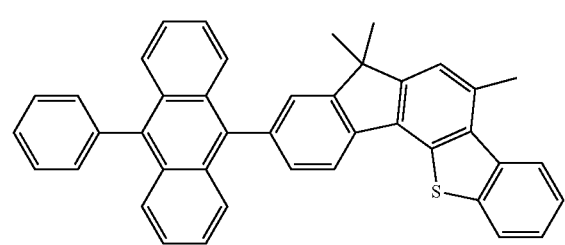
20
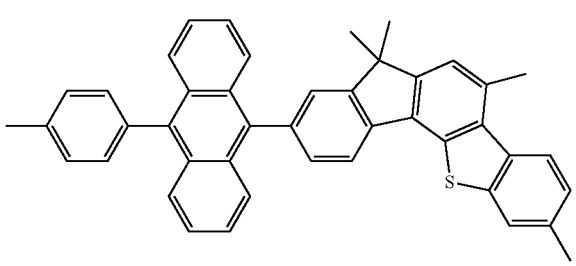
21
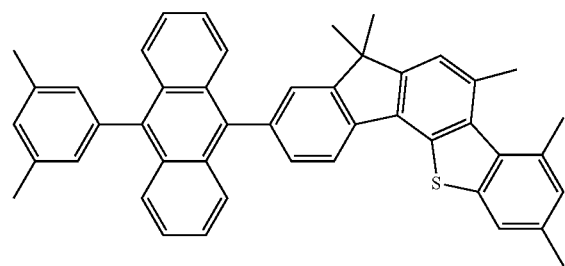

23
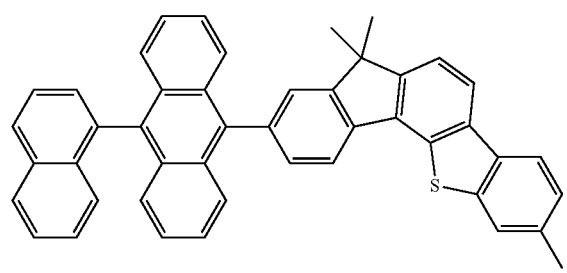
24
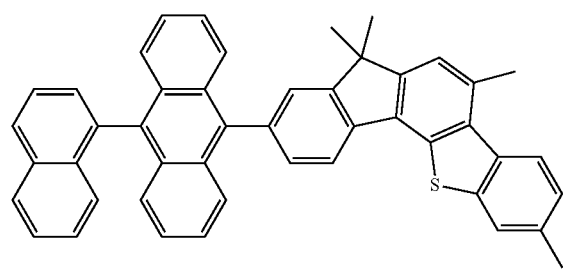
25
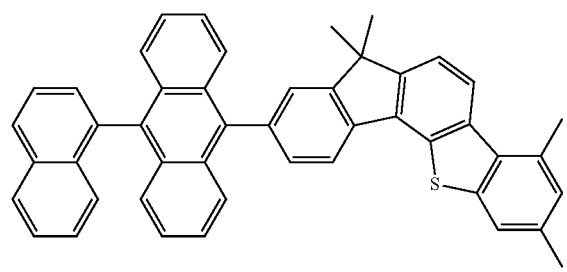
26
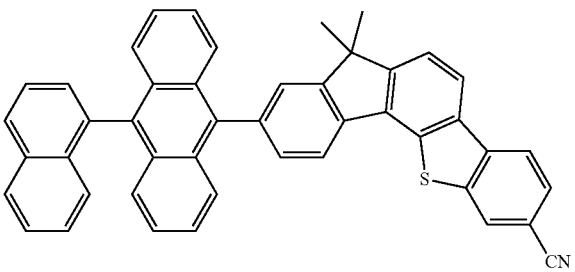
27
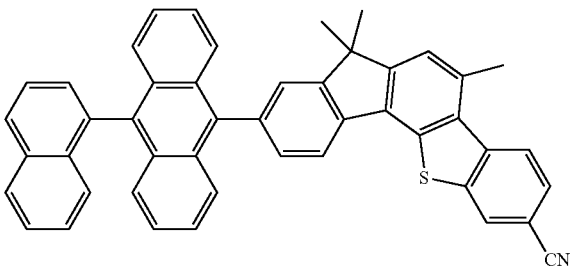
28
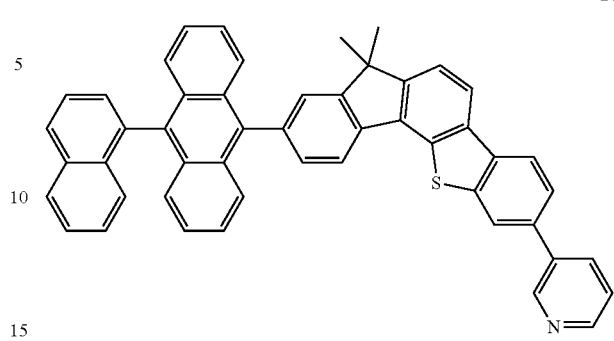
29
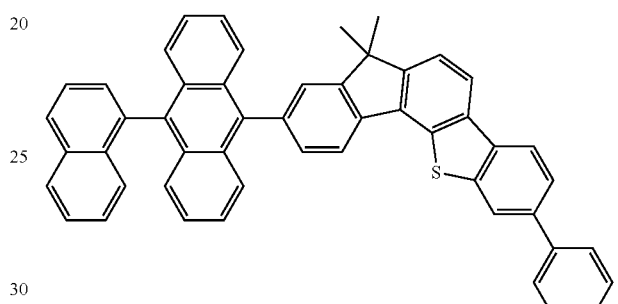
30
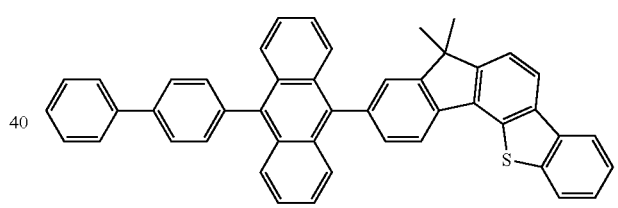
31
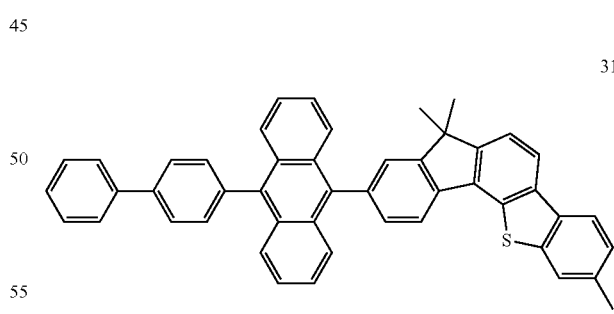
32
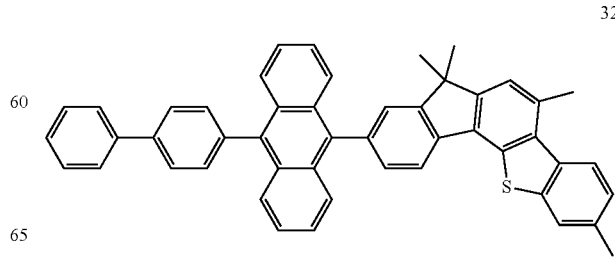

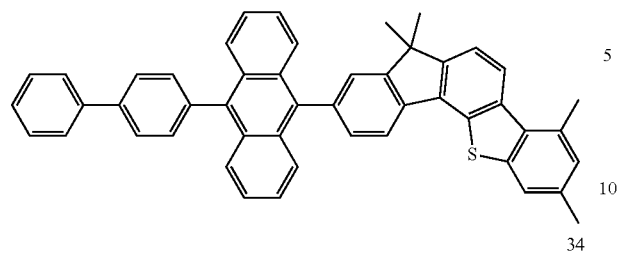
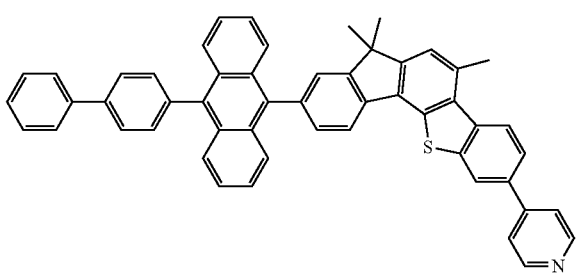
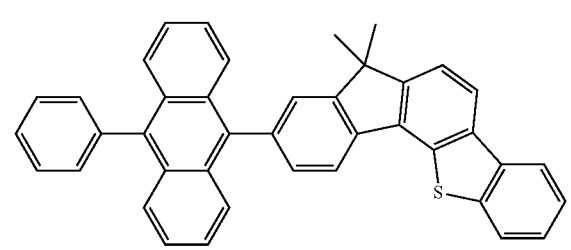
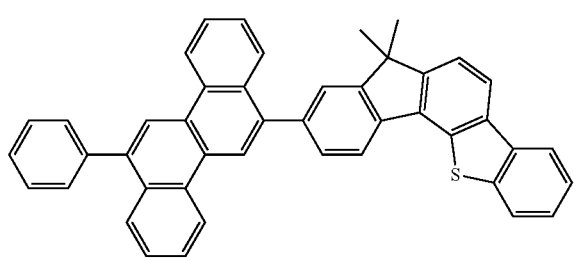
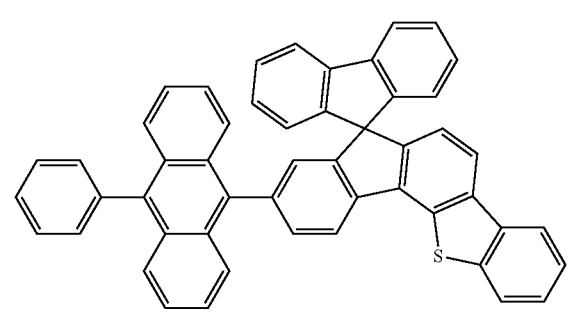
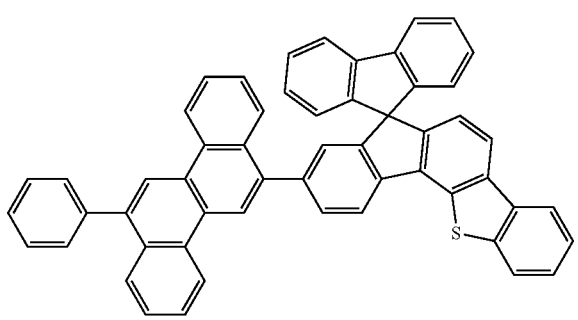

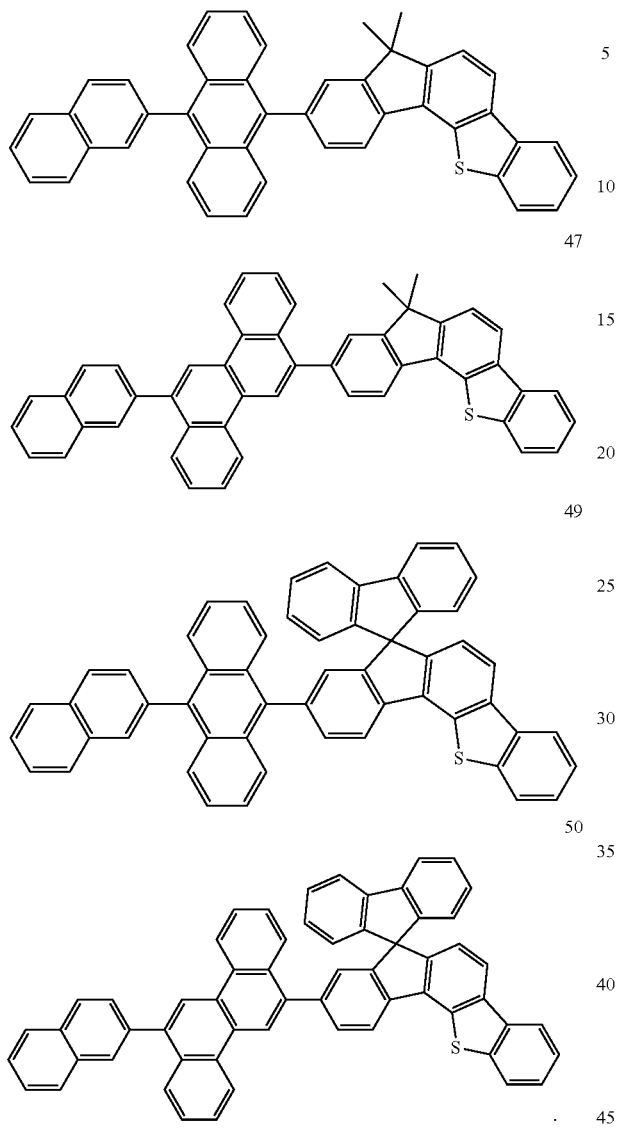
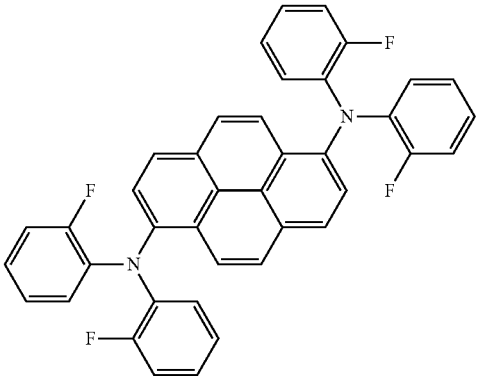
10. The OLED of claim 1, wherein the compound represented by Formula 2 is one of Compounds 61 to 69:
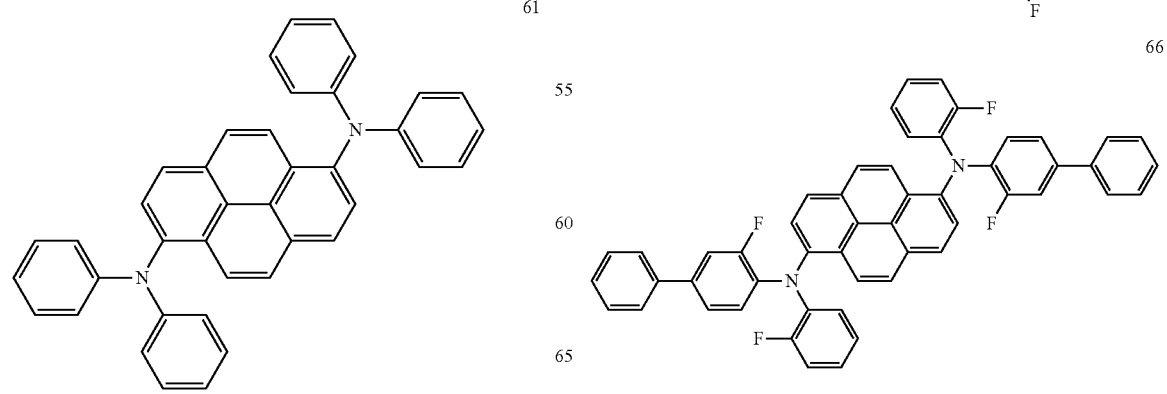

-continued

67

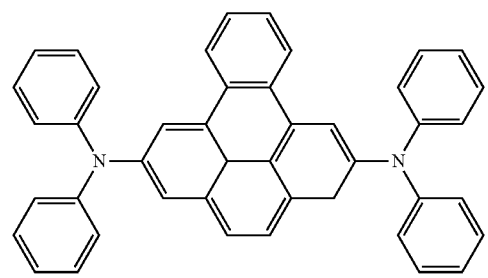

68

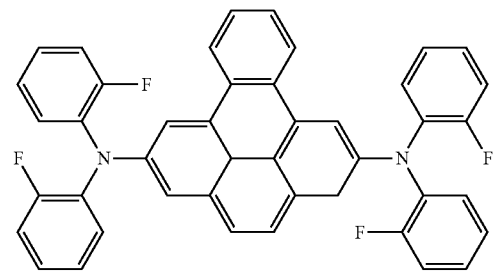

69

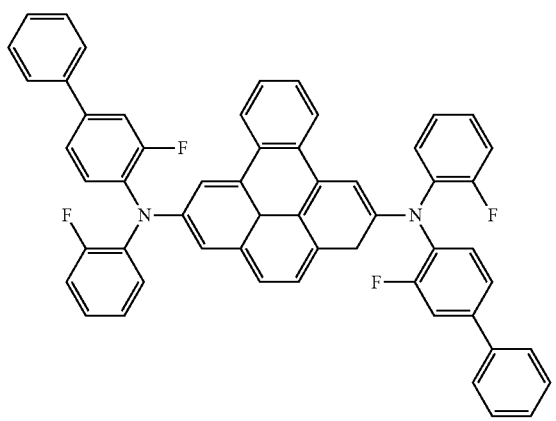

11. The OLED of claim 10, wherein the electron transporting region comprises at least one of a hole blocking layer, an electron transport layer, or an electron injection layer.

12. The OLED of claim 10, wherein the hole transporting region comprises at least one of an electron blocking layer, a hole transport layer, or a hole injection layer.

13. The OLED of claim 10, wherein the first electrode is an anode, and the second electrode is a cathode.

14. An OLED of claim 1, wherein the organic layer comprises:
an emission layer comprising a compound represented by Formula 1 and a compound represented by Formula 2;
a hole transporting region between the first electrode and the emission layer; and
an electron transporting region between the emission layer and the second electrode.

15. An organic light-emitting diode comprising:
a first electrode;
a second electrode; and
an organic layer between the first electrode and the second electrode,
wherein the organic layer comprises a compound represented by Formula 1 and a compound represented by Formula 2:

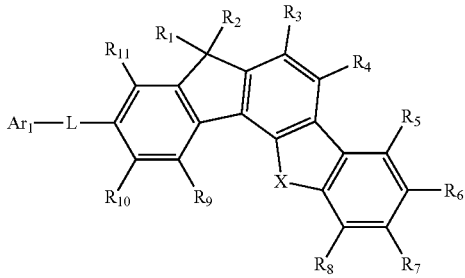

Formula 1

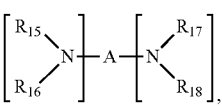

Formula 2 wherein $Ar_1$ is selected from
a $C_6$-$C_{60}$ aryl group or a $C_1$-$C_{60}$ heteroaryl group; or
a $C_6$-$C_{60}$ aryl group or a $C_1$-$C_{60}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;
L is selected from
a $C_6$-$C_{60}$ arylene group or a $C_2$-$C_{60}$ heteroarylene group; or
a $C_6$-$C_{60}$ arylene group or a $C_2$-$C_{60}$ heteroarylene group, each substituted with at least one selected from a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;
X is —$C(R_{12})(R_{13})$—, —$N(R_{14})$—, —S—, or —O—;
$R_{14}$ is selected from
a hydrogen atom, a deuterium atom, a halogen atom, a $C_1$-$C_{40}$ alkyl group, a $C_3$-$C_{10}$ cycloalkyl group, a $C_3$-$C_{10}$ heterocycloalkyl group, a $C_6$-$C_{40}$ aryl group, or a $C_2$-$C_{40}$ heteroaryl group; or
a $C_1$-$C_{40}$ alkyl group, a $C_3$-$C_{10}$ cycloalkyl group, a $C_3$-$C_{10}$ heterocycloalkyl group, a $C_6$-$C_{40}$ aryl group, or a $C_2$-$C_{40}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;

$R_{15}$ to $R_{18}$ are each independently selected from a $C_6$-$C_{20}$ aryl group; or a $C_6$-$C_{20}$ aryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{20}$ aryl group, a $C_2$-$C_{20}$ heteroaryl group, a $C_6$-$C_{20}$ aryloxy group, or a $C_6$-$C_{20}$ arylthio group;

A is selected from phenalene, anthracene, pyrene, benzopyrene, chrysene, or phenanthroline; or phenalene, anthracene, pyrene, benzopyrene, chrysene, or phenanthroline, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group; and $R_1$ to $R_{13}$ are each independently represented by one of Formulae 7A to 7C:

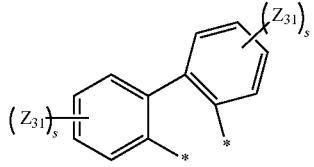

Formula 7A

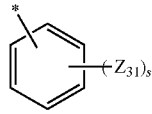

Formula 7B

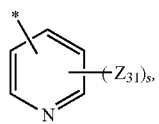

Formula 7C wherein each $Z_{31}$ and each $Z_{32}$ is independently one of a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_2$-$C_{20}$ heteroaryl group;

a $C_1$-$C_{20}$ alkyl group or a $C_1$-$C_{20}$ alkoxy group, each substituted with at least one of a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, or a phosphoric acid group or a salt thereof; or a $C_6$-$C_{20}$ aryl group or a $C_2$-$C_{20}$ heteroaryl group, each substituted with at least one of a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, or a $C_2$-$C_{20}$ heteroaryl group;

s is 4 or 5; and

* is a binding site.

16. The OLED of claim 15, wherein L is one selected from a phenylene group, a phenalenylene group, a pentalenylene group, an indenylene group, a naphthylene group, an azulenylene group, an indacenylene group, an acenaphthylene group, a biphenylene group, a heptalenylene group, a phenalenylene group, a fluorenylene group, a phenanthrenylene group, an anthrylene group, a fluoranthenylene group, a pyrenylene group, a benzofluorenylene group, a naphthacenylene group, a chrysenylene group, or a triphenylenyl group; or a phenylene group, a phenalenylene group, a pentalenylene group, an indenylene group, a naphthylene group, an azulenylene group, an indacenylene group, an acenaphthylene group, a biphenylene group, a heptalenylene group, a phenalenylene group, a fluorenylene group, a phenanthrenylene group, an anthrylene group, a fluoranthenylene group, a pyrenylene group, a benzofluorenylene group, a naphthacenylene group, a chrysenylene group, or a triphenylenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group.

17. The OLED of claim 15, wherein L is represented by one of Formulae 5A to 5C:

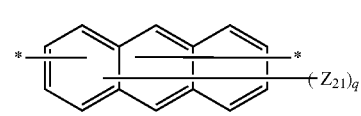

Formula 5A

-continued

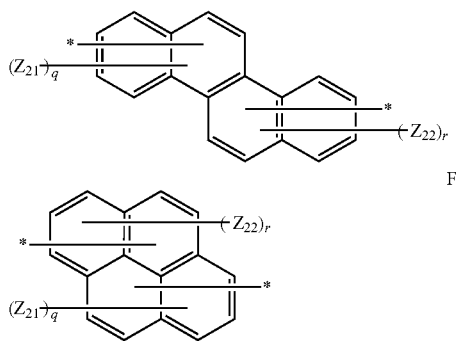

Formula 5B

Formula 5C wherein each $Z_{21}$ and each $Z_{22}$ is independently one of
a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{40}$ aryl group, or a $C_2$-$C_{40}$ heteroaryl group; or
a $C_6$-$C_{20}$ aryl group or a $C_2$-$C_{20}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, or a $C_2$-$C_{20}$ heteroaryl group;

q is an integer from 0 to 8;

r is an integer from 0 to 5; and

* is a binding site.

18. An organic light-emitting diode comprising:

a first electrode;

a second electrode; and an organic layer between the first electrode and the second electrode, wherein the organic layer comprises a compound represented by Formula 1 and a compound represented by Formula 2:

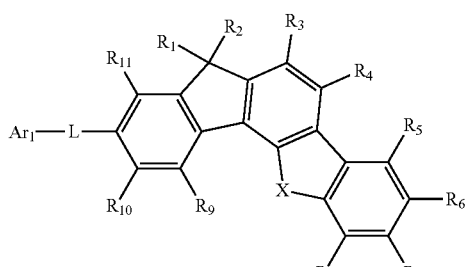

Formula 1

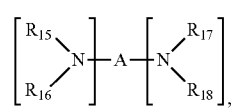

Formula 2 wherein $Ar_1$ is selected from
a $C_6$-$C_{60}$ aryl group or a $C_1$-$C_{60}$ heteroaryl group; or
a $C_6$-$C_{60}$ aryl group or a $C_1$-$C_{60}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;

L is selected from
a $C_6$-$C_{60}$ arylene group or a $C_2$-$C_{60}$ heteroarylene group; or
a $C_6$-$C_{60}$ arylene group or a $C_2$-$C_{60}$ heteroarylene group, each substituted with at least one selected from a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;

X is —C($R_{12}$)($R_{13}$), —N($R_{14}$), —S—, or —O—;

$R_{14}$ is selected from
a hydrogen atom, a deuterium atom, a halogen atom, a $C_1$-$C_{40}$ alkyl group, a $C_3$-$C_{10}$ cycloalkyl group, a $C_3$-$C_{10}$ heterocycloalkyl group, a $C_6$-$C_{40}$ aryl group, or a $C_2$-$C_{40}$ heteroaryl group; or
a $C_1$-$C_{40}$ alkyl group, a $C_3$-$C_{10}$ cycloalkyl group, a $C_3$-$C_{10}$ heterocycloalkyl group, a $C_6$-$C_{40}$ aryl group, or a $C_2$-$C_{40}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group;

$R_{15}$ to $R_{18}$ are each independently selected from
a $C_6$-$C_{20}$ aryl group; or
a $C_6$-$C_{20}$ aryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{20}$ aryl group, a $C_2$-$C_{20}$ heteroaryl group, a $C_6$-$C_{20}$ aryloxy group, or a $C_6$-$C_{20}$ arylthio group;

A is selected from phenalene, anthracene, pyrene, benzopyrene, chrysene, or phenanthroline; or phenalene, anthracene, pyrene, benzopyrene, chrysene, or phenanthroline, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{40}$ aryl group, a $C_2$-$C_{40}$ heteroaryl group, a $C_6$-$C_{40}$ aryloxy group, or a $C_6$-$C_{40}$ arylthio group; and $R_1$ to $R_{13}$ are each independently represented by one of Formulae 8A to 8E:

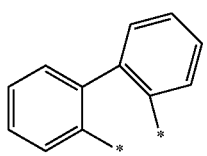

Formula 8A

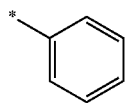

Formula 8B

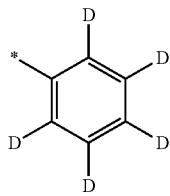

Formula 8C

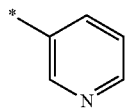

Formula 8D

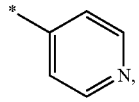

Formula 8E wherein * is a binding site.

* * * * *